(12) United States Patent
Takehashi et al.

(10) Patent No.: US 6,624,473 B1
(45) Date of Patent: Sep. 23, 2003

(54) THIN-FILM TRANSISTOR, PANEL, AND METHODS FOR PRODUCING THEM

(75) Inventors: Shin-itsu Takehashi, Shijonawate (JP); Shigeo Ikuta, Hirakata (JP); Tetsuo Kawakita, Kyotanabe (JP); Mayumi Inoue, Hirakata (JP); Keizaburo Kuramasu, Kyotanabe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/700,132

(22) PCT Filed: Mar. 9, 2000

(86) PCT No.: PCT/JP00/01441

§ 371 (c)(1),
(2), (4) Date: Nov. 9, 2000

(87) PCT Pub. No.: WO00/54339

PCT Pub. Date: Sep. 14, 2000

(30) Foreign Application Priority Data

| Mar. 10, 1999 | (JP) | 11-062767 |
| Mar. 24, 1999 | (JP) | 11-080051 |
| Mar. 26, 1999 | (JP) | 11-083314 |
| Mar. 26, 1999 | (JP) | 11-083316 |
| Mar. 26, 1999 | (JP) | 11-083319 |

(51) Int. Cl.$^7$ .............................................. H01L 29/76
(52) U.S. Cl. ...................... 257/344; 257/61; 257/401; 257/408; 257/412
(58) Field of Search ........................... 257/57, 61, 66, 257/408, 412, 413, 344, 384, 401

(56) References Cited

U.S. PATENT DOCUMENTS

| 5,089,863 A | * | 2/1992 | Satoh et al. .................. 257/388 |
| 5,471,080 A | * | 11/1995 | Satoh et al. .................. 257/344 |
| 5,880,015 A | * | 3/1999 | Hata ............................. 438/585 |
| 5,977,586 A | * | 11/1999 | Crisenza et al. ............. 257/326 |
| 5,981,383 A | * | 11/1999 | Lur et al. ...................... 438/655 |
| 5,989,967 A | * | 11/1999 | Gardner et al. .............. 438/305 |
| 6,069,387 A | * | 5/2000 | Gardner ........................ 257/344 |
| 6,284,613 B1 | * | 9/2001 | Subrahmanyam et al. .. 438/307 |

FOREIGN PATENT DOCUMENTS

| JP | 3-60-127761 | * | 7/1985 | ............ H01L/29/78 |
| JP | 3-61-36975 | * | 2/1986 | .................. 257/344 |
| JP | 3-63-9154 | * | 1/1988 | .................. 438/158 |
| JP | 4-2-226727 | * | 9/1990 | .................. 438/305 |
| JP | 4-5-21454 | * | 1/1993 | ............ H01L/21/336 |
| JP | 4-5-243261 | * | 9/1993 | .................. 257/408 |
| JP | 4-6-260645 | * | 9/1994 | ............ H01L/29/784 |

OTHER PUBLICATIONS

Spacer Formation on Electrodes With Non–Vertical Sidealls, IBM Technical Disclosure Bulletin, Nov. 1, 1984, vol. 27, No. 6, TDB–ACC–No. NN84113464, pp. 3464–3466.*

* cited by examiner

Primary Examiner—George Eckert
(74) Attorney, Agent, or Firm—Parkhurst & Wendel, L.L.P.

(57) ABSTRACT

The present invention provide an LDD type TFT having excellent properties, particularly for a liquid crystal display unit. For this purpose, a top gate type LDDTFT gate electrode is converted into a two-stage structure by use of a chemical reaction or plating, and furthermore, into a shape in which an upper portion or a lower portion slightly protrudes on the source electrode side, or the drain electrode side relative to the other portions. Impurities are injected by using this electrode having this structure and shape as a mask. Prior to injection of impurities, the gate insulating film is removed, and a Ti film is formed for preventing hydrogen for dilution from coming in. This is also the case with the LDD-TFT on the bottom gate side.

9 Claims, 36 Drawing Sheets (j)

(j')

Removal of 43

A-A Section

A-A Section (a)

(b)

(a) Formation of Gate Electrode (b) Removal of Gate Insulator, Formation of Mask for LDD (c) Impurity Injection (e) Re-formation of Gate Insulator (a)

(b)

THIN-FILM TRANSISTOR, PANEL, AND METHODS FOR PRODUCING THEM

FIELD OF THE INVENTION

This invention relates to a thin film transistor and, more particularly to the LDD type thin film transistor used in the pixel switching element of liquid crystal display and in its drive circuit, etc. and to their manufacturing method.

BACKGROUND ART

Much active in recent years have been the various researches into the liquid crystal display unit using the active matrix type display substrate provided with the thin film transistor (hereafter also referred to as "TFT") for each pixel electrode and the EL display, which give higher picture quality than that of the non-active matrix type display. Further, researched and proposed has been so-called drive circuit incorporating liquid crystal display unit, where the TFT as pixel switching element and drive circuit are formed on the same glass substrate making use of the fact that the electron mobility of polysilicon (hereafter also referred to as "p-Si") TFT is higher by one or two units than that of amorphous silicon (hereafter also referred to as "a-Si") TFT.

However, in this case, there are some technical problems concealed in the nature and performance of the TFT as the semiconductor element itself used in the drive circuit or in its usage for liquid crystal display unit and the like.

Viewed from the standpoint of the nature and performance of the semiconductor element, which is rather the former problems, it should be noted that the p-Si TFT features a larger off current than that of a-Si TFT and MOS type field-effect transistor, and Japanese Provisional Publication 136417-1993 discloses and proposes a thin film transistor where a lightly doped drain (hereafter referred to as "LDD") area is provided in the directly adjoining area of TFT source or drain source area in order to reduce the said off current.

In the simply LDD-structured TFT, however, it is possible to decrease the off current, but the lightly doped drain area, which is relatively high resistance layer, is inserted in series into the channel area when it is turned on where the channel under the gate electrode of TFT does reverse, thereby reducing the on current.

This has led to the proposition of the TFT of various LDD structures with reduced on-current. [SID96, Digest pp.25: Samsung Electronics (hereafter referred to as "the first conventional example"), Euro Display 1996 pp.555, Asia Display 1995 pp.335: Philips (hereafter referred to as "the second conventional example").

FIG. 1 illustrates the construction of the first conventional example. In this figure, the numeral 10 represents a glass substrate. The numeral 150 is the source area (n+ layer) of the semiconductor layer consisting of p-Si, while 160 is the drain area (n+ layer) of the same. The numeral 170 represents the channel area of the same.

In this figure, the subgate electrode 41 is provided as if it covered the gate electrode 4 with the LDD areas (light doped drain area: n-layer) 151 and 161 provided on the semiconductor layer on the source and drain sides beneath the subgate electrode 41. This construction, when it is turned off, makes the semiconductor layers 151 and 161 of the LDD area beneath the subgate electrode 41 a high resistance layer with the carrier being exhausted, and subsequently, this suppresses the off current. However, when it is turned on, the electrons that become carriers will accumulate in the LDD areas 151 and 161, and these areas will become low resistance areas, and therefore no on-current reduction will occurs there.

In reality, these TFTs are formed over several rows and columns in horizontal and vertical directions in response to the standard, etc. of pixels, for instance, at the positions on the substrate that correspond to the drive circuits of each pixel and peripheral portion of the pixel. Through the intermediary of the interlayer dielectric the gate, source and drain electrodes constitute the multilayer interconnection mechanism. However, as these are self-evident matters, their drawings are omitted here, and any individual mentions to the similar effect are limited to the necessary least in any subsequent descriptions and drawings of embodiments.

Next, FIG. 2 depicts the second conventional example. In this figure, the numeral 10 represents a glass substrate. The numerals 150, 160, and 170 respectively represent the source area (n+ layer), drain area (n+ layer), and channel area of the semiconductor layer consisting of p-Si. This figure illustrates so-called TFT of GOLD (Gate-drain Overlapped Lightly-doped Drain, gate-overlapped) structure, and more concretely, the gate electrode 4 is provided as if it hung over the LDD areas (n-layer) 152 and 162 on both sides of the channel area, that is on the source side and drain side. In this construction, as was with the first conventional example, when it is turned off, the lightly doped drain areas 152 and 162 beneath the gate electrode 4 become high resistance layer with the carrier being exhausted, and this therefore allows to suppress the off-current. If, on the other hand, it is turned on, the lightly doped drain areas 152 and 162 will become low resistance areas partly because they are beneath the gate electrode and partly because the electrons that become carrier accumulate there, and therefore, no on-current will reduce there.

However, in any process that actualizes such a TFT structure, the LDD area formed in the polycrystalline silicon semiconductor layer in order to suppress the reduction in on-current has been formed by injecting particular impurities using the ion-doping method. When injecting (or "doping") particular impurities (different from any "impurities" in other technical fields, they are some substances positively injected into the polycrystalline silicon in order for the semiconductor element to display their function; namely, they are not any "contaminants"), any substance other than the necessary impurities, the hydrogen atoms, for instance, will be doped at the same time. And, in particular, when hydrogen is doped into the channel portion of the polycrystalline silicon just beneath the gate electrode, the hydrogen will come to intervene among the polycrystalline silicon atoms connected with each other, which causes the electrons to be trapped. This will raise the threshold value of voltage of the TFT, thereby remarkably reducing the dependability.

It is therefore indispensable for solving the assignment of the electric characteristics in the p-Si TFT to provide an infinitesimal LDD (lightly doped drain) area adjoining at least to one of TFT's source area and drain area. However, such difficulties as shown below will arise from forming these lightly doped drain area:

1) High refinement of the liquid crystal display unit requires to miniaturize the pixel transistor to heighten the display density. However, the exposure system that is normally used in the manufacture of liquid crystal display unit is mainly an equifold exposure system, which naturally limits the refinement of the pixel transistor. It is consequently very difficult to form the miniature lightly doped drain area (of the order of 0.1 to 2 or 3 μm) equivalent to or less than the channel width (approximately 1 to several μm) of the pixel transistor.

2) Since the superposition of the subgate electrode over the lightly doped drain area is made by mask overlaying, these superpositions cannot be made self-consistently (inevitably well superposed at a high accuracy when viewed from the injection direction of the impurities). The deviation in the mask overlaying causes the dimensions of the lightly doped drain area to vary, which in turn requires some margin for the mask overlaying because of the process control for manufacturing in a limited short period of time, and this restricts the refinement of the pixel TFT. In consequence, the occupancy area of the pixel TFT will increase as much as the margin is assured.

3) As the occupancy area of the pixel TFT grows larger, the parasitic capacitance between the source and drain areas increases accordingly. As a result, the working waveform is caused to delay, thereby reducing the display characteristics of the liquid crystal display unit.

4) When forming the subgate electrode, it requires the process of forming the metallic film, which is an electrode, as well as the photolithographic process and etching process besides the gate electrode, and further it requires the photomask to perform the photolithography. This GOLD structure therefore requires not merely two times of ion injection but such a complicated manufacturing process as oblique rotation ion injection. Accordingly, the TFT manufacturing process becomes to be divergent, and the prolongation of the process, the increased manufacturing cost, and the reduced yield will make the liquid crystal display markedly expensive.

Next, when we are going to describe the assignment viewed rather from the standpoint of usage to the liquid crystal display unit, although there are some phases that may more or less overlap with the previous descriptions on the assignment, they are as explained as the following.

In the TFT used in any liquid crystal display unit, the higher resistance of gate line will first elicit the problem of the electric resistance of the gate line in such larger picture as 15 inches and 20 inches.

That is, we cannot neglect the delay of gate signal any more, and the delay in response of the pixel becomes remarkable. Further, there will also arise such inconveniences as flicker and display unevenness of the picture.

Second, the TFT characteristics becomes problematic.

As for the TFT characteristics, important are the enhanced mobility, the improved on-current, and the reduced and stabilized threshold voltage. And, the control of the interface is the most important to enhance these characteristics. In particular, the interface between the semiconductor layer and the gate insulator will exert not a little influence. Consequently, this interface, if improved, will assuredly contribute to the enhancement of the characteristics.

One of the means to improve the interface is heat treatment. The heat treatment will decrease the interfacial defect, remove the electric charge accumulated in the respective layers, thereby enhancing the interface. The temperature of this heat treatment is preferably 800 to 900° C. where the silicon constituting the semiconductor layer recrystalizes.

The improvement is however restricted because the glass substrate has been adopted in the display unit because of economical reason. As such, the maximal allowable temperature is limited to the approximate 600° C. due to the heat resistance of glass as defined from the thermal shrinkage.

To a bad circumstance, tentative use of aluminum or aluminum alloy-based low resistance metal as a means to decrease the resistance of gate electrode for solving the first problematic point aforementioned might cause such an inconvenience as hillock, disconnection, and short-circuit even at that counterproductive 600° C. of temperature. If, on the contrary, such a high melting point metal as W, Mo and Ta is used, it will still worsen the above-mentioned inconvenience, because such high melting point metals feature high resistance.

Third, there arises a leak current as a problematic point.

That is, in the thin film transistor, the data retentivity of the pixel lessens if the leak current grows in the off area. It is therefore very important to reduce the off leak current in order to obtain a highly refined excellent pixel. In the conventional thin film transistor, there arises the off leak current by the electric field strength in the vicinity of the drain area. Therefore, increasing the gate voltage toward the off side will increase the field strength, and subsequently increase the off leak current as well. As the countermeasure, the LDD (lightly doped drain) and offset structures have been adopted conventionally. It is nevertheless difficult to form a precisely appropriate LDD area from the dimensional viewpoint. Fourth, on a sheet of the substrate are provided with a pixel portion and a part of its drive circuit, whose roles are different from each other, and the TFT characteristics required for these parts also differ. Although, in this case, the geometrical form of element and the dimensions of channel, drain and source areas may be coped with by the masking design in the photolithography, this countermeasure is hardly applied to any refined LDD portion.

Fifth; if on a sheet of substrate are provided with the pixels, TFT for pixel, TFT for drive circuit, and reflection board, whose roles are different from each other, the process will inevitably compelled to increase in the number. However, unless these formations are not made common to the furthest possible degree, manufacturing cost of these may necessarily be increased.

It has therefore long been craved for a commercialization of a semiconductor element using a gate electrode featuring small electric resistance and excellent heat resistance, which in its turn may lead to excellent TFT characteristics and little leak current, resulting in easier manufacture and in restricting any cost increase despite the LDD structure.

It has further been longed for the thin film transistor with little parasitic capacitance formed with a high accuracy from infinitesimal LDD structure, and the development of their extremely simple and easy manufacturing.

Further, such LDD type TFT that may satisfy such requirements had been expected to be developed irrespectively of the top gate type or bottom gate type.

Also desired had been the development of a sheet of the substrate, on each part of which is formed the LDD-type TFT featuring the characteristics required for the said respective portions, and that of a liquid crystal display unit with a large screen featuring quick responsiveness of the pixel without any flicker.

In the p-Si TFT, not to say the LDD type, the hydrogen used for dilution at the time of injecting (doping) impurities intrudes into the channel area beneath the gate electrode to damage the silicon crystals, which largely impedes the characteristics of p-Si TFT. As such, solving this problematic point was also long craved for.

Also longed for were the formation of the LDD-type TFT featuring different characteristics at respective parts of a sheet of the substrate, the development of a technology that can reduce as much as possible the forming processes of the pixels on the TFT and substrate, and other elements such as the reflection board, and finally the development of a LDD-type TFT that can meet these requirements.

DESCRIPTION OF THE INVENTION

This invention, which is intended to resolve the foregoing assignments, cogitates the material and construction of the gate electrode in the aspects of its electric resistance and injection (doping) of impurities, among others. Further, it exerts inventor's ingenuity in the manufacture and structure of the source and drain electrodes. Contrivance has been also made in the manufacture of panel.

Hereunder, we are going to describe more in detail the conception of this invention.

[First Group of Inventions]

In this group of inventions, a silicide is used to form an infinitesimal portion that is weaker in masking capacity and shorter in channel direction than the central portion when impurities are injected at the ends of the source electrode and drain electrode sides in order to improve the gate electrode and form the LDD area.

According to one of the inventions belonging to this group, in the semiconductor element having, on the substrate, a semiconductor layer provided with a source area, drain area, and a gate area, the gate insulator, as well as the source electrode, drain electrode, and the gate electrode formed on the gate insulator, [also including other portions such as the interlayer dielectric required to display the function as a transistor (element)], the gate electrode is composed of the two layers, i.e. the upper and the lower, which are consisted of a silicide film and a metallic film, and further on the upper layer is formed so that it may completely cover the lower layers when viewed from the flying direction of the ions of the impurities to be injected (doped), and the semiconductor layer has an LDD area that is formed by injecting the impurity ions using the gate electrode of this multilayer structure as an injection mask.

The above structure allows for such a function as follows. One of the layers of the gate electrode of the semiconductor element is a silicide film (it may somewhat contain other substances such as material silicon due to some reasons such as nonreactive) and the other layer consists of the two (upper and lower) layers that are metal films. A further upper layer hangs over the lower layer (on the gate insulator side) as if the former completely covers the latter when viewed from the flying direction of impurities (upper face of the substrate, in principle). In most cases, this layer has been jutted out, by 1 to 4 μm suited to form the LDD structure (depending on such conditions as the size of element) toward at least one of the drain electrode side and source electrode side.

The semiconductor layer has an LDD area where the quantity of injected impurities is made naturally smaller than in the channel area on at least one side of the drain electrode and source electrode side by injecting the ions of impurities from above, adopting the gate electrode as the injection mask, in the construction of which said upper layer juts out, or the overall cross sectional part is in the form of a trapezoid extending downward.

Resulting from the above configuration, the source area, drain area, and narrower LDD area have come to be naturally formed in the area to be decided by the position occupied by the silicide film and metallic film in the semiconductor layer and the injection direction of the impurity ions.

If describing by way of precaution, there may arise a case where the impurities are diffused with the delimitation rendered more or less ambiguous due to the subsequent heat treatment. Further, there is another case where the injection direction of the impurity ions become slightly oblique upward. However, these cases are also included in the framework of this invention.

From the above, it results that the LDD area is molded on the downstream side in the ion flying direction in the portion where the second layer of said upper side juts out. Note in this case that if the jutting out is deviated only toward one direction, the stray capacitance will become smaller.

In some other inventions, the two layers (upper and lower) consisting of the silicide film and metallic film are replaced by the two layers (upper and lower) of the silicide film and silicide film (including the existence of more or less non-reactive layer) by, for example, a chemical reaction between the silicon film and metal film, regardless of whether the thickness is the same or not.

The aforementioned configuration allows for a function similar to that of the prior invention for the formation of the LDD area. (Adding few more words by way of precaution, different from kind of like perfect crystalline silicon with far larger grain size, the polycrystalline silicon formed by laser annealing may be formed into the silicide within a shorter period of time at the temperature even the glass substrate may withstand.)

In some other inventions, the gate electrode is the gate electrode combining a multistage LDD forming mask consisting of the multiple layers having such silicon film as amorphous, which is more likely to react with at least the silicide thin film and metal thin film, and the central portion is the thickest as the mask used when impurities are injected, the both ends being thinnest, and the intermediate portion having an intermediate thickness or becoming gradually thicker toward the central portion from both ends.

From the above configuration, it results that this invention has a multistage LDD area.

In other inventions, the gate electrode is a gate electrode containing an intermediate aluminum layer having a layer consisting of such high melting point metals (including alloys) as molybdenum, tungsten, tantalum, niobium, TZM, and TZC, a layer consisting of the silicide film, and a layer consisting of the aluminum film surrounded by high melting point metallic film layer and silicide film layer. And, the semiconductor layer is an LDD semiconductor element that has the single or multistage LDD area formed by injecting the impurity ions from above using the intermediate aluminum layer gate electrode as an injection mask.

The aforementioned configuration allows for the following functions.

The gate electrode being a gate electrode containing an intermediate aluminum layer, it in fact hardly reacts with aluminum at the heat treatment temperature of substrate, and it has therefore come to have a layer consisting of a high melting point metal film not susceptible to any deformation, a layer consisting of a silicide film of similar nature, and an aluminum film with the low electric resistance surrounded by a high melting point metal film layer and silicide film layer, and protected by these layers when the substrate is thermally treated. Therefore its electric resistance is low and heat resistance is excellent.

In other inventions, the silicide layer is the silicide layer from particular material to be selected from the group of titanium silicide, cobalt silicide, nickel silicide, zirconium silicide, molybdenum silicide, palladium silicide, and platinum silicide.

From the above configuration, the silicide layer comes to be selected from a group of the low electric resistance titanium silicides ($TiSi_2$, $TiSi$, $Ti_5Si_3$), cobalt silicide ($CoSi_2$, $CO_2Si$, $CoSi$, $CoSi_3$), nickel silicides ($Ni_2Si$, $NiSi$, $NiSi_2$), zirconium silicides ($ZrSi_2$, $ZrSi$, $Zr_2Si$), molybdenum silicides ($MoSi_2$, $Mo_3Si$, $Mo_5Si_3$), palladium silicides ($Pd_2Si$, $PdSi$), and platinum silicides ($Pt_2Si$, $PtSi$).

The molecular formulas of respective metal silicides are enumerated illustratively.

In other inventions, at least one of the metal films is a metallic film where the constituting metal element is the same with the metal element that constitutes the silicide.

The aforementioned configuration makes it possible that a metal element same as the first layer is used as the material so that, for example, the metal element is palladium film if the silicide of the first layer is palladium silicide. This makes it easier to form the silicide layer and arrange for the material.

In other inventions, the manufacturing method of the LDD type TFT is as above.

[Second Group of Inventions]

Since in this group of inventions the gate electrode serves also as the mask when impurities are injected to manufacture the LDD-type TFT, when forming the gate electrode the thickness of which changes in multiple stages, the plating based on the gate electrode constituting the material layer readily formed on the gate insulator, oxidation, anodic oxidation, and other similar processing, as well as the photolithography, etching, etc. are used.

In one of the inventions belonging to this second group, as with the first invention in the first group of the inventions, as the gate electrode is made the LDD structure being used as the mask as well when impurities are injected, the lower electrode is employed to form an upper electrode above the former, and at this time, as for at least one side of either the source electrode side or the drain electrode side, either the upper electrode or the lower electrode juts out somewhat from the other, and the masking capacity of the said jutted-out portion is made imperfect.

The foregoing configuration allows for the following function.

In the semiconductor layer, a channel area is formed just beneath the central portion of the gate electrode, an LDD area just beneath the jutted-out portion of at least one side thereof, and further respective source and drain areas in any areas other than the above.

In other inventions, the upper gate electrode is formed by plating a metal film composed of the material which is in principle small in density on the readily formed lower gate electrode composed of a material which is in principle large in density. (Needless to say, the density is not always as such, depending on the thickness of the lower gate electrode film, shielding, masking capacity, plating thickness, and materials.)

The above-mentioned configuration allows for the following function.

Because the upper gate electrode is plated, it is very thin featuring excellent accuracy in thickness, and it is formed on the lower electrode on a very exact position.

In other inventions, the plating is either electrolytic or electroless plating.

This is convenient from the viewpoint of broader selection of the materials, waste disposal, and so forth.

When the upper gate electrode is formed by plating, unless otherwise processed beforehand, the jut-out portions over the lower electrode side are formed both on both the source electrode side and drain electrode side, and it is needless to say that plating is made on the upper face of the lower electrode as well.

In other inventions, the material of the upper gate electrode is anodized to form the mask for shaping the LDD.

In other inventions, the lower gate electrode such as Mo and Fe is made to react with predetermined object, for instance, with such gas as oxygen, and the mask for forming the upper LDD is shaped by using the chemical reactions such as forming the oxides on its upper and lateral faces, etc.

The aforesaid configuration allows for the following function.

In this case as well, the upper gate electrode can be formed with exact positioning and thickness by controlling the temperature, fluid pressure, etc. when the reaction is started.

In the case as above, the electric resistance may become high enough depending on the combination of the lower gate electrode material with reactive object, the upper gate electrode does not in fact function as its role, and instead may only serve s a mask. The principle in such a case should be that the upper gate electrode as a result of reaction after the injection of impurities is removed by etching, or may serve as an insulator.

In other inventions, first the lower gate electrode with solid masking function is formed, and then the impurities are gently injected, and afterward the upper gate electrode with a solid masking function that is jutted out at least either on the source electrode or on the drain electrode side is formed on the upper part of the lower gate electrode by plating, and further the impurities shall be squarely injected beneath them.

The configuration as above allows for the following function.

The impurity injection is thus required twice. However, the TFT having the LDD area in the jutted out lower portion of the upper gate electrode can be manufactured.

In other inventions, the protrusion, namely the jutted-out portion on the lateral end of the lower gate electrode of the upper gate electrode can be formed by using at least the photolithography and etching.

The aforesaid configuration allows for the following function.

A gate electrode serving also as the mask is formed to form the LDD structure where there is less deviation of the lower gate electrode from the upper gate electrode.

In some cases, such other means as anodization may be adopted along with these ones. Further it is probable that a resist may constitute a part of the mask.

In other inventions, the projection of the mask cum gate electrode, of which construction is that the upper and lower two stages and the upper stage juts out against the lower stage, shall be removed after the injection of impurities.

The foregoing configuration allows for the following function.

It becomes possible to form the LDD-TFT, the characteristics of which are different from each other, on a sheet of the substrate. The substrate becomes most suited to varied usages by forming this LDD type TFT only in a part of the area of same substrate corresponding to the role played by the element, or to the required performance. In addition to the above, both the first and second groups of the inventions as well as the several other inventions use, as the materials for the upper and lower gate electrodes, such metals (including silicide) with great hydrogen adsorption, particularly Ti, or other alloys having Ti as the primary component, or metals whose density is 8 or higher, more preferably 10 or higher, yet more preferably 13 or higher, more concretely such alloy as Ta and W of higher density, or any other material composed of these alloys or mixtures (W and Ti, for example) into which the hydrogen hardly penetrates when impurities are injected, and the material with low electric resistance.

[Third Group of Inventions]

In this group of the inventions, in addition to the first and second groups of the inventions, the gate insulator in the areas other than that just beneath the mask cum gate electrode is once removed before injecting the impurities to re-form the gate insulator in the said area after the impurity injection.

The above-mentioned configuration allows for the following function.

Because there exists no gate insulator, the acceleration voltage at the time of injecting the impurities may be as much lower proportionately, and consequently the damage of polycrystalline semiconductor due to the high-speed injection of the hydrogen used to dilute the impurities will become as much less accordingly irrespective of the channel, source, drain and LDD areas.

It goes without saying that certain heat treatment is performed as occasion arises in order to limit, and recover from, the damages of the polycrystalline semiconductor accompanying the removal of the gate insulator.

[Fourth group of Inventions]

In this group of the inventions, in particular, in addition to the third of the inventions, Ti or Zr film with excellent hydrogen absorption capacity is formed beforehand on the upper surface of the polycrystalline semiconductor after once removing the gate insulator in order to prevent, as far as possible, the hydrogen for diluting the impurities at the time of their injection from penetrating into the polycrystalline semiconductor.

The foregoing configuration allows for the following function.

Ti, etc. and further the hydrogen absorbed into Ti, etc. injected together with the impurities are physicochemically adsorbed, and reduced in rate, thus preventing the hydrogen from penetrating into the polycrystalline semiconductor at a high speed. Needless to say, these metals, especially Ti with smaller density does not so much hinder the injection of impurities.

Therefore, the performance of the LDD-TFT will further be improved.

In other inventions, Ti, etc., such as the hydrogen stopper, at the time of impurity injection shall be left alone in the area where the source and drain electrodes are formed, and the subsequent heat treatment makes them react with the polycrystalline silicon to form the silicide film.

The configuration such as mentioned above will allow for the following function.

The electric contact with the source electrode and drain electrode and with the polycrystalline silicon will be by leaps and bounds improved through the intermediary of the silicide layer.

Further, when contact holes are opened to form the source electrode and drain electrode, the layer of the silicide film or nonreactive Ti, etc. remaining on the upper face of the silicide film will serve as an etching stopper.

[Fifth Group of Inventions]

This group of the inventions is almost the same with the foregoing first to fourth groups of the inventions in every respect, except that the former is a bottom gate type, and the latter a top gate type.

Provided always that this group of the inventions has its own configuration where resin is exposed by irradiation of visible light or X-ray from the substrate side in order to form the mask at the position exactly corresponding to the gate electrode.

[Sixth Group of Inventions]

This group of the inventions is different from the first to fourth groups of inventions in that the former is non-LDD type while the latter LDD type. The purpose of this invention is to get a gate electrode with a low resistance preventing the hydrogen from penetrating into the lower portion of the channel area.

In one of the inventions, therefore, the gate electrode is divided into the two layers, one of which is formed from the material of a lower electric resistance, and other layer from the high-density metal or hydrogen adsorbing metal, among others.

In another invention, the gate insulator is once removed when the impurities are injected.

In yet another invention, the Ti film is formed after once removing the gate insulator in order to prevent the hydrogen infiltration. Note that this film shall in principle be removed once the impurities are injected.

[Seventh Group of Inventions]

This group of the inventions relates to the substrate using the LDD-type TFT, while all the above-mentioned invention groups relate more particularly to the LDD-type TFT itself.

Formed on each part of a sheet of the substrate in one invention is the LDD-type TFT, whose characteristics correspond to the roles of the said respective parts.

In other inventions, formed on the respective parts of a sheet of the substrate are varied parts, the films and layers responding to the roles of the said parts. And, their formation and that of the LDD type TFT in the aforesaid groups of the inventions have been rendered interchangeable as far as possible.

EXPLANATION OF THE NUMERALS

Figure 1:
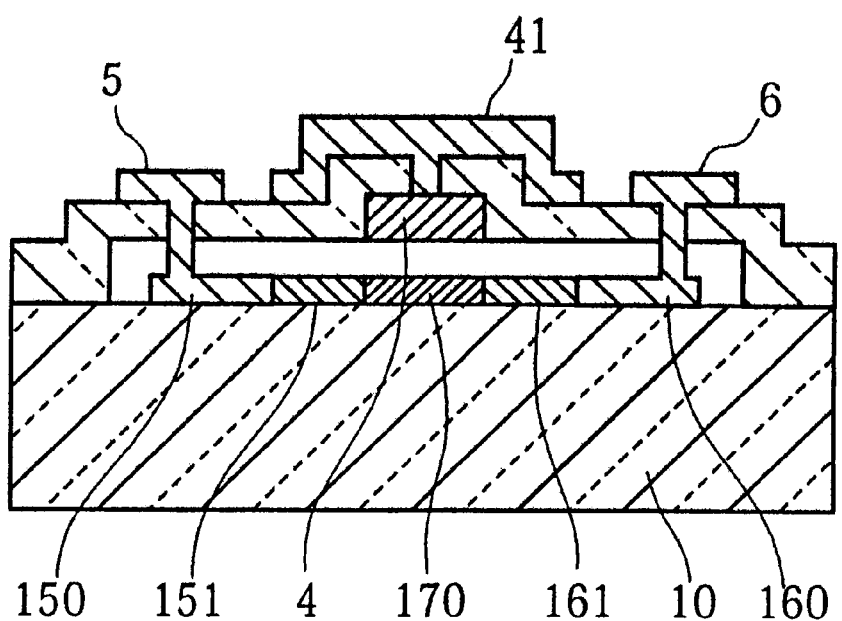
FIG. 1 is a cross sectional view of the thin film transistor according to the LDD structure by prior art.
Figure 2:
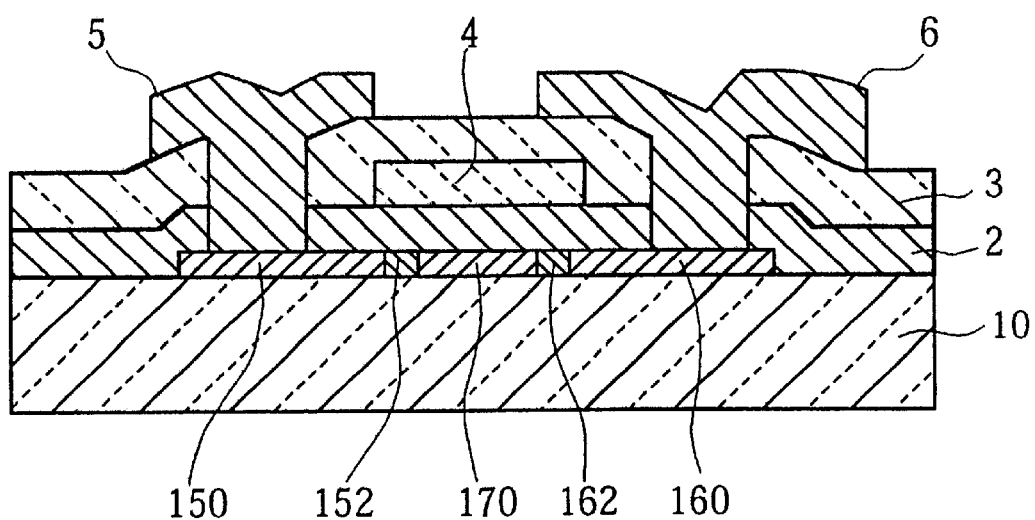
FIG. 2 is a cross sectional view of the thin film transistor according to the GOLD type LDD structure by prior art.

1: p-Si semiconductor (layer)
100: a-Si semiconductor (layer)
150: a-Si semiconductor (source area)
151 and 152: a-Si semiconductor (LDD portion on source side) 156: a-Si semiconductor (Multistage LDD portion)
1562: a-Si semiconductor (LDD portion)
160: a-Si semiconductor (Drain area)
161 and 162: a-Si semiconductor (LDD portion on drain side) 170: a-Si semiconductor (Channel area)
175: a-Si semiconductor (Source electrode side)
176: a-Si semiconductor (Drain electrode side)
2: Gate insulator
25: Gate insulator (Source electrode side)
26: Gate insulator (Drain electrode side)
3: Interlayer dielectric
4: Gate electrode
41: Subgate electrode, Upper gate electrode
413: Lower silicide gate electrode
4130: Amorphous silicon gate electrode
414: Upper metal gate electrode
4141: Protrusion of upper metal gate electrode
415: Silicide gate electrode
416: Lower metal gate electrode
417: Intermediate metal gate electrode material
42: Lower gate electrode
421: First lower gate electrode
422: Second lower gate electrode
43: Upper gate electrode
431: First upper gate electrode
432: Second upper gate electrode
435: Protrusion of the upper gate electrode on source side
436: Protrusion of the subgate electrode on drain side
47: Lower injection mask
48: Upper injection mask
49: Photo resist
5: Source electrode
51. Upper part of source electrode
52: Lower part of source electrode (Silicide)
6: Drain electrode
61: Upper part of drain electrode
62: Lower part of drain electrode (Silicide)
9: Contact hole
95: Contact hole (Source electrode side)
96: Contact hole (Drain electrode side)
10: Glass substrate
11: Pixel electrode
12: Undercoat film
13: Resist film
14: Alignment layer
18: Titanium film
19: Mask for exposure

DESCRIPTION OF THE PREFERRED EMBODIMENT

Hereunder, we are going to explain this invention referring to its preferred embodiments.

[First Group of Inventions]
(Embodiment 1-1, Structural Phase)
(Note: The embodiment 1-1 means the first embodiment in the first group of inventions in particular. The embodiment may sometimes incorporate the configuration of other group or groups of inventions.)

This embodiment makes use of the silicide.

Figure 3:
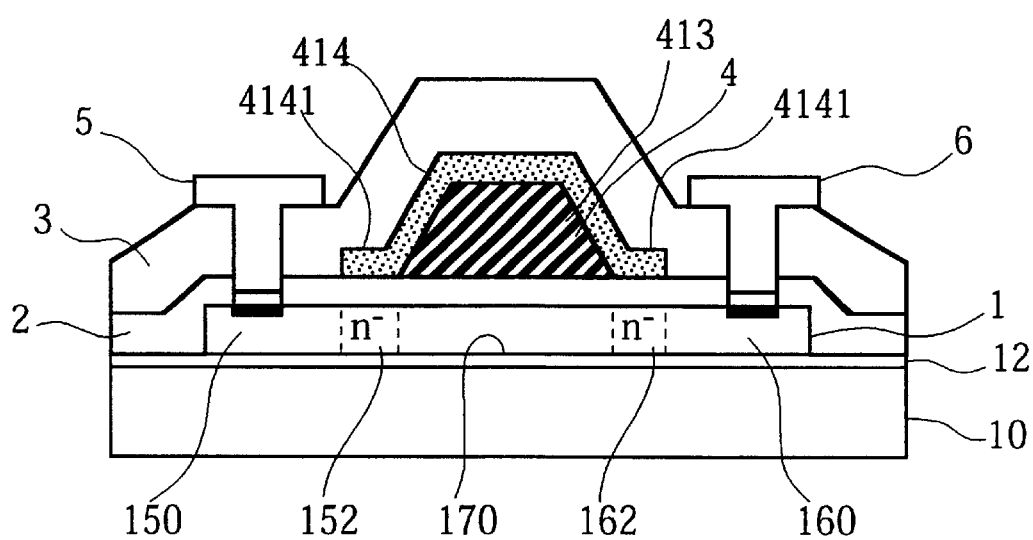
FIG. 3 is a cross sectional view of the semiconductor element in the embodiment 1-1 by this invention.

FIG. 3 is a cross sectional view of the TFT as the first embodiment in the first group of inventions. As is shown in this figure, the TFT is so designed that the semiconductor layer 1 is formed on the insulating substrate 10, the gate electrode 4 is formed on the gate insulator 2, and the source area 150 and drain area 160 are formed on the semiconductor layer on both right and left side in the lower portion of the figure, by injecting the ions of impurities into the semiconductor layer with the gate electrode used as the injection mask. Further the interlayer dielectric 3 is formed, while the source electrode 5 and drain electrode 6 are formed making use of the connections in the contact holes as formed in the interlayer dielectric on the upper parts of the source and drain areas. Thus, the basic configuration is the same as the conventional one as shown in FIG. 1.

Provided however that the gate electrode is of the multi-layer (almost bilayer) consisting of the lower silicon layer 413 containing the silicide layer formed on the gate insulator and the metal layer 414 formed as if it hung over the silicon layer 413. Cogitated further is the structure of the end portion 4141 of the source electrode and drain electrode sides. This embodiment is different from any others in that the semiconductor layer of the channel area in the lower part of the figure is of LDD structure. We are going to describe mainly these differences.

First, the silicide of the silicon layer in the gate electrode is made of the titanium silicide, cobalt silicide, nickel silicide, zirconium silicide, palladium silicide, platinum silicide and so forth. Use of these silicide layers makes it possible to reduce the resistance of gate electrode.

For example, use of titanium silicide makes the sheet resistance of electrode lower than that of the conventional high melting point metals to 13 $\mu\Omega/\square$, that of cobalt silicide to 20 $\mu\Omega/\square$, that of nickel silicide to 40 $\mu\Omega/\square$, that of zirconium silicide to 35 $\mu\Omega/\square$, that of palladium silicide to 35 $\mu\Omega/\square$, and that of platinum silicide to 30 $\mu\Omega/\square$.

Then, the metal layer 4141 is so formed that it completely covers the silicon layer. Further the structure 4141 is so designed that on the gate insulator 2 the metal layer 414 juts out from the silicide layer to the one side of the source electrode and drain electrode sides by about 5 or 6 $\mu$m.

From the smaller electric resistance viewpoint, the metal layer shall preferably be aluminum or its alloy, and from the heat resistance viewpoint at the heat treatment it shall preferably be such high melting point metals as tungsten and molybdenum. Provided however that it needs not be limited to these metals. In principle any metals will do only if they can suitably function as the mask cum gate electrode satisfying height and other requirements. The thickness of the metal layer, which depends upon the kinds of metals, in particular their density and atomic number having influence on the shielding effect when impurity ions are injected, is approximately one hundred to several thousands. If the titanium (Ti) is used, for instance, the thickness, which depends also on the acceleration voltage and the kind of the ions to be injected, will preferably be approximately 500 to 1000 Å.

Then, it becomes possible to inject the impurity ions such as P and B from above the gate electrode of such a construction, which will be taken as an injection mask (shield).

Therefore, this embodiment is different from the conventional ones in that the semiconductor layer in the lower portion of the electrode takes naturally the structural form of LDD. Described below in more detail will be this construction.

The preferred injection conditions of the ions in this case are as follows. The acceleration voltage is preferably 50 to 70 keV, and injection volume 1.0 E 15 (power 15 on 10) to 8.0 E 15/cm². The thickness of the gate insulator 2 will be of approximately 800 to 1200 Å.

As a result of this injection, P ion will be injected for example in the case of n-channel transistor. A sufficient amount of P ions are injected into an area without any gate electrode in the flying direction of the impurity ions (upward in general), forming thus the n+ layer, source area 150 and drain area 160.

In any area where the silicide layers and metal layers are laminated with each other, no P ions are injected with these layers acting as the shield film for P ions. This area will therefore serve intrinsically as a channel area 170.

In an area just beneath the ion flying direction in the portion 4141 where only metal layer is formed with silicon layer jutting out on the gate insulator 2, the thickness of the metal layer is not sufficient to shield the injection ions completely. So the impurity ions are injected a little. If, for instance, the aforesaid Ti film is used as the metal layer and the ions are injected under the foregoing conditions, ions of approximately 1.0 E 14 to 5.0 E 14/cm² will be injected.

As a result, these portions will come to form the n-layers 151 and 152. Thus, one time of injection makes it possible to form with ease the LDD structure that is of high accuracy as a whole.

As a variation example of this embodiment, of course, the silicide thin film, in place of the upper metal film, may be formed as more or less jutting out toward the channel direction of the lower silicide film.

Figure 4:
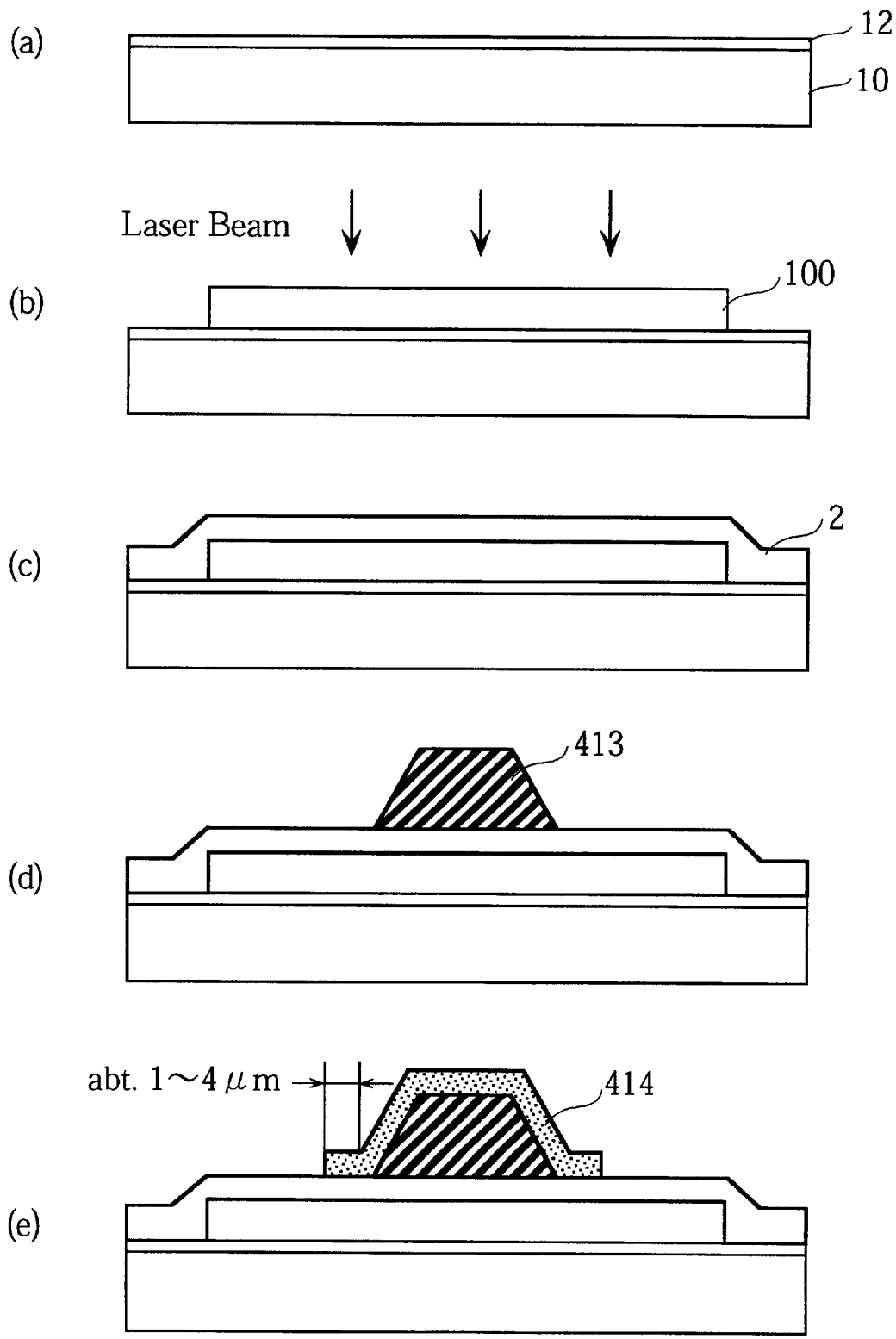
FIG. 4 indicates the first half of the drawings that show the changes in cross section as the semiconductor element in the above-mentioned embodiment is formed.
Figure 5:
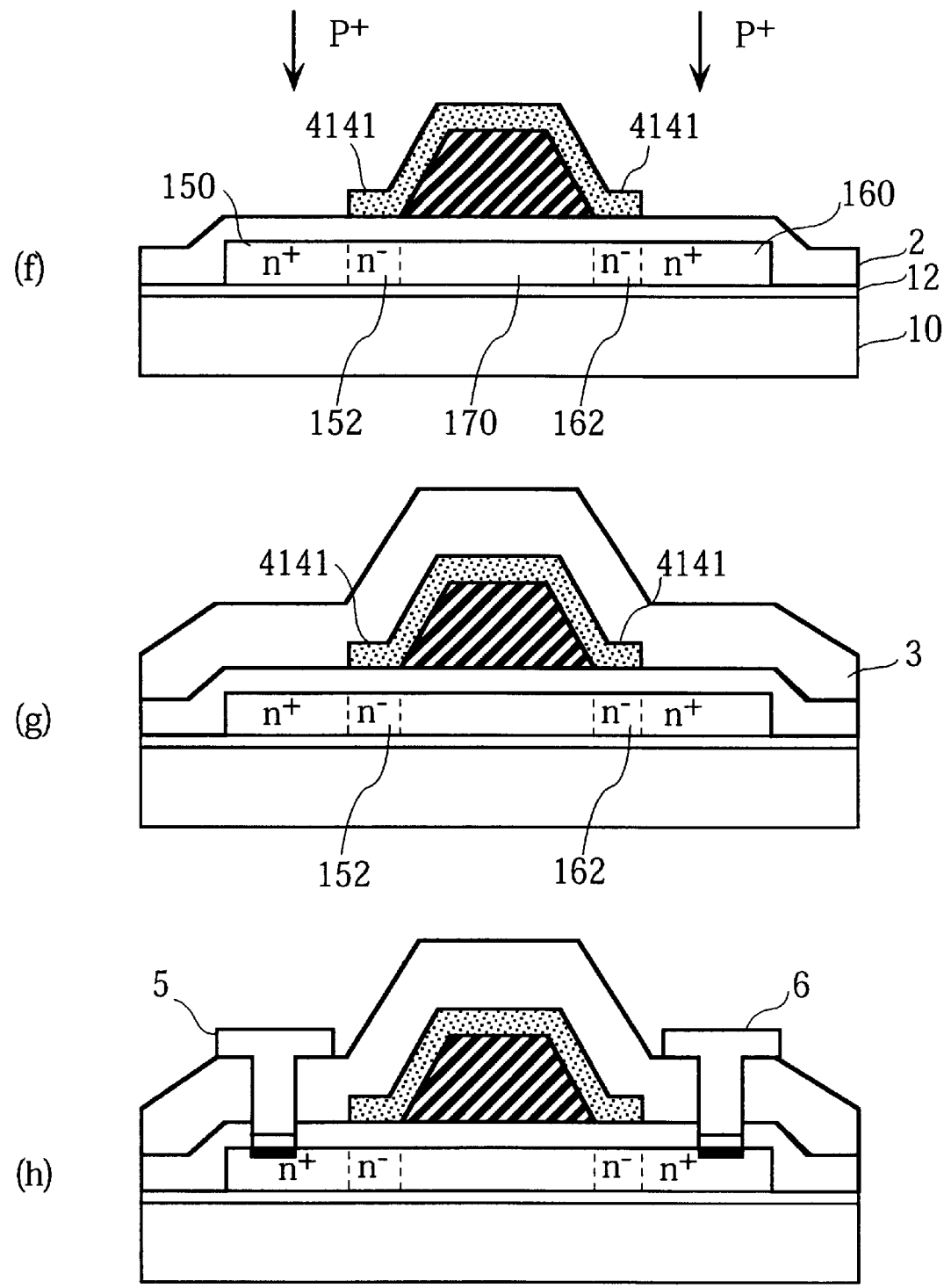
FIG. 5 indicates the drawings showing the changes in cross section accompanying the formation process following the said FIG. 4.

(Embodiment 1-1, Manufacturing Method)
Referring now to FIGS. 4 and 5, we will explain how to manufacture the LDD type TFT of such construction as shown in FIG. 3.

First, we will explain referring to FIG. 4. Although FIGS. 4 and 5 are intrinsically to be one figure (one drawing number), it has been thus separated into two sheets (drawings) on account of space consideration.

(a) SiO₂ film is formed as the undercoat film 12 on the nonalkaline glass substrate 10.

(b) Formed over all the surface of SiO₂ film is the amorphous silicon (a-Si) 100, which then is made into polycrystalline silicon (silicon composed of single large particles) by irradiation from the excimer laser annealer (melting, recrystallization). Then, this polysilicon film 100 is left only in the area where the transistor (element) delimited by the pixel portion on the substrate and the surrounding drive circuit portion is formed with any other portions removed. This is so-called isolation/patterning. FIGS. 4 and 5 represent this isolated polysilicon film and accordingly the respective portions of one semiconductor element.

(c) The gate insulator 2 is formed over all the surface. The thickness of the gate insulator in this case depending on the film quality and size of the transistor, we used here SiO₂ formed by APCVD or TOES plasma CVD method into the thickness of approximately 800 to 1200 Å.

(d) Formed over all the surface of respective patterned gate insulators is the silicide film intended for forming the gate electrode. The silicide film thus formed is left only at the position corresponding to the gate electrode (413), and any other silicide films are removed. Although the titanium silicide film is used in this embodiment, some other silicides will of course do. The molding method used was sputtering. (e) The metallic film 414 is formed over all the surface of patterned silicide film in order to shape the gate electrode of such geometrical form as shown in FIG. 4. It was then designed so that the ends of the source electrode and drain electrode sides should jut out by about 1 to 4 µm from the silicide film. This is the patterning. As a result the lower silicide layer comes to be covered completely by the upper metal film. The Ti layer was used as metallic film in this case. Its thickness was made to be about 500 to 1000 Å.

Referring now to FIG. 5;

(f) Under this condition, P ions are injected from the upper face of the substrate to form the thin film transistor of n channel. The injection conditions are as follows. The acceleration voltage is 60 to 70 keV, and the injection volume 1.0 E 15 to 5.0 E 15/cm². On the polycrystalline silicon in an area where no gate electrode of bilayer structure is formed, p is injected in the above quantity to form n+ layer and accordingly the source area 150 and drain area 160.

On the other hand, in the area where only the metallic layer is formed on the gate insulator under the gate electrode, that is at the ends 4141 on the drain electrode and source electrode sides of the metallic layer, a part of the P ions as injected is shielded at the ends of that metallic layer, but the remaining part is injected into the polysilicon layer in the lower layer. This will cause the n-layers 152 and 162 to be formed in this area. This means that one time of ion injection led to the natural and highly accurate formation of the LDD structure.

(g) Next, the interlayer dielectric 3 is formed over all the surface of the substrate. This film was the SiO₂ film formed, for example, by the APCVD or TEOS plasma CVD method, and its thickness was made to be about 6000 to 9000 Å.

(h) Lastly, contact holes were opened in the area corresponding to the source area and drain area. Further, the metallic film was formed and metal embedded to form the source electrode 5 and drain electrode 6 removing any unnecessary portions, and further required connection wiring (not shown). This led to the completion of the thin film transistor.

(Embodiment 1-2)

Figure 6:
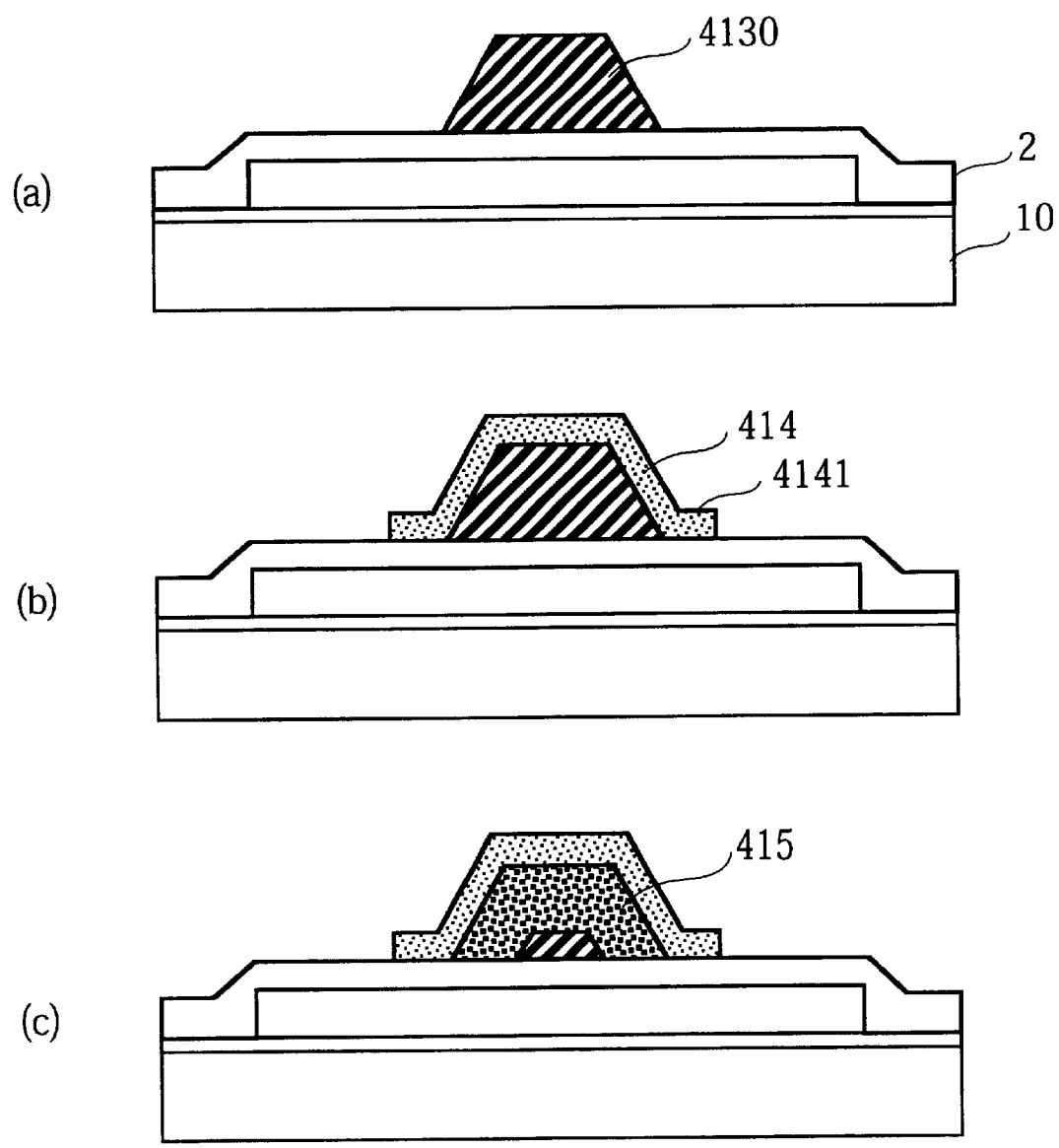
FIG. 6 indicates the drawings that show the change in cross section accompanying the formation process of the semiconductor element in the embodiment 1-2 according to this invention.

Referring to FIG. 6, we will now explain the second embodiment (manufacturing method) in this group of inventions.

The thin film transistor according to this embodiment is the same as the previous first embodiment for formation of the gate insulator up to in FIG. 4(c). And this differs from the formation of the gate electrode. From this part onward, we will explain referring to FIG. 6.

(a) The amorphous silicon layer is formed over all the surface of the substrate 10 in order to use it for the formation of the gate electrode. Removing any unnecessary portions will contribute to the formation of the amorphous silicon layer 4130 as patterned by matching the center to the intrinsic position of the gate electrode.

(b) The metallic film 414 is formed over all the surface of the substrate where the amorphous silicon layer is formed, and all the parts are removed except the portion 4141 by about 1 to 4 µm from the upper face of patterned amorphous silicon layer and from the ends of the source electrode and drain electrode sides of this layer (more strictly, the portions required for the electric connection of the semiconductor element other than the upper portion of the patterned polysilicon). This is so-called patterning.

This will result in a structure wherein the metallic layer 414 is completely laminated on the amorphous silicon layer 4130. In this case, the amorphous silicon layer will be formed by the plasma CVD or sputtering method, and its thickness will be about 500 to 2000 Å. The metallic film used will be Ti film, and its thickness will be of the order of 2000 to 5000 Å.

(c) Under this condition, the amorphous silicon layer is made to react with Ti, the metallic film, and heat treatment is carried out to form the silicide film 415 in between. The heat treatment is effected at 550 to 650° C. for about 30 minutes.

Needless to say, this metallic silicide may be formed from other metals.

Although there exists nonreactive metal in the figure, total reaction will do of course.

Needless to say, further, thorough reaction will do maintaining such a form that the upper layer of the amorphous silicon and metal protrudes by about 1 to 4 µm from the ends of the source electrode and drain electrode sides in the lower layer.

Here follows the process in which the transistor element is formed. From here on the processing similar to that in the previous first embodiment (as shown in FIG. 5(f)) will be performed.

As above we succeeded in forming a thin film transistor having as high a precision LDD structure as that in the first embodiment.

(Embodiment 1-3)

Figure 7:
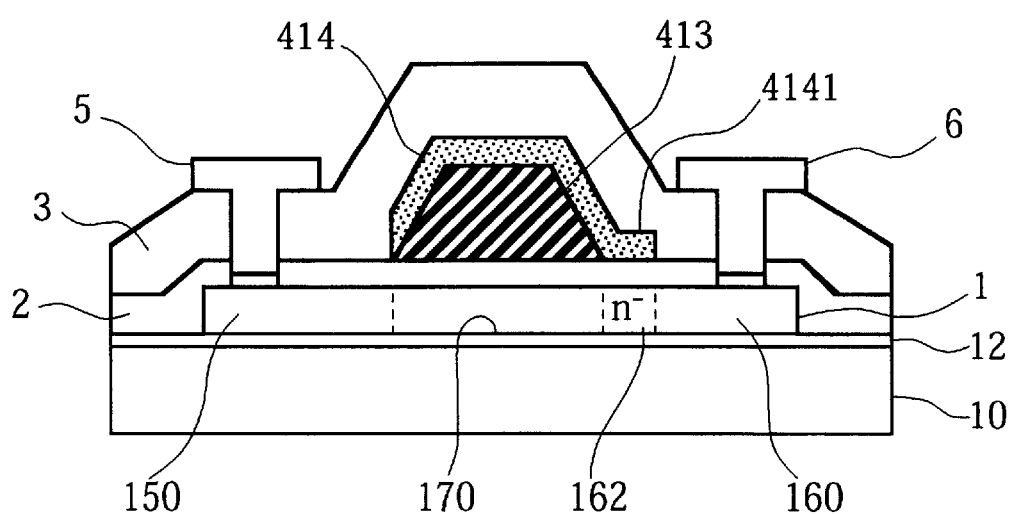
FIG. 7 is a cross sectional view of the semiconductor element in the embodiment 1-3 by this invention.

FIG. 7 illustrates the third embodiment in this group of inventions.

This embodiment is a variation from the example of the first embodiment as shown in FIG. 3, where only the drain electrode side has been made into the LDD structure 162 in order to reduce the stray capacitance.

(Embodiment 1-4)

Figure 8:
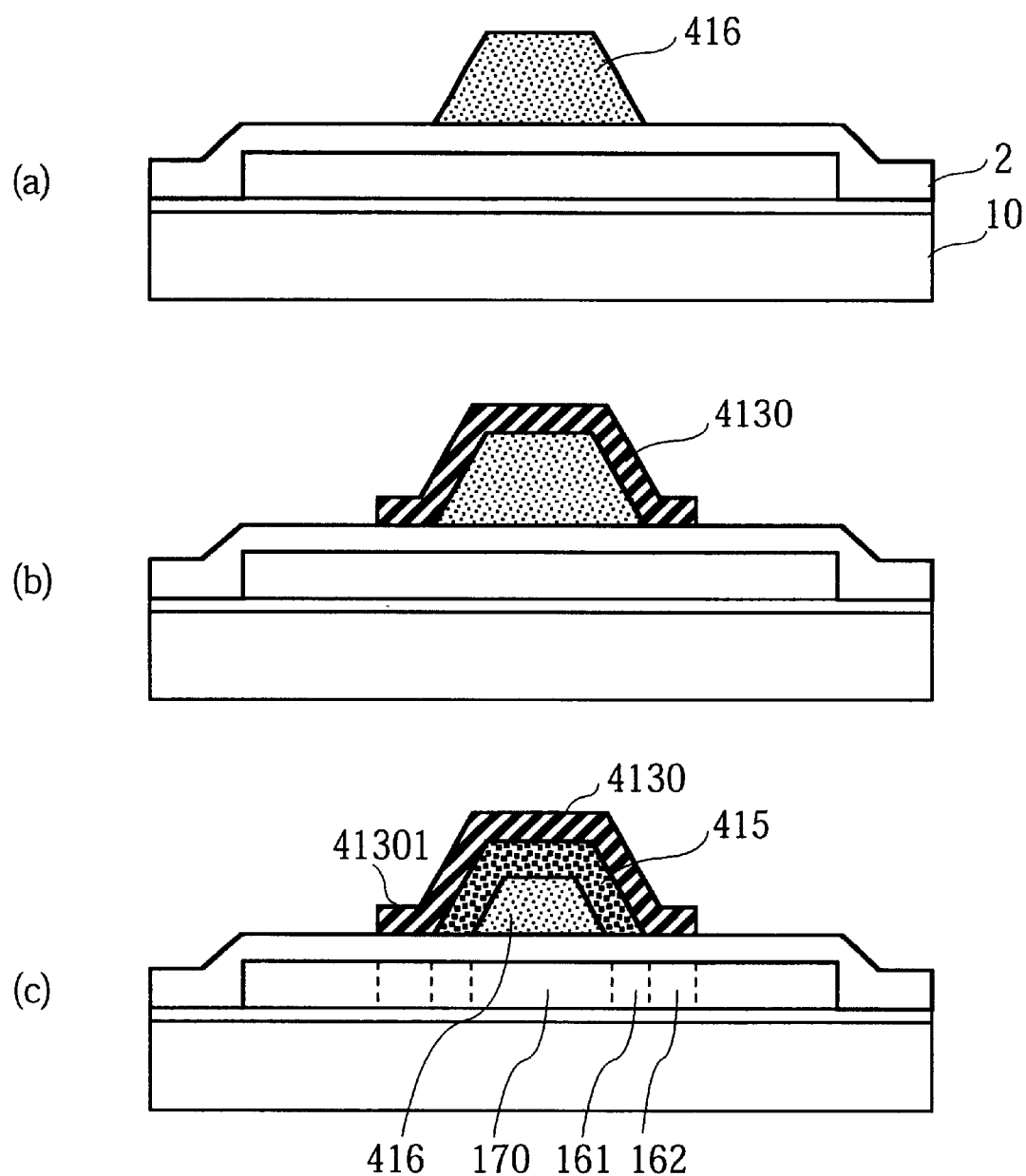
FIG. 8 indicates the drawings that show the cross section of the semiconductor element according to the embodiment 1-4 of this invention and its principle.

FIG. 8 show the fourth embodiment according to this group of inventions.

This embodiment is an exemplary development of the embodiment 1-2 described referring to FIG. 6.

In this embodiment, as shown in FIG. 8(c), the metallic film, silicide film and amorphous film are formed in this sequential order into three layers on the gate insulator. Injection of impurities from the above three layers will lead to the formation of two-stage structure LDD.

Referring now to FIG. 8, we will explain how to manufacture this semiconductor element.

(a) The patterned metallic thin film 416 is formed on the gate insulator 2 of the substrate 10.

(b) The amorphous silicon film 4130 is patterned into form as if it completely covers said metallic thin film. In this case, the amorphous silicon film is so formed as somewhat protruded toward the source electrode and drain electrode sides of the metallic thin film. Up to this process, therefore, the manufacturing method is the same with that in the embodiment 1-2 except that the materials of the upper and lower film layers are reversed upside down.

(c) As was the case with the embodiment 1-2, the heat treatment makes this metallic thin film react with the amorphous silicon to form the silicide layer 415 between these layers, when the heating temperature and time is so adjusted that the metallic thin film should remain in predetermined length and, of course, in constant thickness in the direction of the channel area.

Similarly, at least the protrusion of the amorphous silicon shall remain non-reacted.

From the above, it results that the gate electrode in the upper portion of the channel area does form an intermediate portion consisting of the silicide layer and additionally nonreactive amorphous silicon layer in the upper layer between the thin wall portion 41301 consisting only of the amorphous silicon on both sides of the gate electrode and the thick wall portion consisting of the nonreactive metallic thin film 416 in the upper and lower layers at the center of the gate electrode and the silicide layer 415 in the upper layer or additionally of the nonreactive amorphous silicon layer 4130 in the upper layer.

In general, the density of silicide falls into a value between the density of the silicon and metal that constitute the silicide (not always the median value). In this intermediate portion, therefore, its thickness itself might be equivalent to that of the thick portion at the center of the channel area (sometimes not equivalent of course), but its capacity as the mask (shielding) when the impurity ions are injected is poorer.

In consequence, if the impurities are injected from above the substrate under this condition, two-staged LDD comes to be formed naturally as shown by 161 and 162 in this figure (c).

When forming the film on the (substrate) slab, its thickness and plane dimensions may easily be controlled. The rate of the chemical reaction of the metal with silicon is also easily controlled because we have only to pay our attention to the reaction rate and temperature. Consequently, the intrinsically minute dimensional control of the LDD consisting of two stages of many semiconductor elements arranged on the substrate is rendered extremely easy.

(Embodiment 1-5)

This embodiment is also another developmental example of the embodiment 1-2 as shown in FIG. 6.

In this embodiment, the two-staged LDD is actualized by making the gate electrode into 3-layer structure and injecting the impurities with this electrode used as a mask as shown in FIG. 9(c).

Figure 9:
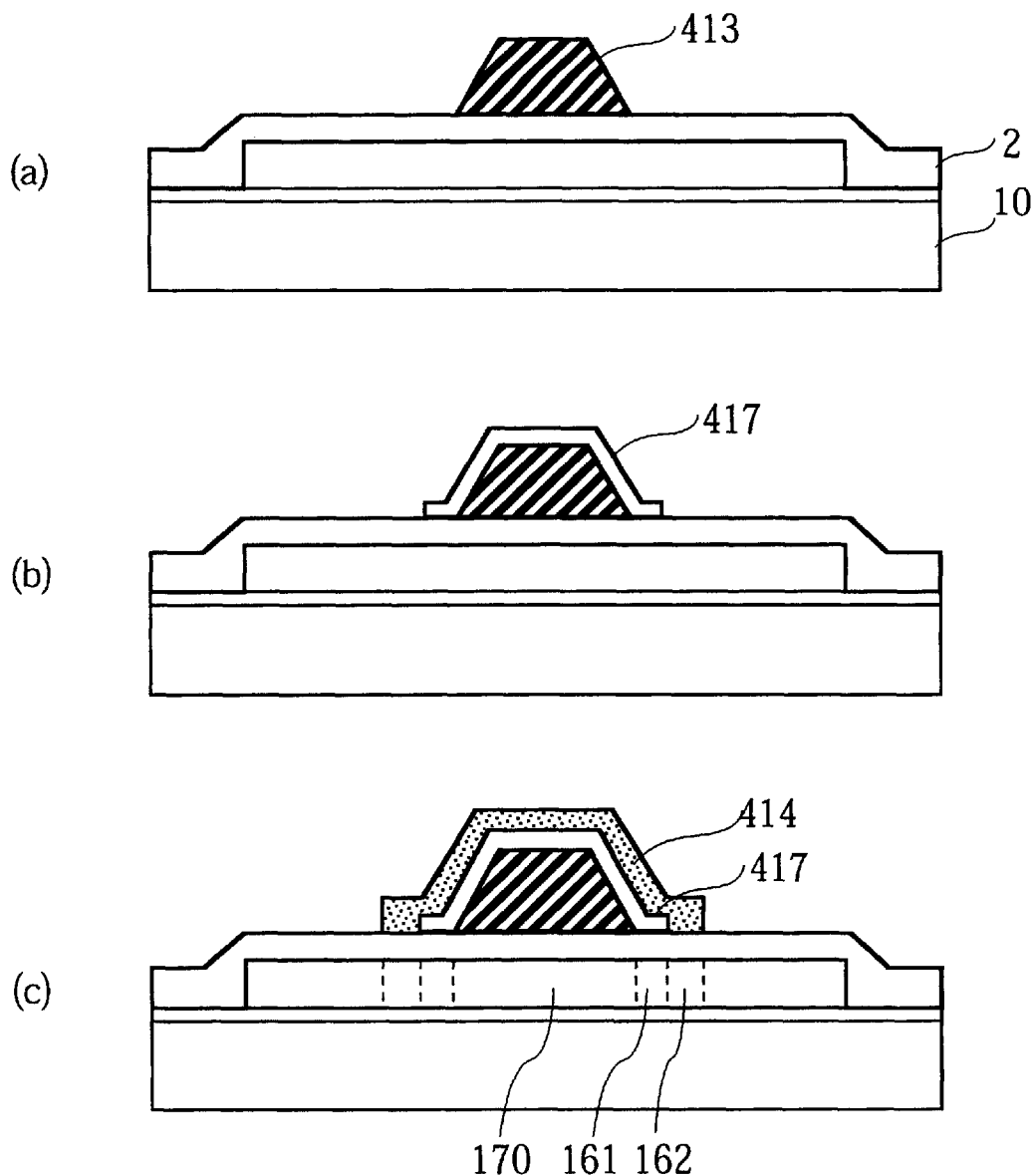
FIG. 9 indicates the cross sectional views of the semiconductor element according to the embodiment 1-5 of this invention.

Referring now to FIG. 9, we will explain this embodiment.

(a) Patterned silicide layer 413 is formed on the gate insulator 2 of the substrate 10.

(b) The silicide layer 413 is completely covered in the form more or less protruding toward its source electrode and drain electrode sides to form the patterned aluminum thin film layer 417.

(c) This aluminum thin film layer 417 is completely covered, and the patterned tungsten or molybdenum thin film 414 is molded in the form more or less protruding toward the source electrode and drain electrode sides.

Under these conditions, the impurities are injected from the above. This will allow for forming the two-staged LDD constructions 161 and 162 as shown in (c) of this figure.

Now we will proceed to the heat treatment of p-Si. Since the central aluminum film 417 is surrounded by the film 414 consisting of the high melting point tungsten, etc. in the upper portion and of the high temperature and stable compound silicide 413 in the lower portion, temperature rise even near its melting point does not produce any such inconveniences as deformation and hillock. Even if such inconveniences are produced, there exists a conductor layer above and below said portion and the length itself of the portion susceptible to said inconvenience is short enough, which will have little adverse effect on the electric resistance of the whole.

Therefore, the electric resistance of the gate electrode in this semiconductor element comes to sharply decrease due not only to the silicide but also to the aluminum with a low electric resistance.

(Embodiment 1-6)

Figure 10:
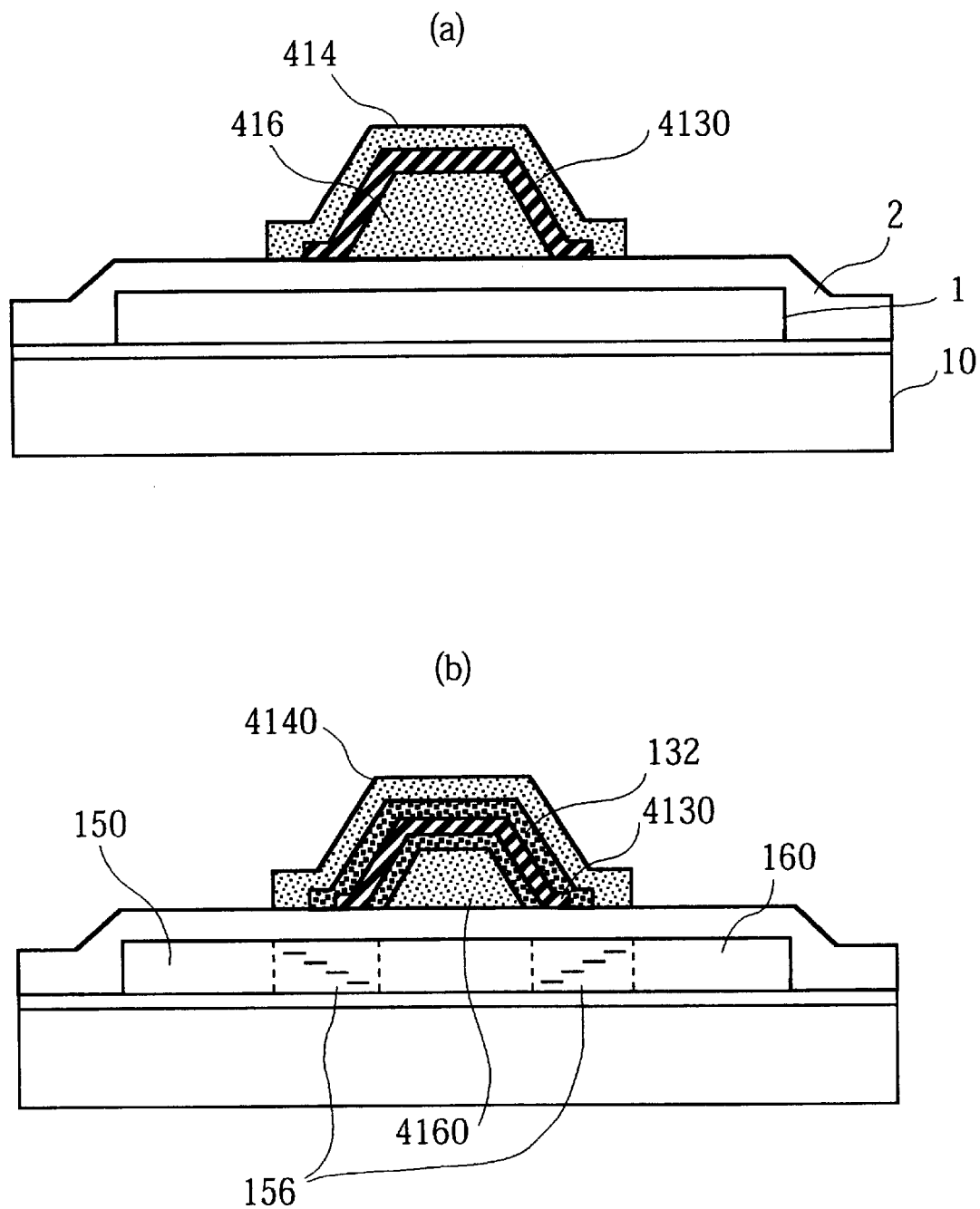
FIG. 10 indicates the drawings that show the principle and cross section of the semiconductor element according to the embodiment 1-6 of this invention.

This embodiment is a further development of the previous embodiment 4-1. Formed in this embodiment on the gate insulator as shown in FIG. 10(a) are the patterned lower metallic film 416, amorphous silicon film 4130, and upper metallic film 414, in this sequential order, when the upper film not only covers completely the lower film but is so formed as jutting out somewhat toward the direction of the source electrode and that of the drain electrode. Under these conditions, each substrate is exposed to 550 to 660° C. of temperature for 10 to 20 minutes. By this, the gate electrode will be divided into five layers as shown in FIG. 22(b): from the lowest, first nonreactive metallic layer 4160, silicide layer of the first metal, nonreactive amorphous silicon layer 4130, silicide layer of the second metal, and nonreactive second metallic layer 4140. If accordingly the impurities are injected with this gate electrode used as a mask, the combined geometrical thickness and change in density makes the impurity density of the LDD structure multistage 156, so to speak, thereby allowing to display an excellent performance.

(Second Group of Inventions)

(Embodiment 2-1)

This embodiment makes use of plating and the like for the mask cum two-staged gate electrode.

Figure 11:
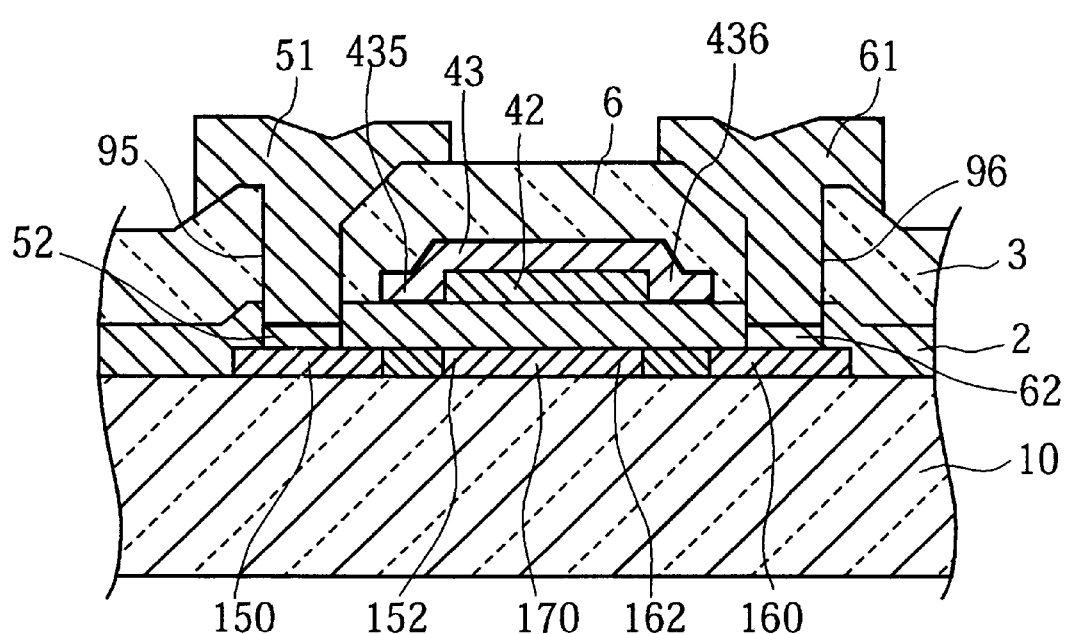
FIG. 11 is a cross sectional view of the thin film transistor according to the embodiment 2-1 by this invention.

FIG. 11 shows the cross sectional view of the thin film transistor according to this embodiment. In this figure, the numeral 10 represents the glass substrate, while 150, 152, 170, 162, and 160 symbolize the polycrystalline silicon layers having the LDD structure. The numeral 2 represents the gate insulator, while 42 and 43 symbolize the lower gate electrode and upper gate electrode, respectively. The numerals 3, 5 and 6 represent respectively the interlayer dielectric, source electrode and drain electrode.

Formed on the glass substrate 10, the TFT substrate, is the polycrystalline silicon layer 1 of 500 to 1000 Å in film thickness, on which is formed the gate insulator 2 consisting of the SiO$_2$ (silicon dioxide) of several hundreds to 1000 Å in film thickness and further sequentially laminated is the interlayer dielectrics 3 consisting of the gate electrodes 42 and 43 as well as SiO$_2$ of the two-staged structure composed of such metallic material as aluminum.

This gate electrode consists of the lower gate electrode 42 and the upper gate electrode 43 that is so formed as covering the upper face of said lower gate electrode. Furthermore, the ends of the source electrode and drain electrode sides of the upper gate electrode 43 somewhat juts out from the lower gate electrode 42.

Regarding the material of the two-staged gate electrode, the density of the material of the upper gate electrode 42 is desired to be higher than that of the lower gate electrode 43 from the standpoint of the height of gate electrode (if too high, however, such inconvenience would arise as too thick a gate insulator) and masking effect. More concretely, the material of the lower gate electrode 42 will preferably be Al, Al/Ti, Al/Zr/Ti, while that of the upper gate electrode 43 will preferably be Ta, Cr, Mo, etc.

Injection of impurities with this gate electrode as a mask allows the polycrystalline silicon layer to be formed, as shown in this figure, in the channel area 170 just below the lower gate electrode 42 and the LDD areas 152 and 162 with low concentration of impurities just below the portions 435 and 436 where the source electrode, drain electrode and upper gate electrode sides jut out from the lower gate electrode and the areas 150 and 160 with high concentration of impurities where there exists no gate electrode in the upper portion on the source electrode and drain electrode sides.

The junction face between the source area 150 and LDD area on the source electrode side almost coincides with the end face of the upper gate electrode 43, while the junction face between the LDD area 152 and channel area 170 almost coincides with the end face of the lower gate electrode 42. Further the junction face between the drain area 160 and the LDD area 162 on the drain electrode side almost coincides with the end face of the upper gate electrode 43, while the junction face between the LDD area 162 and channel area 170 almost coincides with the end face of the lower gate electrode 42.

(Note: In fact some discrepancy may occur due to the scattering by the gate insulator at the time of injection of impurities and to the diffusion at the time of heat treatment.)

In addition, the TFT will be provided with the drain electrodes 61 and 62 as well as the source electrodes 51 and 52 whose upper part is made from aluminum and lower part from titanium. The source electrode 5 is connected with the source area 150 of the semiconductor through the contact hole 95 drilled in the gate insulator 2 and interlayer dielectric 3, while the drain electrode 6 is connected with the drain area 160 through the contact hole 96.

Figure 12:
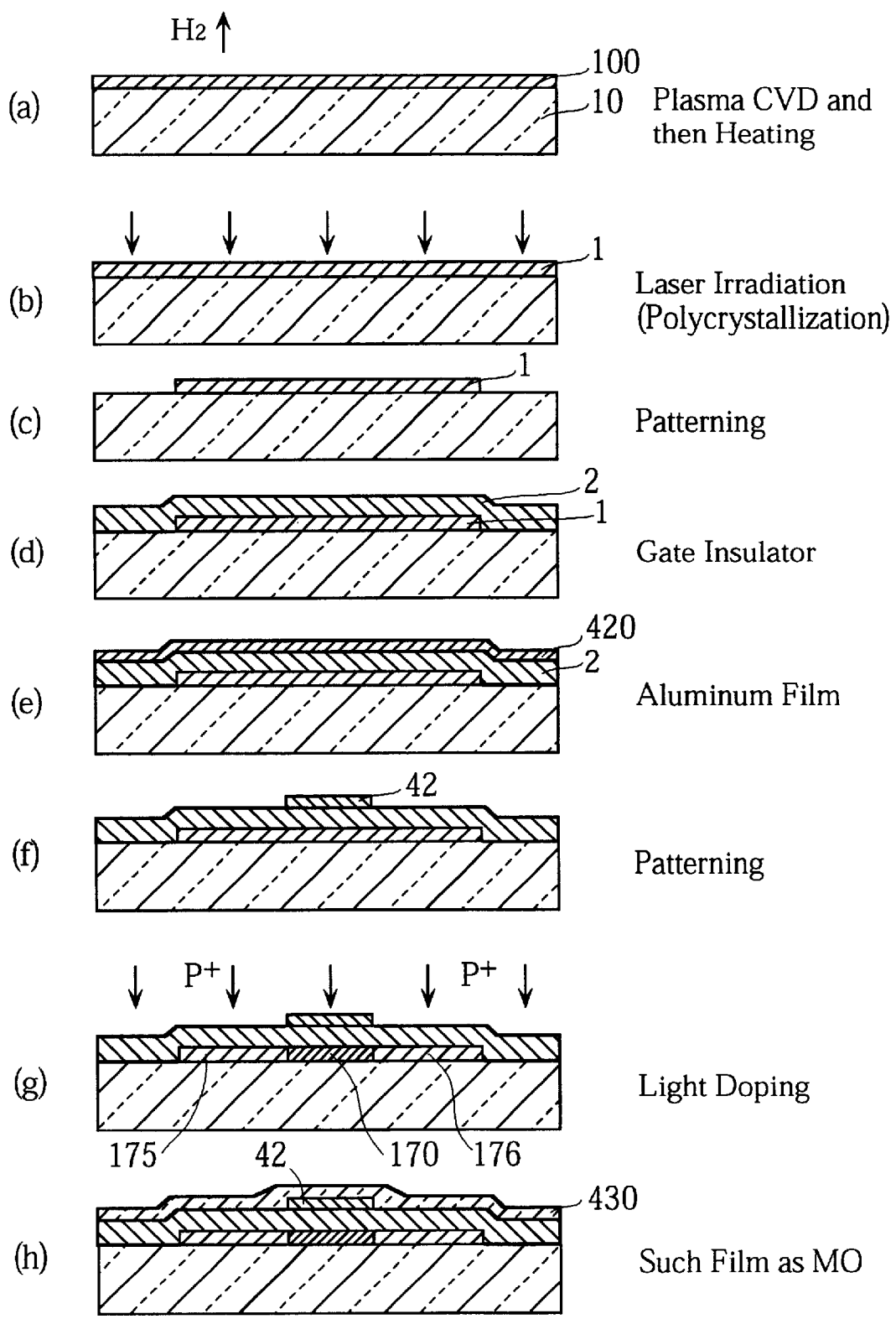
FIG. 12 indicates the drawings that show the first half of the manufacturing process of the thin film transistor according to said embodiment.
Figure 13:
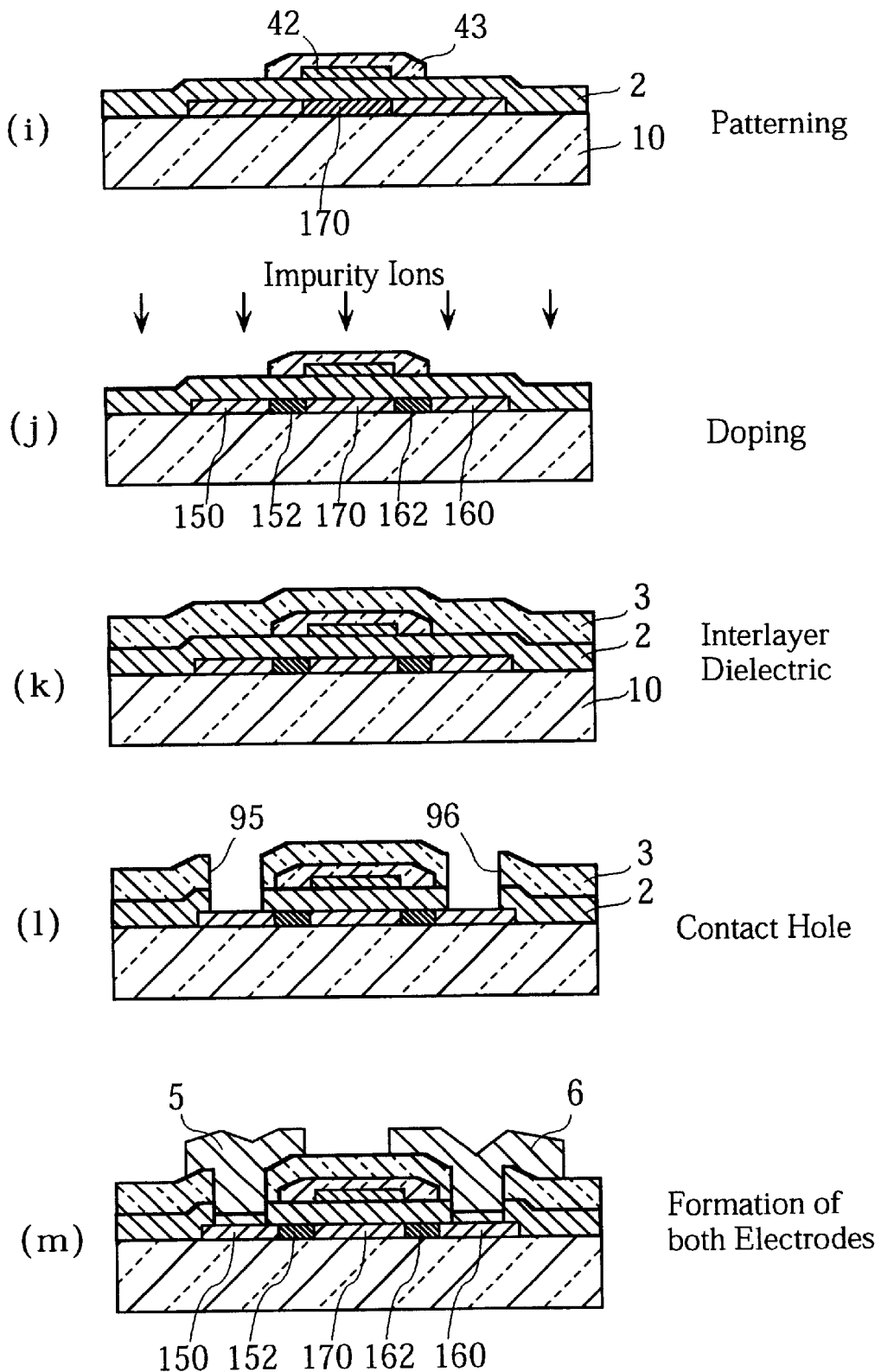
FIG. 13 indicates the drawings that show the last half of the manufacturing process of the thin film transistor according to said embodiment.

Referring now to FIGS. 12 and 13, we will explain how to manufacture this TFT. Note that though these figures are intrinsically to be one figure, it has been thus separated into two sheets on account of space consideration.

First we explain by referring to FIG. 12.

(a) a-Si layer 1 of 500 to 1000 Å in thickness is made to accumulate on the glass substrate 10 by the plasma CVD or reduced pressure CVD method. Then, dehydrogenation processing is performed at 400° C. to prevent the ablation on the a-Si film 100 due to the leaving of internal hydrogen at the time of subsequent polycrystallization by laser irradiation.

(b) Laser annealing using excimer laser of 308 nm in wavelength once melts down the a-Si layer 1, which will then be crystallized (into p-Si) to form the polycrystalline silicone layer 1.

(c) So-called photolithography will shape the polycrystalline silicon layer into the form that follows the arrangement of the semiconductor element on the substrate. This is called isolation or patterning.

(d) Formed on the glass substrate shall be two layers of $SiO_2$ (Silicon dioxide), 1000 Å in thickness so that they should completely cover the patterned polycrystal silicon 1. Note that this layer will become the gate insulating layer of the semiconductor element.

(e) The aluminum layer 420 is formed into a film all over the surface of the substrate. Note that this layer will become the lower gate electrode of the semiconductor element.

(f) The aluminum layer 420 is patterned into predetermined geometrical shape by photolithography to form the lower gate electrode 42.

(g) The first impurity ions as diluted by $H_2$ gas is injected from the above accelerating them by voltage with this gate electrode 42 used as a mask. This is called doping. The impurity is in this case phosphorus and the injection is to be made under low concentration. By this, the channel area 170 just below the lower gate electrode 42 becomes an area where no impurity is doped, and the right and left areas 175 and 176 excluding the said area become n-layer where the impurity has been lightly doped.

(h) The Mo layer 430 is made into film so that the lower gate electrode 42 should be covered completely by this film. Note that this layer will become the upper gate electrode of the semiconductor element.

As has been described earlier, the density of the material for the upper gate electrode should be higher than that for the lower gate electrode in due consideration of the necessity of perfect masking capacity at the time of the second doping.

Referring now to FIG. 13, we continue our explanation.

(i) The upper metallic layer is patterned to form the upper gate electrode 43.

(j) The second injection of impurity is made mainly with the upper gate electrode 43 used as a mask, when the phosphorus ion is used as an impurity. Needless to say, the doping quantity is far larger than that of the first one. By this, the ions are doped in high concentration into the areas of polycrystalline silicon layer except the area just below the upper gate electrode 43. In their turn, the areas 175 and 176 where the impurity has been lightly doped by the previous doping but that have not been covered by the upper gate electrode 43 come to receive yet another doping of impurity to be an area of high concentration of impurity (n+ layer), that is the source area 150 and drain area 160.

On the other hand, in these areas 175 and 176 that are covered by the upper gate electrode 43, the second ion doping does not dope any impurity, resulting in being the LDD area (n-layer) with the impurity injected under low concentration.

Thus, the LDD area 152 (n-layer) is formed between the source area 150 (n+ layer) and channel area 170, and the LDD area (n-layer) is formed between the drain area 160 (n+ layer) and channel area 170. Because on this occasion the first ion doping is carried out with the lower gate electrode 42 used as a mask, and then the second ion doping is performed with the second gate electrode 43 formed above the lower one used as the mask, two low concentration impurity areas, and the source and drain areas can be formed in a self-consistent way (inevitably with good positioning accuracy). Moreover, we can reduce the superposition of the upper gate electrode 43 with the source area 150 and that of upper gate electrode 43 with the drain area 160. By this, the parasitic capacitance may be reduced, off current lowered and the lowering of on current may be reduced as far as possible.

(k) The interlayer dielectric (SiOx) 3 is made into a film.

(l) The contact holes 95 and 96 are opened at the positions where are formed the source and drain electrodes of the interlayer dielectric 3 and gate insulator 2.

(e) Such metallic layer as aluminum is formed by sputtering method, the upper portion of the metallic layer thus formed will be patterned into specified form to constitute the source electrode 5 and drain electrode 6. Further, finally, such protective film as SiN (not shown) is formed to manufacture the TFT.

This was the case of n-channel TFT, however, the manufacture of p-channel TFT is of course possible by a similar process.

(Embodiment 2-2)

We will now explain the second embodiment in this group of inventions. This embodiment features a plating onto the lower gate electrode to form the upper gate electrode.

Figure 14:
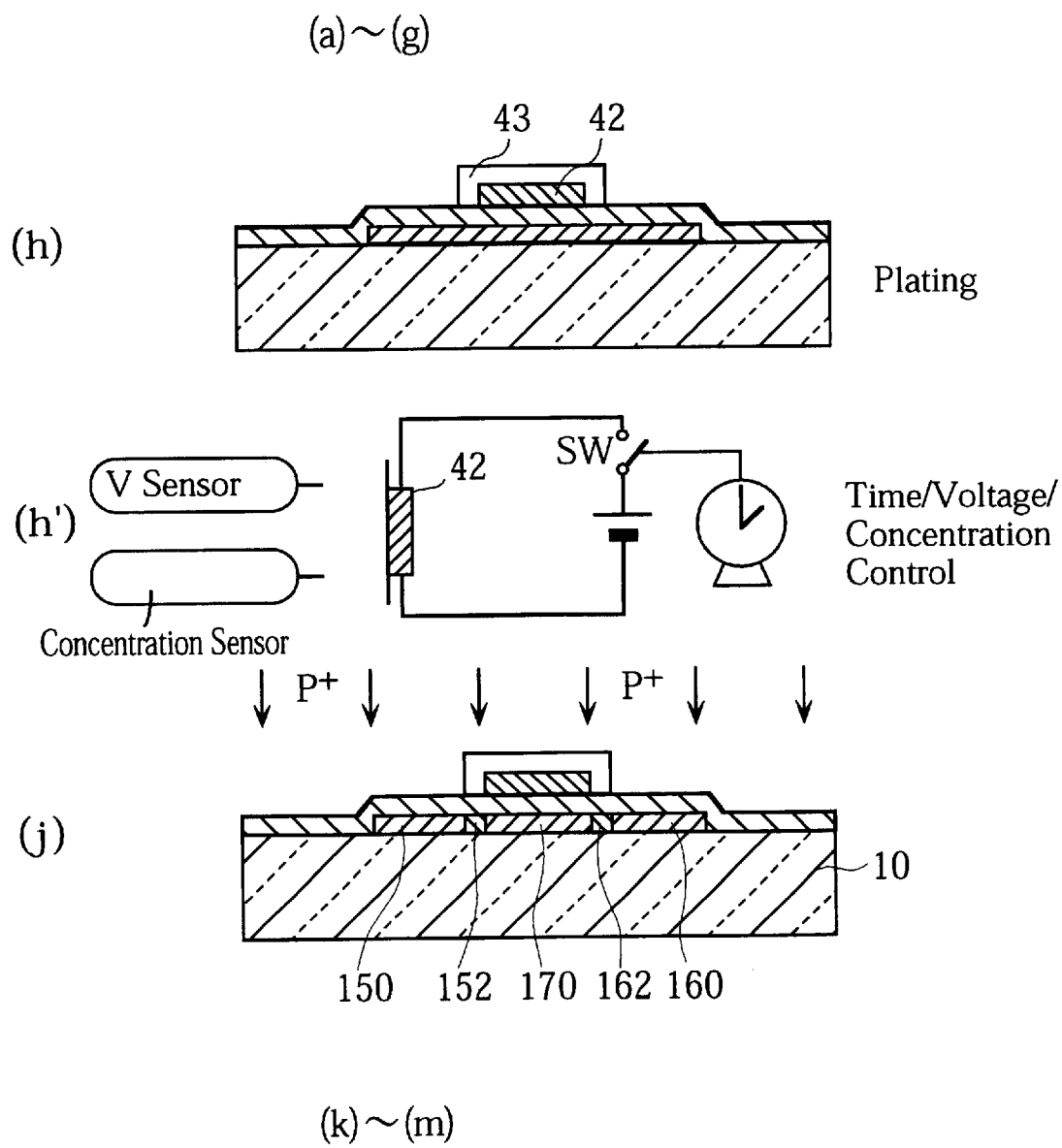
FIG. 14 indicates the drawings that show the purview of the manufacturing process of the thin film transistor according to the embodiment 2-2 by this invention.

FIG. 14 illustrates how to manufacture the thin film transistor according to this embodiment. Hereunder, we are going to describe this manufacturing method referring to this figure.

The manufacturing procedures and processing from (a) to (e) are the same as those of (a) to (g) through in FIG. 12. The material contents of the manufacturing method shall therefore be omitted here.

(h) The glass substrate as a whole is immersed into Au plating bath (not shown in figure) and an electric field is applied so that the lower gate electrode 42 may be negative. The Au layer 43 is plated so that the lower gate electrode should become the upper gate electrode. By this, the Au film 43 is naturally formed on the lateral sides of the lower gate electrode 42 according to the plating conditions. The gate electrode line (not shown) will be applied as the electric wire to which voltage is applied for plating.

Controlling the voltage and current to be applied, plating time and concentration of plating bath makes it possible to form the Au film into an exact thickness. Further, it is also easy to control such voltage/current, plating time and concentration of plating bath. From this, it results that the Au film thickness is exact in its formation position and thickness. FIG. 14(*h'*) shows the state of this plating.

(j) The second injection of impurity is to be made with the lower gate electrode 42 and the Au film plated onto this gate electrode used as mask. Note that the impurity to be doped in this case is phosphorus ion and the doping concentration is higher than that of the first injection. By this, as was the case with the previous embodiment, the polycrystalline silicon layer forms the channel area 170 just below the lower gate electrode 42, the low impurity concentration areas 152 and 162 just below the Au film plated on the lateral side of the lower gate electrode as well as the source area 150 and drain area 160 where the impurity is doped in high concentration in the area excluding said two sorts of areas.

From here on, the procedures from (k) through (m) in FIG. 13 will be carried out.

In this embodiment, the plating material for upper gate electrode is of course not limited to the silver. Namely, it suffices that the precise electrolytic plating is possible, and there is effective ion shielding against the impurity doping. Moreover, the plating is not only limited to the electrolytic one, but it may of course can be electroless plating by duly selecting the plating bath and materials.

(Embodiment 2-3)

This embodiment is no other than the thin film transistor of GOLD (gate-drain overlapped lightly doped drain) according to the previous second embodiment, from which is removed the metallic film as plated on the lower gate electrode.

Figure 15:
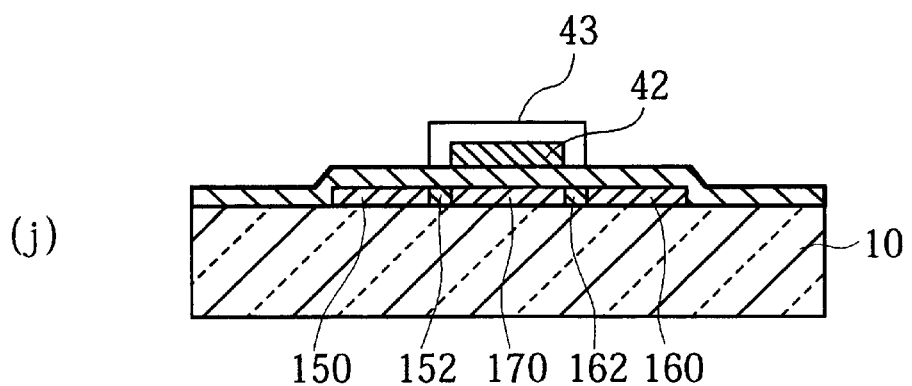
FIG. 15 indicates the drawings that show the purview of the manufacturing process of the thin film transistor according to the embodiment 2-3 by this invention.
Figure 15:
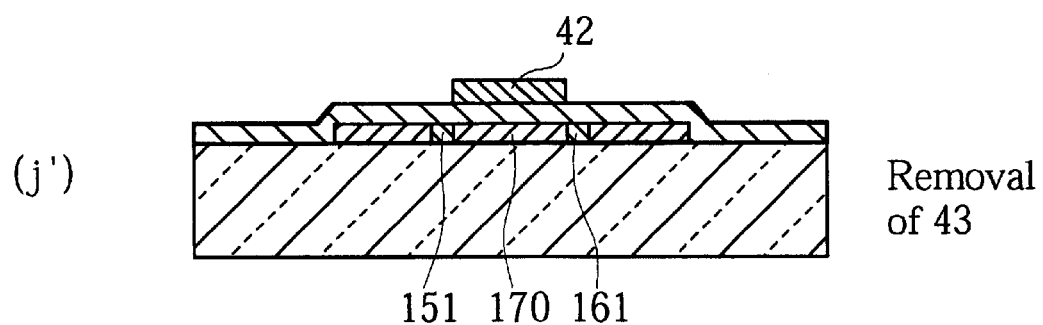

Referring now to FIG. 15 We attempt to explain how to manufacture the thin film transistor of the LDD (lightly doped drain) structure according to this embodiment.

The step (j) in this figure is the same as (j) in FIG. 14. However, the lower gate electrode is made from Au, and the upper one is made from W. (j') After injecting the impurity, W43 plated on the upper portion and lateral sides of the lower gate electrode 42 will be removed.

Then, the processes from (k) through (m) in FIG. 13 will be worked out to manufacture the thin film transistor provided with the LDD (lightly doped drain).

In this thin film transistor, only the remaining lower electrode 42 will become the gate electrode, and the polycrystalline silicon layer just below 42 has only the channel area 170, on both sides of which will be formed the low impurity concentration areas (n-layer) 151 and 161, on both sides of which formed in turn will be the source area 150 and drain area 160 respectively.

(Embodiment 2-4)

This embodiment relates to a pixel electrode that uses the thin film transistor according to the preceding 3 embodiments.

Figure 16:
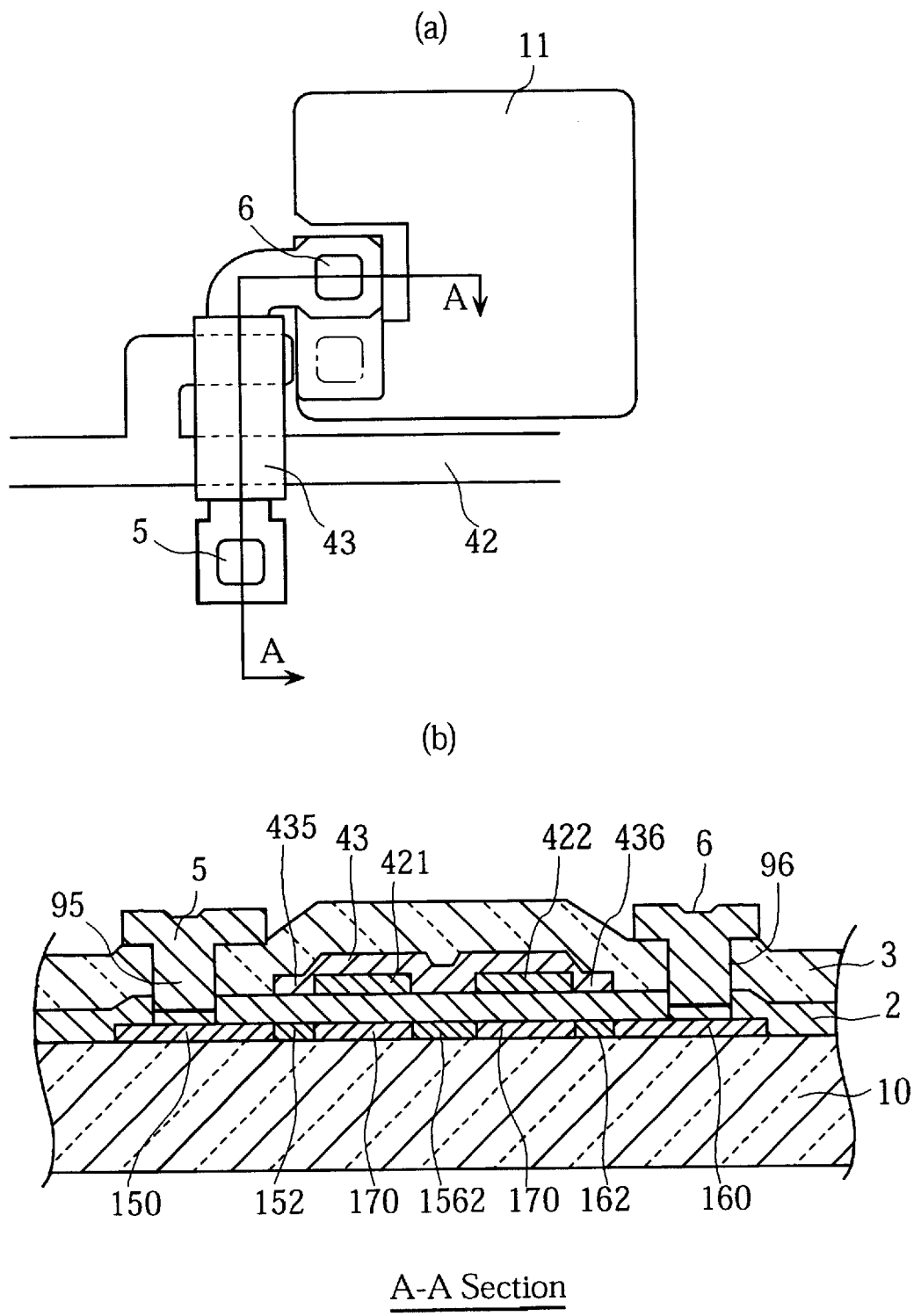
FIG. 16 indicates the drawings that show the plan and cross sectional views of the pixel TFT of the liquid crystal display panel using the thin film transistor by this invention.

FIG. 16 shows the pixel of the liquid crystal display unit according to this embodiment. FIG. 16(*a*) shows the plan view, while (b) represents the A-A section of (a). In these figures the numeral 10 symbolizes the glass substrate, while 2 and 421 indicate respectively the gate insulator and the first lower gate electrode. The numerals 422, 3, 5, 6, and 11 represent, in this sequential order, the second lower gate electrode, interlayer dielectric, source electrode, drain electrode, and pixel electrode.

The lower gate electrodes are formed over plural areas on the polycrystalline silicon layer, and all the upper face of these lower gate electrodes 421 and 422 is covered by the upper gate electrode 43.

By this gate electrode configuration, the polycrystalline silicon layer forms the two channel areas 170 just below the two lower gate electrodes 421 and 422, the source area 150 (n+ layer) with high impurity concentration, and the drain area (n+ layer) 160 as well as the low drain doping (impurity concentration) areas (LDD areas: n-layer) 152, 162, and 1562 just below the portion 435 where the lateral portions of the two lower gate electrodes and the upper gate electrode 43 jut out.

Such a configuration allows for reducing the parasitic capacitance of the pixel TFT 11 and off current, and at the same time suppresses the reduction in on-current as far as possible.

Figure 17:
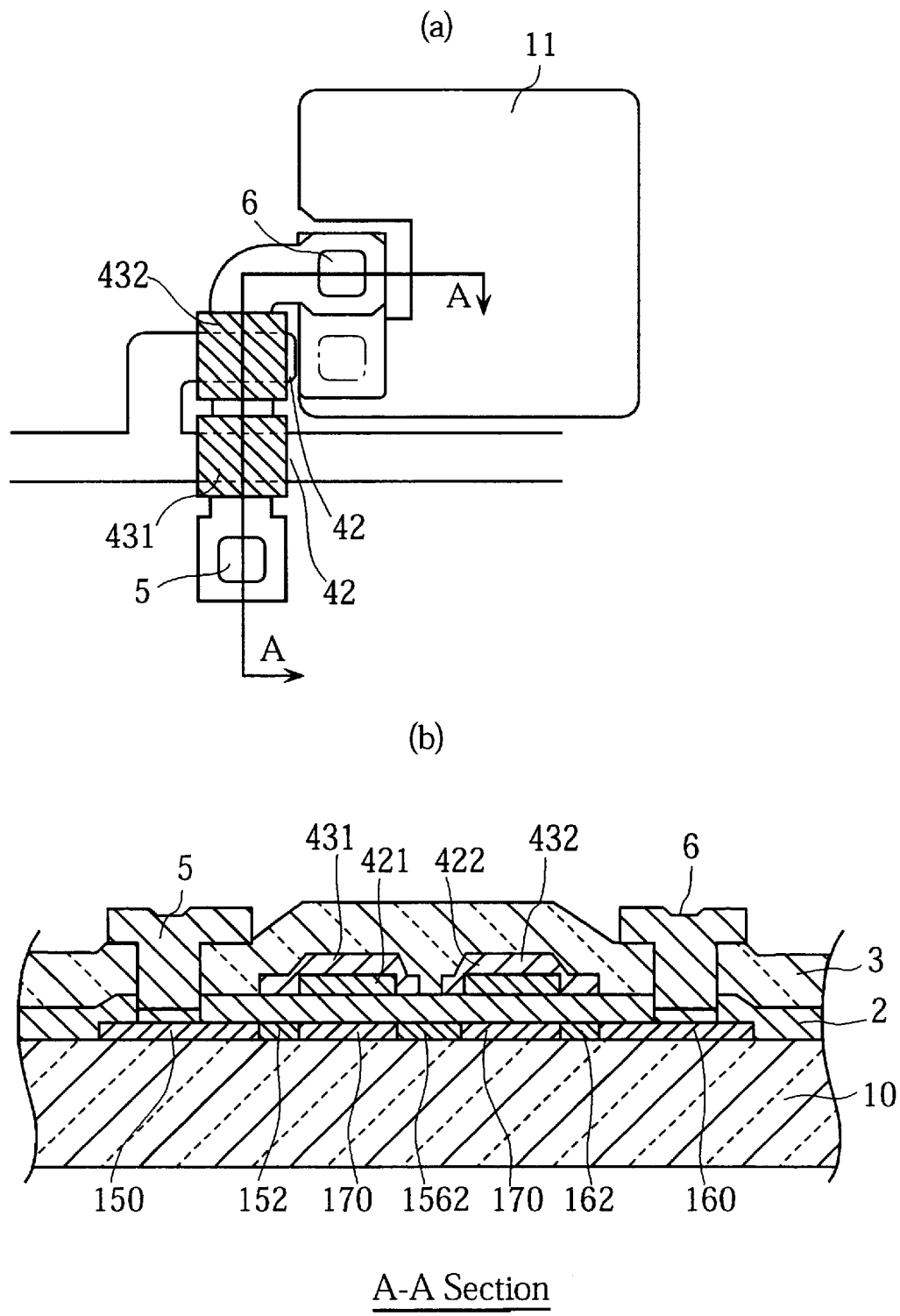
FIG. 17 indicates the drawings that show the plan and cross sectional views of other pixel TFT of the liquid crystal display panel using the thin film transistor by this invention.

FIG. 17 show the pixel TFT of another configuration.

In this figure too, (a) represents the plan view of the pixel TFT, while (b) gives its A-A section.

In this pixel TFT, the upper gate electrodes 431 and 432 have been so formed that they should cover the respective upper faces of the two lower gate electrodes 42 that run across the plural areas of the polycrystalline silicon layer.

Such a configuration may also allow for reducing the parasitic capacitance of the pixel TFT and off current, and at the same time suppressing as far as possible the reduction in on-current.

(Embodiment 2-5)

This embodiment is characterized in that the length in channel direction is greater of the lower gate electrode than that of the upper gate electrode.

Figure 18:
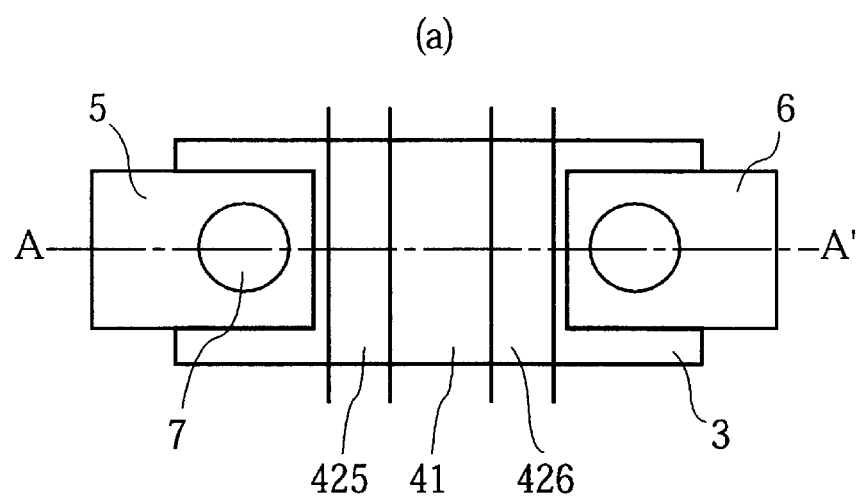
FIG. 18 indicates the drawings that show schematically the cross section of the TFT according to the embodiment 2-5 of this invention.
Figure 18:
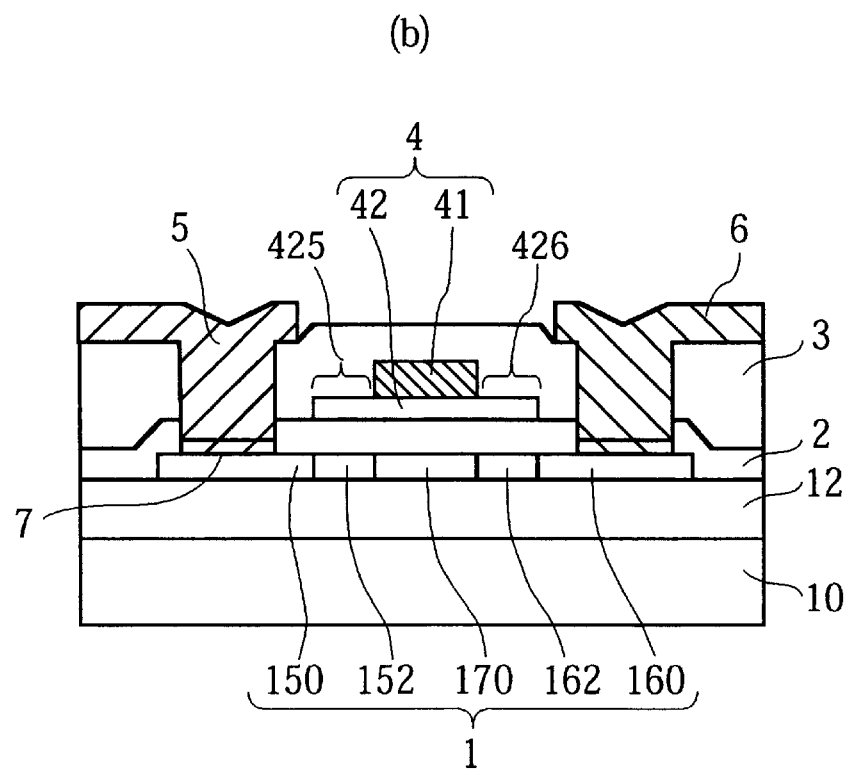

FIG. 18 schematically show the plan view (a) of the thin film transistor according to this embodiment and the cross sectional view (b) of the same, and note that (b) is the A-A section of (a).

This TFT is generally the same in basic configuration as that of the previous embodiment 2-1 shown in FIG. 13 and others. It features however that in the gate electrode 4 the lower portion 42 is greater in channel direction length than that of upper one. Due to this, the lower gate electrode 42 has protrusions 425 and 426 on the sides of the source electrode 5 and drain electrode 6 on both ends of the upper gate electrode 41. Since the impurity has been injected from the upper face of the substrate with this electrode used as a mask, the p-Si film of LDD construction is formed under the electrode.

The numeral 170 in this figure represents a channel area where no impurity has been injected because it is situated beneath the upper and lower electrodes. The numerals 152 and 162 are the LDD areas where the impurity has been injected a little since the protrusions 425 and 426 of the lower gate electrode only become the mask. The numerals 150 and 160 indicate the source and drain areas where much impurity has been injected without the mask.

Figure 19:
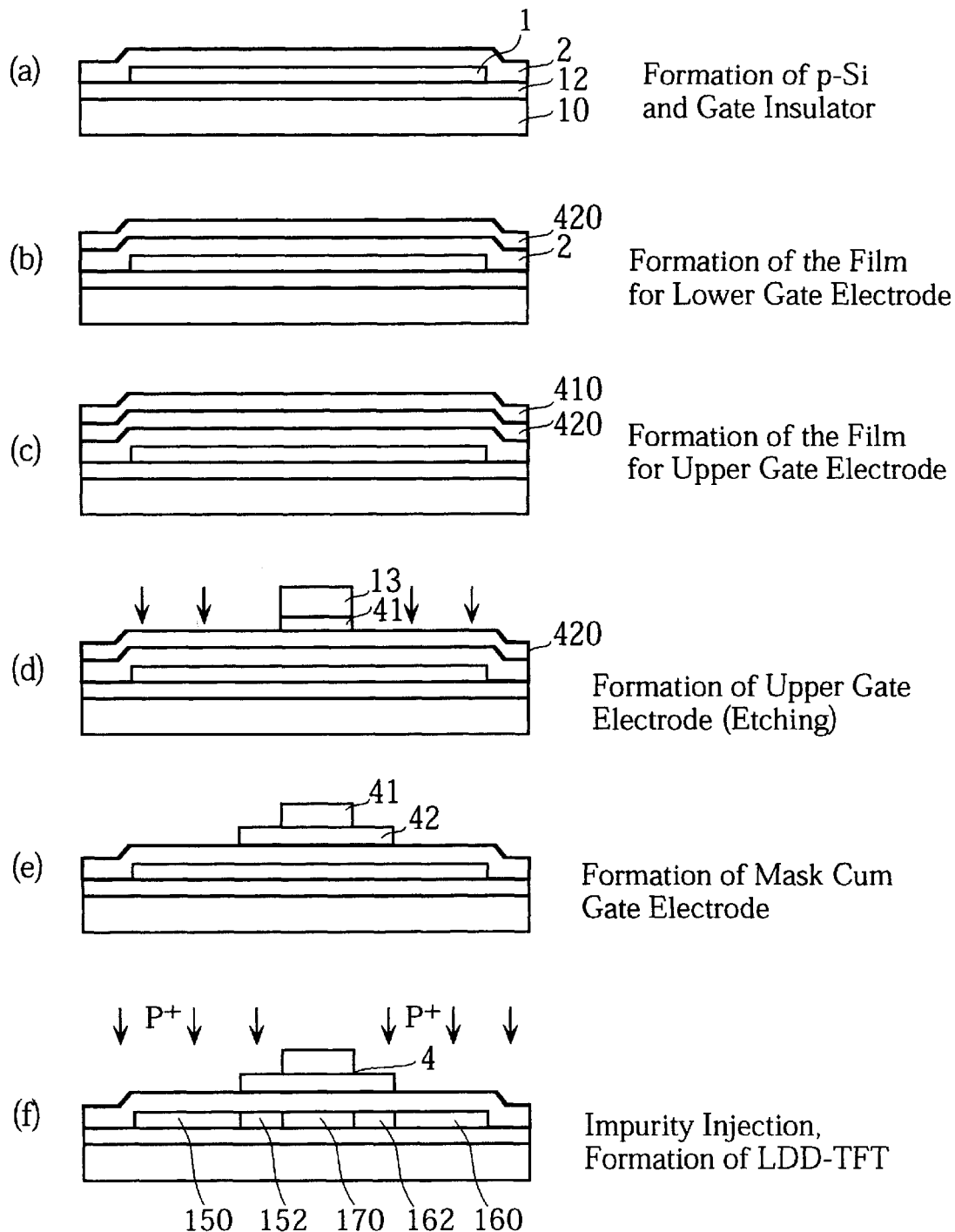
FIG. 19 indicates the drawings that show schematically the manufacturing method of the TFT according to said embodiment.

Referring to FIG. 19, we will explain how to manufacture this thin film transistor.

(a) Accumulated on the glass substrate 10 was an undercoat $SiO_2$ film 12 of the order of 4000 Å in thickness in order to prevent the diffusion of the substance in the glass substrate into the semiconductor layer when annealing the a-Si. And, accumulated on this film was an amorphous silicon film 1 of the order of 500 Å in thickness by the plasma CVD or reduced pressure CVD method.

Then, laser annealing using excimer laser of 308 nm in wavelength melted and recrystalized (polycrysllization) the a-Si film into polysilicon film.

Further, the specified area of the p-Si film was worked into island form to shape the TFT. This is called patterning.

Formed over all the surface of the substrate was the gate insulator 2 so as to cover the patterned p-Si film. More concretely, the plasma CVD method with TEOS as material gas used $SiO_2$ film accumulated into about 1000 Å of thickness. Up to this stage, therefore, this embodiment is the same as the foregoing embodiments.

(b) The upper gate electrode film 420 was made to accumulate on the $SiO_2$ film. Although this embodiment used the ITO film as shaped by sputtering method (film thickness: about 500 Å), we may safely use such metallic films as aluminum, tantalum, titanium, molybdenum, tungsten, and zirconium, their alloy-based films, and such conductive oxide films as ITO. In these cases, however, the optimal film thickness should be determined individually in due consideration of the doping in the LDD area using this lower electrode as mask in the subsequent process. Further, since the stopping power of the ions (capacity to interfere with the passing of accelerated ions) to be doped depends on the film material, the optimal film thickness is naturally dependent also on the material composition of the film.

(c) Formed on the lower gate electrode film 420 was a tantalum film of 2000 Å in thickness as the upper electrode film 410 by sputtering method.

Note that the material of this upper electrode film should be chosen in consideration of the possible selective etching with the lower electrode film on the downstream process.

(d) The tantalum film 410 of the upper gate electrode was patterned into a specified shape to form the upper gate electrode 41. A photo resist was used in the patterning so that the resist 13 may exist only on the portion where the tantalum film is to be left, and any unnecessary portion of tantalum film was removed by etching.

(e) The ITO film was patterned into a specified form to shape the lower gate electrode 42.

(f) Phosphorus ion was doped as impurity from above the gate electrode 4 with stages in its upper and lower portions using this electrode as a mask, which gave the LDD TFT of such configuration as shown in FIG. 18.

Since the subsequent processes are the same with those of the embodiment 2-1, they are omitted here.

Although the foregoing example is for n-channel type TFT, the p-channel type TFT can also be manufactured in the same fashion.

Figure 20:
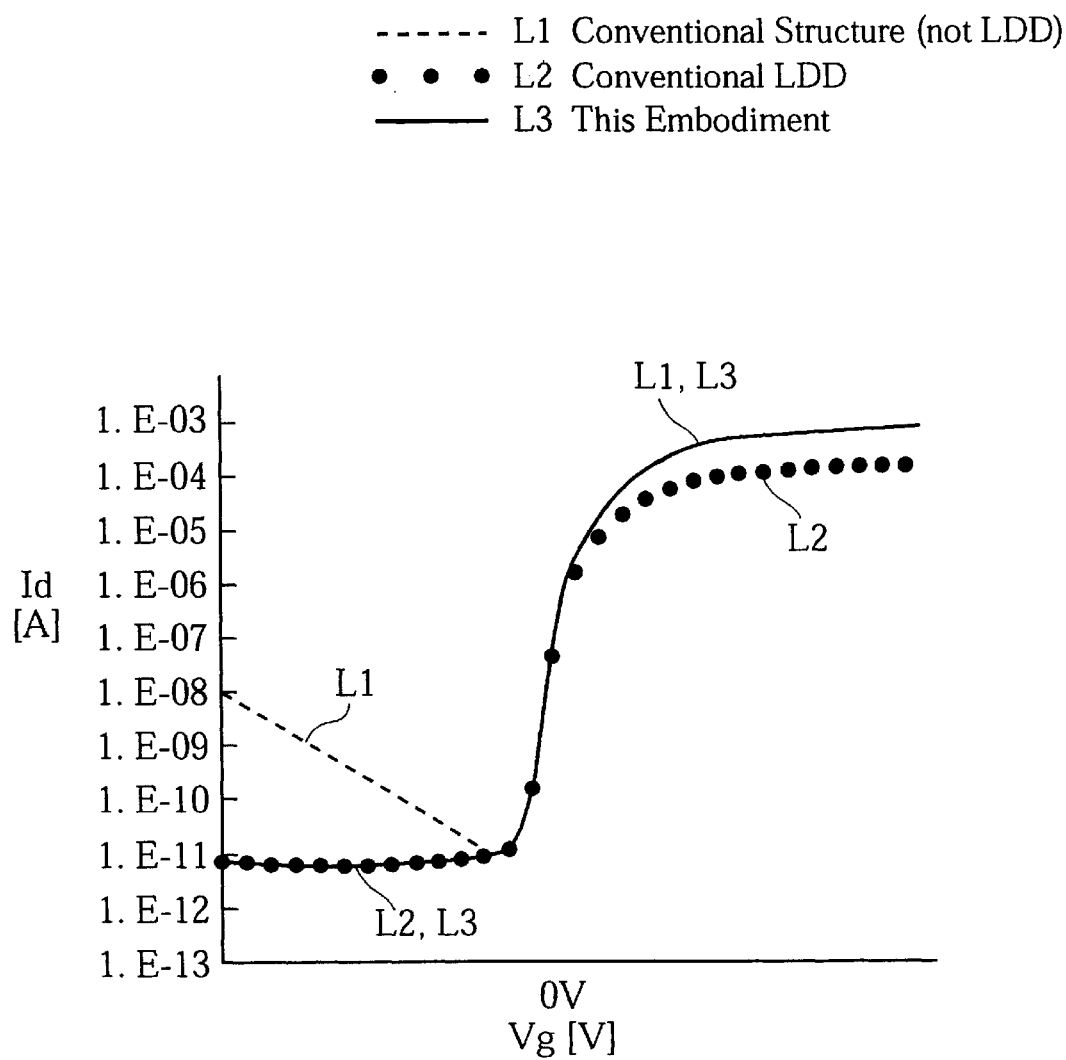
FIG. 20 indicates a drawing that shows diagrammatically the voltage-current characteristics of the TFT according to said embodiment.

FIG. 20 shows diagrammatically the voltage/current characteristics of the TFT as manufactured by the above-mentioned method. In this figure, the line L1 represents the characteristics of the TFT of conventional configuration (no LDD construction), while the line L2 indicates the characteristics of conventional LDD configuration. The line L3 symbolizes the voltage/current characteristics of the TFT as manufactured according to this embodiment. As is clear from the lines L1 and L2, the TFT of conventional structure may decrease the off-current by adopting the LDD structure. However, this results to reduce the on-current because of the TFT being changed to LDD structure. On the other hand, in this embodiment, it is well understood that it can reduce the off current, but does not allow the on-current to be decreased. In this embodiment therefore the on-current does not lower down because the LDD area with high resistance is situated below the gate electrode. Thus, the electrons as a carrier accumulate both in the LDD and channel areas in the saturated area and unsaturated area.

(Embodiment 2-6)
(Configuration of TFT Array)

Figure 21:
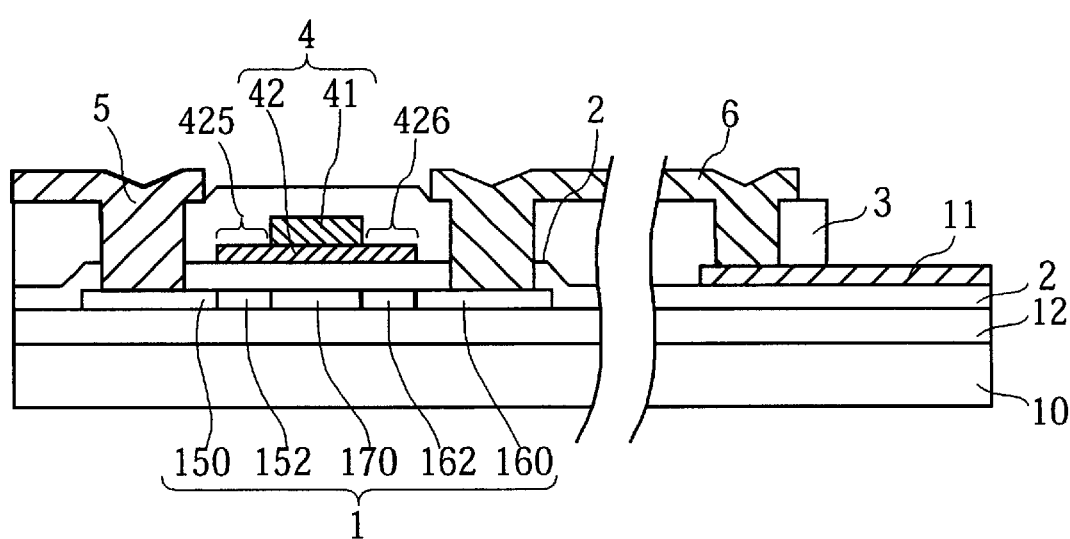
FIG. 21 indicates a drawing that shows schematically the pixel electrode using the TFT array according to said embodiment.

FIG. 21 shows schematically the cross section of the pixel electrode area where the TFT array according to this embodiment is used as the TFT for pixel switching of liquid crystal display unit. In fact they are arranged on the glass substrate in several vertical and horizontal rows and several columns, that is into matrix form. In this figure, the TFT for switching is manufactured in n-channel type.

In the TFT for switching, the basic structure of which is the same with that of what is shown in FIGS. 16 and 17, laminated in the sequential order on the glass substrate 10 are the polycrystalline semiconductor film 1 consisting of the polysilicons gate insulator 2 composed of $SiO_2$, the gate electrode 4 and the interlayer dielectric 3 composed of $SiO_2$.

In this case, the gate electrode 4 is composed of the lower electrode 42 consisting of a transparent conductive film, and the upper electrode 41 consisting of the metal fixed in narrower width on the upper face of the electrode 42. And, the polycrystalline semiconductor film 1 situated through and under the interlayer dielectric 2 consists of the channel area 170 just below the upper gate electrode 41, a low doping drain (LDD) areas (N-layer) 152 and 162 just below the protrusion portions 425 and 426 of the gate electrode below the both sides thereof as well as of the source area (N+ layer) 150 with high impurity concentration and the drain area (N+layer) 160.

Further, the pixel area is provided with the pixel electrode 11 consisting of the transparent conductive film as patterned into specified geometry, which is connected with the drain electrode 6 through the contact holes.

The lower electrode 42 and the pixel electrode 11 are made of the same transparent conductive film. That is, the transparent conductive film in the same layer is patterned, a part of which is used as the lower gate electrode and another as the pixel electrode 11. This allows us to omit one process than those in which both films are shaped individually and separately.

Figure 22:
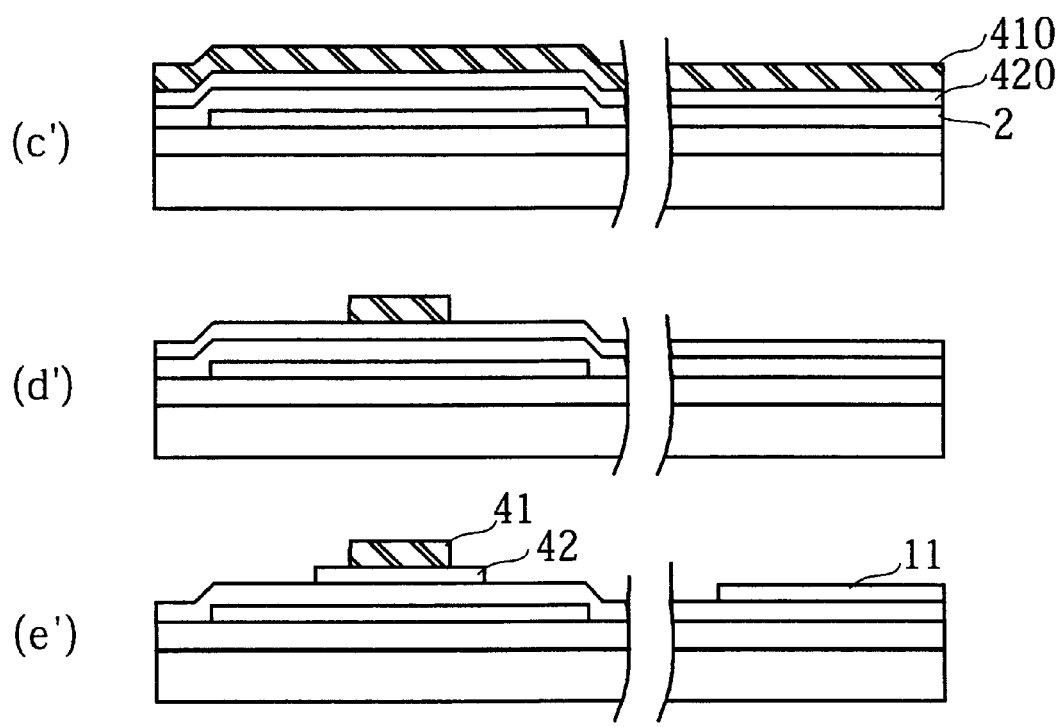
FIG. 22 indicates the drawings that show schematically the purview of the manufacturing method of the pixel electrode using the TFT array according to said embodiment.

Referring now to FIG. 22 we will explain how to manufacture this thin film transistor.

This figure, which shows schematically the manufacturing process of this TFT array, is basically the same as FIG. 9. Note that the right parts of the figure show the pixel portions.

What follows is the explanation of the portions which are different from FIG. 19.

(c') The lower electrode film and the pixel electrode film are to be molded at the same time.

Accumulated on the upper portion of the gate insulator 2 were the lower gate electrode and the transparent conductive film 420 for forming the pixel electrode film, which was then shaped into film by sputtering. The thickness of the ITO film is about 500 Å. Note that one may use some conductive oxide films other than ITO as the transparent conductive film. Further, formed on the transparent conductive film was the upper gate electrode film 410.

(d') Patterning formed the upper gate electrode 41.

(e') Patterning also formed the lower gate electrode 42 and pixel electrode 11.

Then, the LDD type TFT was manufactured in the process similar to that of other embodiments.

Although in this embodiment, the TFT for pixel switching was fabricated on the glass substrate, one may manufacture, on the glass substrate, a liquid crystal panel drive circuit by making C-MOS inverter circuit consisting of similar TFT, when the boron ions, for instance, may be injected as the impurities to manufacture the p-channel type TFT.

(Embodiment 2-7)

The thin film transistor itself according to this embodiment is in principle the same as what is shown in FIGS. 18(*a*) and (*b*).

Figure 23:
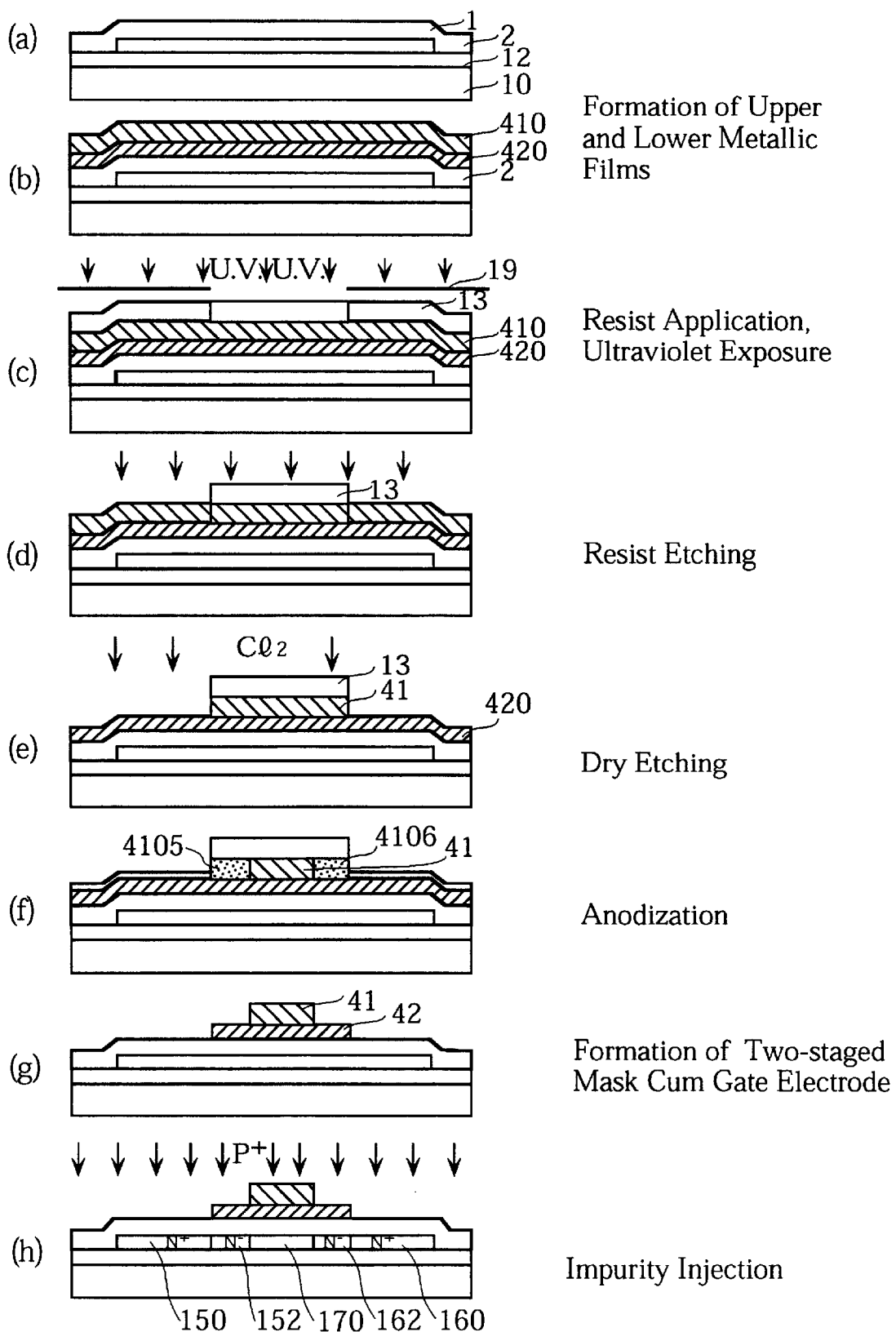
FIG. 23 indicates the drawings that show schematically the manufacturing method of the TFT according to the embodiment 2-7 by this invention.

FIG. 23 depicts schematically how to manufacture the thin film transistor according to this embodiment. Referring to these figures, we attempt to describe the manufacturing method of the TFT by this embodiment.

(a) Accumulated first on the glass substrate 10 was an undercoat $SiO_2$ film 12 of the order of 3000 to 7000 Å in thickness in order to prevent the elution of the impurities from the glass. Accumulated then on this film was an amorphous silicon film to mold the thin film transistor into an island-like form.

Further, the laser annealing using excimer laser polycrystalized the amorphous silicon film to give the polysilicon film 1. Further, the plasma CVD method using TEOS as material gas allowed us to shape the $SiO_2$ film into about 1000 Å in thickness as the gate insulator 2. This status is shown in (a) of this figure. The process up to this stage is the same with that in the conventional embodiments.

(b) After forming 200 nm of tantalum into film as the film 420 for molding the lower gate electrode, an aluminum alloy, 150 nm in thickness, was shaped into film for the film 410 for molding the upper gate electrode.

(c) The resist film 13 of photosetting resin intended for forming the upper gate electrode was molded on the aluminum alloy film 410, and exposed to the irradiation of the ultraviolet ray (UV) through the mask 14.

(d) The resist film 13 was left only on the upper face of the upper gate electrode 41.

(e) The unnecessary portion of the upper gate electrode film was etched to form the upper gate electrode 41. Note that this etching was dry etching using chlorine-based gas that allows for a higher accuracy than the wet one.

(f) Only the lateral sides of the aluminum alloy of the upper gate electrode film was anodized leaving the resist 13 on the upper face of the upper gate electrode 41 to form the anodized oxide films 4105 and 4106 on the lateral sides. 0.1 M aqueous solution of oxalic acid, and the like was used as anodization bath. The oxide film of the order of 500 nm in width can be formed from both ends of the gate under 25V of oxidation voltage for about 30 minutes. Another oxide film of 30 to 50 nm was formed also on the surface of the lower layer gate electrode film.

(g) After removing the resist, the unnecessary portion of the lower gate electrode film and the anodized film on its upper surface were removed self-consistently by chemical dry etching with the anodized film used as mask. Then, only the anodized film covering the lateral faces of the upper gate electrode was removed with a mixture of aqueous HF—$HNO_3$ containing ethylene glycol. This led to the formation of the two-staged gate electrode whose lower portion juts somewhat out toward the source electrode and drain electrode sides.

(h) Phosphorus ion was injected as impurity from above the upper gate electrode 41 and lower gate electrode 42 by ion doping method using said electrodes as mask. Because, by this, most of phosphorus ions are captured by the lower gate electrode in the areas 152 and 162 covered by the lower gate electrode 42, only low concentration of phosphorus ions are injected, and this caused the LDD area (N-layer) to be made. The areas 150 and 160 that are not covered by the lower electrode 42 become N+ layer where the phosphorus ions are injected under high concentration. No phosphorus ion is injected into the area 170 covered by the upper gate electrode 41 and lower gate electrode, which led to natural formation of LDD type TFT.

The $SiO_2$ film 2 of 400 nm in thickness was accumulated as interlayer dielectric. Then, contact holes were opened in the interlayer dielectric and gate insulator. Sputtering method allowed for accumulating the aluminum film with good coverage over the contact hole area to pattern it into a specified geometry to form the source and drain electrodes. However, since they are the same with those of earlier embodiments, their drawings and the like are omitted here.

(Embodiment 2-8)

This embodiment simplifies the forming method of gate electrodes in the earlier embodiments.

Figure 24:
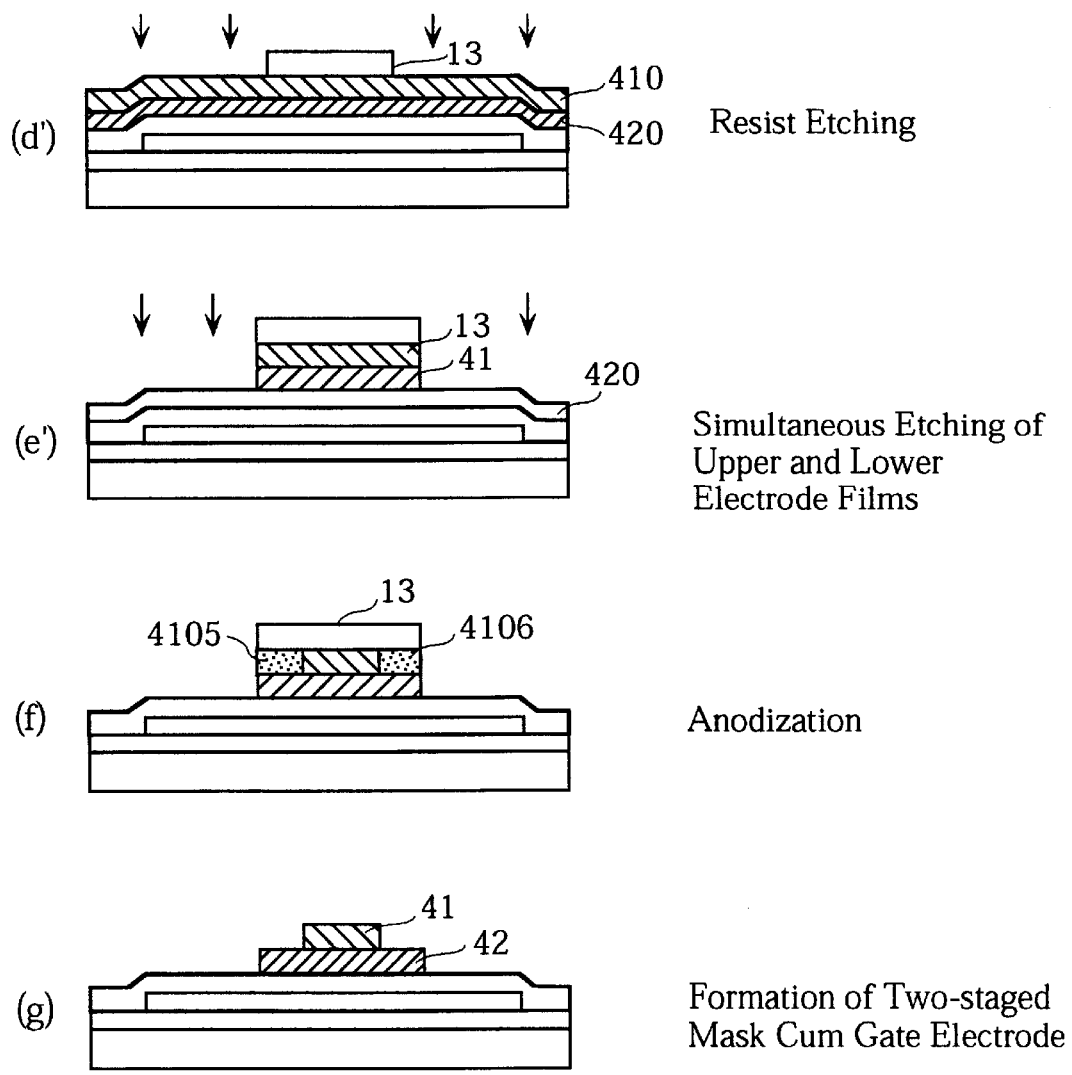
FIG. 24 indicates the drawings that show schematically the manufacturing method of the TFT according to the embodiment 2-8 by this invention.

Referring now to FIG. 24 we will explain this embodiment.

(d') This embodiment is the same with earlier ones up to the accumulation, on the substrate, of the semiconductor layer gate insulator and upper and lower electrode films 410 and 420, application of the resist 13 onto their upper portion and the patterning of the resist by exposure. Note that the film for forming the lower gate electrode is tantalum of 200 nm in thickness, while the film for forming the upper gate electrode is aluminum alloy of 150 nm in thickness.

(e') The upper and lower gate electrode films were etched with fluorine-based gas into the upper gate electrode 41 and lower gate electrode 42. Note that under these conditions there does not arise any protrusion between the upper and lower electrodes.

(f) With the resist 13 left as such, only the lateral sides of the upper gate electrode and lower gate electrode were anodized to form the anodized films 4105 and 4106. The anodic oxidation bath used was 0.1 M aqueous solution of oxalic acid among others. Under 15 V of voltage, 30 nm of oxide film was formed on the lateral sides of the lower gate electrode within about one hour, while the oxide film of the order of 1 $\mu$m was formed on the lateral sides of the upper gate electrode.

(g) Only the lateral sides of the upper gate electrode were oxidized with 0.1 M solution of ethylene glycol tartrate and the like under 15 v of oxidation voltage for about 5 minutes to adjust the width of the gate electrode.

Thereafter, the LDD-TFT was formed in the same manner as in the earlier embodiments.

Figure 25:
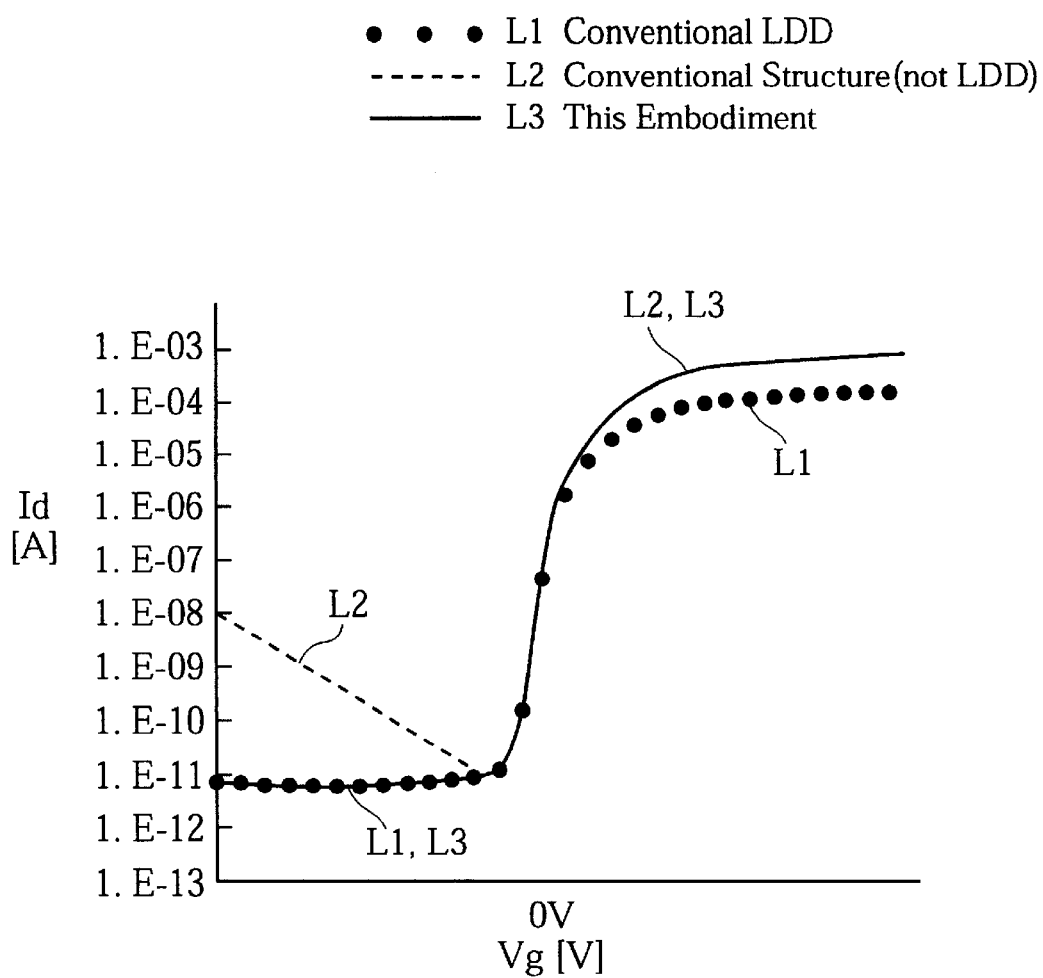
FIG. 25 indicates a drawing that shows diagrammatically the TFT voltage-current characteristics of said embodiment.

FIG. 25 shows diagrammatically the voltage/current characteristics of the TFT as manufactured by the foregoing method. In this figure, the line L1 represents the characteristics of the TFT of the conventional LDD structure, while the line L2 gives the characteristics of the conventional structure (non-LDD configuration). The line L3 represents the voltage-current characteristics of the TFT by this embodiment. As is clear from the lines L1 and L2, the off current may be reduced by rendering the TFT of conventional structure into the LDD configuration. However, rendering into the LDD structure has lowered down the off-current.

In the case of this embodiment, on the other hand, the off-current may be reduced, but the on-current is prevented from lowering down. That is, this embodiment does not allow the on-current to be reduced, because the electrons as a carrier are accumulated both in the LDD area and channel area in the saturated and unsaturated areas. Namely, the high resistance LDD area finds itself just below the gate electrode in the TFT according to this embodiment.

(Embodiment 2-9)

Figure 26:
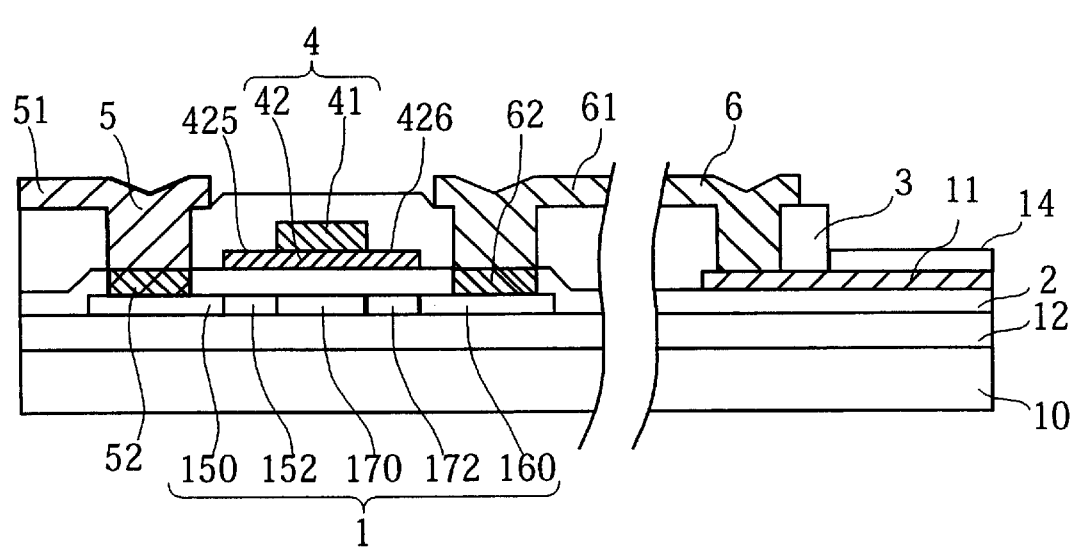
FIG. 26 indicates a drawing that shows schematically the TFT array according to the embodiment 2-9 by this invention.

FIG. 26 shows up the liquid crystal display unit that uses the TFT according to this embodiment. The TFT for pixel switching, the cross section of the pixel electrode area as well as the TFT and pixel for switching according to this embodiment are in principle the same with those shown in FIG. 21.

Provided the lower portions 52 and 62 of the source and drain electrodes are made of titanium where the electric resistance reduces at the interface due to the formation of silicon and silicide, while the upper portions 51 and 61 are made from the aluminum with little electric resistance. Further, the display unit being of the reflection type, the pixel electrode 11 is of aluminum made. These are the points where this embodiment differs from the earlier ones. Under the actual use conditions, however, the source electrode 5 and drain electrode 6 as well as the alignment layer both for the insulation of pixel electrode 11 and orientation of the liquid crystal are formed in their upper portions.

Figure 27:
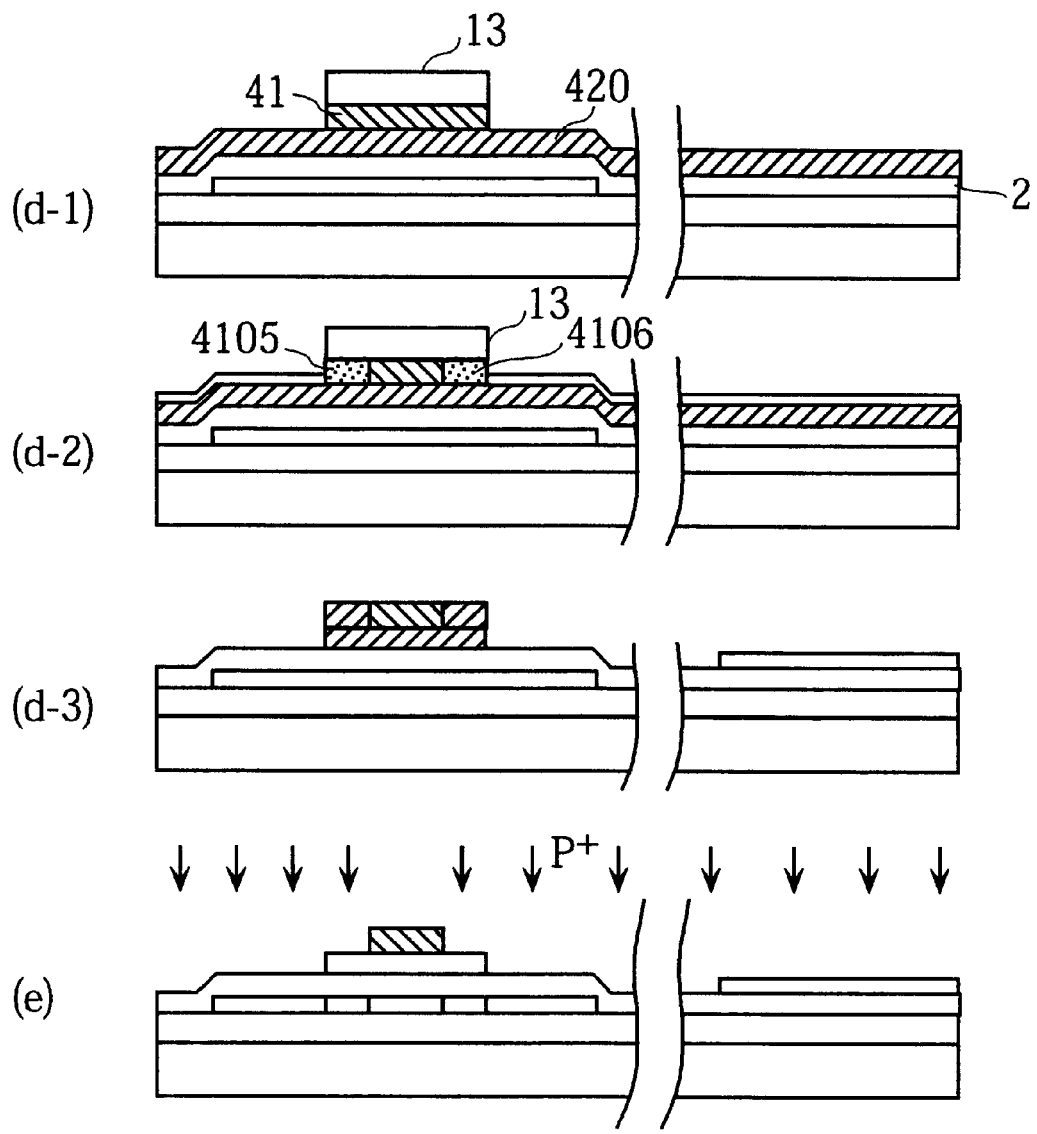
FIG. 27 indicates the drawings that show schematically the manufacturing method of the TFT array according to said embodiment.

Referring now to FIG. 27, we will attempt to describe how to manufacture this liquid crystal display unit. Since generally they are the same as those shown in FIG. 23 and the like, we prefer to explain only the purviews.

It goes the same up to (c) where the lower gate electrode film 420 and the upper gate electrode film 410 are formed.

(d-1) The upper gate electrode 41 is patterned into form with the resist 13.

(d-2) The lateral sides of the upper gate electrode 41 are anodized using also the resist 13.

(d-3) The upper gate electrode 41 having the anodized portions 4105 and 4106 and the resist 13 are used with etching stopper to form the lower gate electrode 42 having protrusions.

(e) Impurities are injected with the upper and lower gate electrodes used as the injection mask. In this embodiment as well, the liquid crystal panel drive circuit may be manufactured on the glass substrate preparing the C-MOS inverter circuit consisting of similar TFT. Although it is in this case necessary to fabricate the p-channel type TFT, one can manufacture the p-channel type TFT by injecting, for instance, boron ions in the process similar to the aforesaid manufacturing method.

(Embodiment 2-10)

In this embodiment, only one of the source area side and drain area side has been made into the LDD structure.

Figure 28:
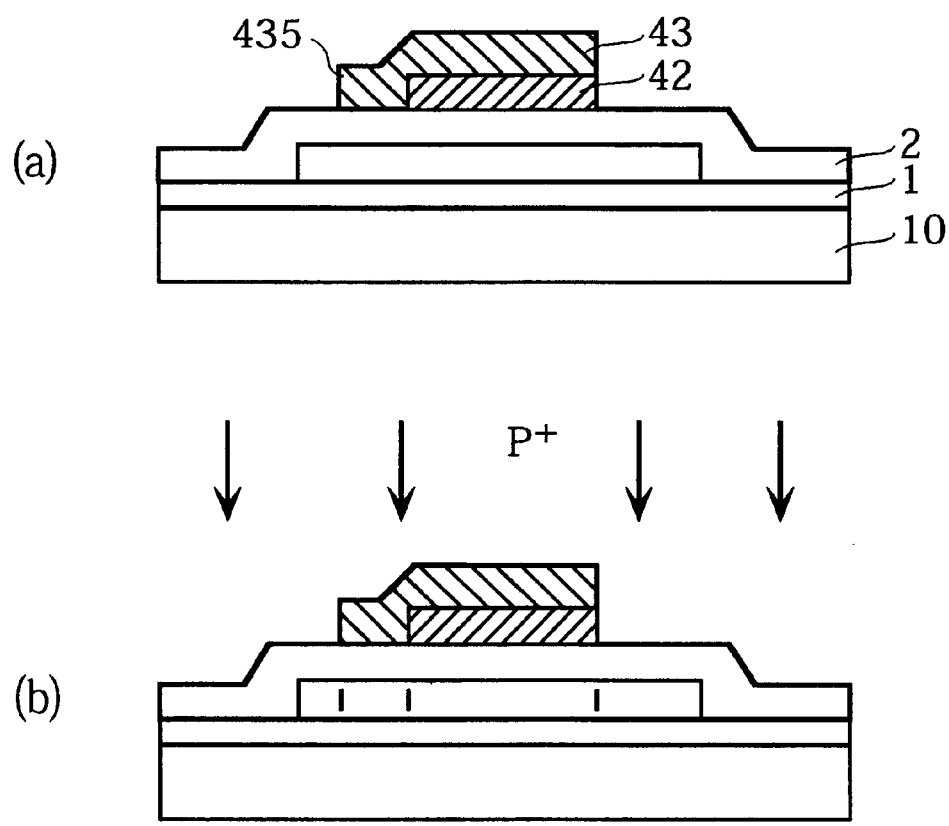
FIG. 28 indicates the drawings that show schematically the manufacturing method of the TFT array according to the embodiment 2-10 by this invention.

There are some cases where the semiconductor element of the pixel portion of a liquid crystal display unit needs not be of LDD structure on the both sides. If it is LDD only on one side, the stray capacitance of the semiconductor element reduces. Depending upon the use, this may be preferable in some cases. This embodiment, therefore, decided to adopt, as shown in FIG. 28(a), a configuration where the photolithography juts out, by about 1 to 2 μm, the upper gate electrode 43 only toward the source electrode side of the gate electrode in the lower portion 42. The impurity ions are injected from the upper face of the substrate under this as shown in FIG. 28(b). This allows us to have the semiconductor element of LDD configuration only on one side.

(Embodiment 2-11)

This embodiment makes use of the oxidation of the gate electrode metal. Except such metals that may become passive or magnesium that may explosively fires in some cases, many such metals as iron do usually oxide themselves at a certain rate under constant conditions of temperature and pressure (for example, the throw-away pocket heater utilizes this phenomenon or law). Further, in general, the metals, when oxidized, reduce its density and accordingly increase its volume as much.

Because of this, the gate electrode portion that expands into the channel direction due to the metal oxidation reduces its effect as mask onto the impurity ions to be injected. This embodiment makes use of these phenomena.

Figure 29:
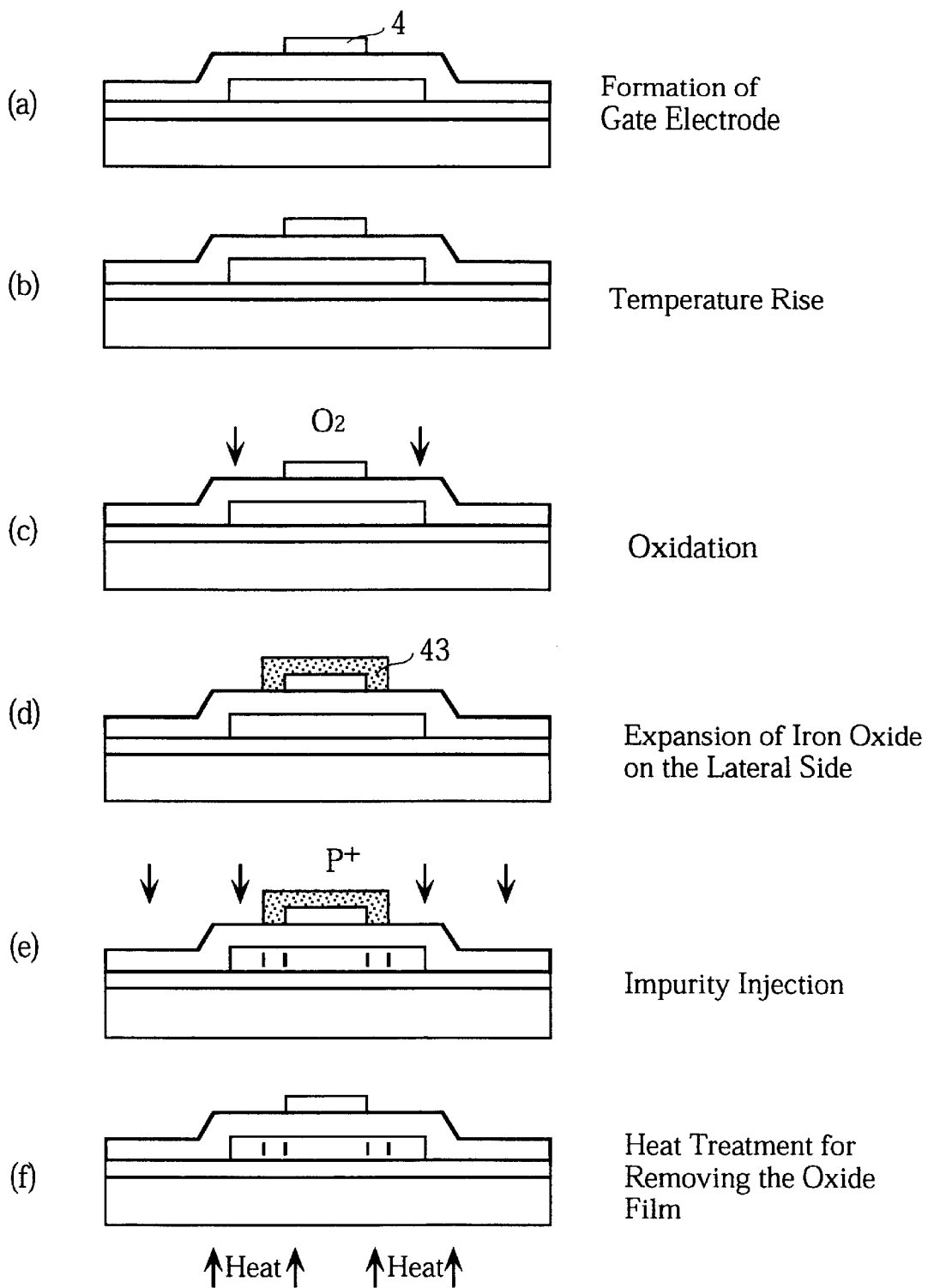
FIG. 29 indicates the drawings that show schematically the manufacturing method of the TFT array according to the embodiment 2-11 by this invention.

Referring now to FIG. 29, we will explain this embodiment. (a) A gate electrode 4 is made of iron and the like.

(b) The temperature of the substrate as a whole is raised to a certain extent under vacuum.

(c) Provided under a low pressure will be the air containing the oxygen whose quantity is determined in terms of the oxidation volume of the iron used in the gate electrode. The reason why the low pressure is used here is to prevent any local oxidation. So the oxygen as diluted by argon will do.

(d) The upper face and lateral faces of the gate electrode being oxidized to a certain amount, the oxidized metal film of the order of 0.5 μm in thickness will be formed as the upper gate electrode 43 (more precisely, only as the mask for upper injection). All along with the formation of this oxidized metal film, the oxidized metal film goes protruding toward the source electrode and drain electrode sides of the gate electrode.

(e) Impurity is injected under this condition from the upper face of the substrate.

(f) The uneven injection of impurities in the LDD area due to uneven oxidized metal particles is made up for by the heat treatment serving, as occasion arises, also for the removal of oxidized film, expulsion of hydrogen and the coupling of the dangling bonds.

Hereafter, the LDD type TFT is manufactured according to the procedures similar to earlier embodiments.

Although the iron has been adopted as the gate metal material in this embodiment, aluminum, chromium or their alloys will do. Although there are metals or alloys that may become passive, the thickness of the oxidized film becomes constant by itself. Further, depending on some cases, it would often be unnecessary to remove the oxide.

Further, in the case where an iron is used, an aluminum layer may be provided on the upper face of the iron after injection of impurities.

Furthermore, the gate electrode may be formed with such high density metal as W in its upper part and with such low resistance metal as aluminum in its lower portion, and they may be oxidized at the same time or separately with some liquid or electricity. In this case, the high density metal such as W in the upper part hinders the penetration of hydrogen, and the low resistance metal such as aluminum in the lower part provides a low resistance value. If, in this case, the oxidized film is removed after injecting impurities, the LDD type TFT may be obtained in place of the GOLD structure.
(Third Group of Inventions)
(Embodiment 3-1)

In this embodiment, the gate insulator except the lower portion of the gate electrode is removed once prior to the injection of impurities intended for forming the LDD type TFT as in the foregoing first and second groups of the inventions.

That is, if there exists the gate insulator, the acceleration voltage at the time of impurity injection must be raised as much accordingly, but this will result in excessively accelerating the hydrogen for diluting the impurity, which will penetrate into the heavy gate electrode, exerting an adverse effect even on the semiconductor in the channel area beneath it.

Further, if the impurities are scattered in horizontal direction within the gate insulator, the delimitation between the channel area and LDD area will become ambiguous. In its turn, it is not deniable that some inconvenience may arise depending on the use in a small semiconductor element such as its channel area of approximately 1 μm and the LDD area 0.2 μm.

Further, it being difficult to have a perfectly even thickness of the gate insulator, it may be counted as one of the hindrances to the even injection of impurities irrespective of the high concentration area and LDD area.

In this embodiment, therefore, the gate insulator except the portion just beneath the gate electrode is removed beforehand at the time of impurity injection.

Figure 30:
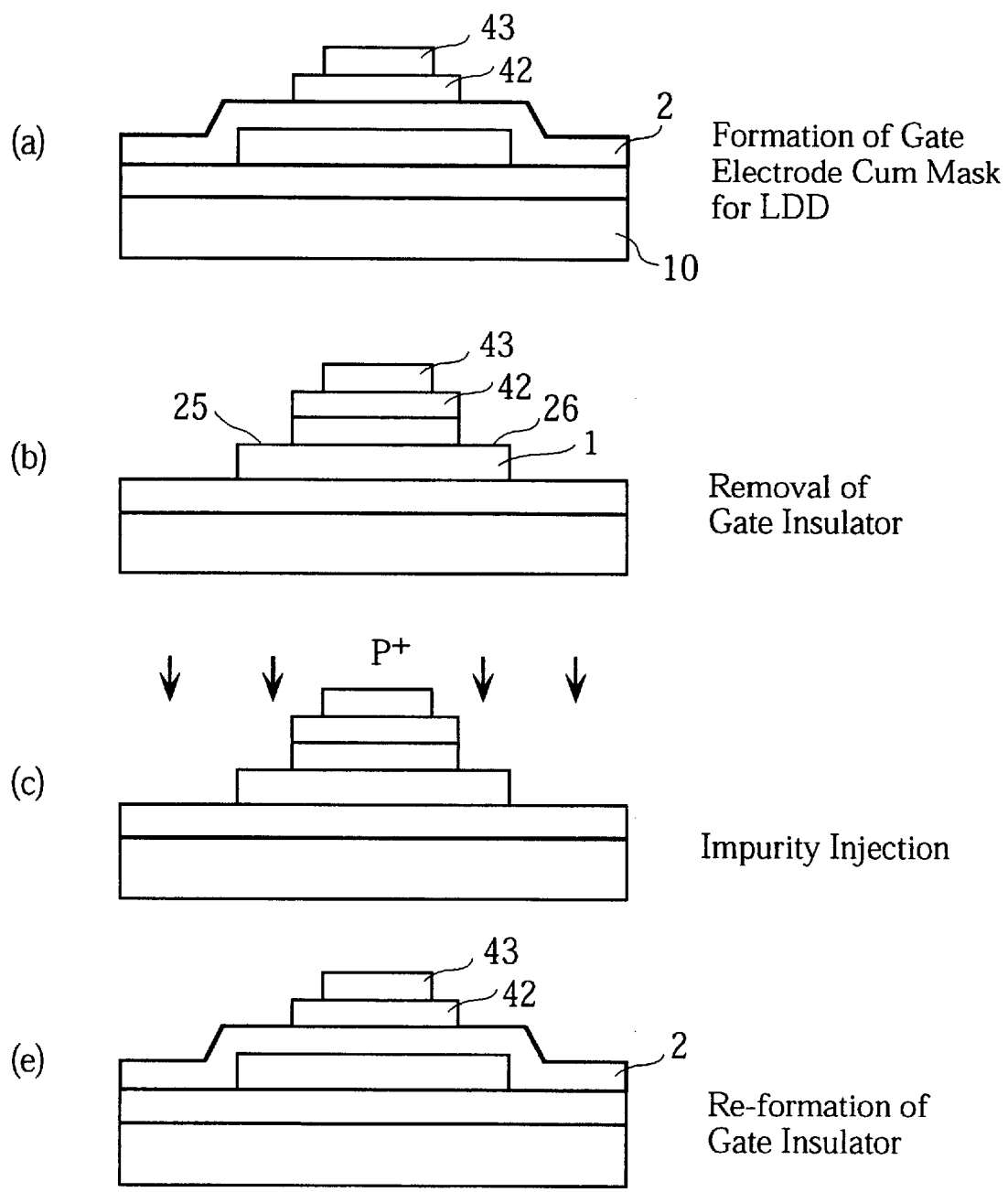
FIG. 30 indicates the drawings that show schematically the manufacturing method of the TFT array according to the embodiment 3-1 by this invention.

Referring now to FIG. 30, we will explain this embodiment.

(a) A gate electrode is to be formed where either the upper electrode juts lightly out toward the source and drain electrode sides of the lower electrode or conversely the lower electrode 42 slightly juts out from both sides of the upper electrode 43, as shown in the figure.

(b) To be removed are the gate insulators 25 and 26 except the portion just beneath the gate electrode. Further, as occasion arises, a heat treatment will be made to restore the p-Si film surface damaged by etching or extremely thin insulator is formed on the surface.

(c) Inject the impurities from above.

(d) Re-form the gate insulator as removed.

Thereafter, the LDD type TFT will be manufactured according to the procedures similar to the other embodiments.

These procedures allowed us to get a very excellent LDD type TFT, although these have been a time- and labor-consuming methods.

(Embodiment 3-2)

This embodiment, which resembles Embodiment 3-1, makes use of the gate insulator to form the LDD area.

Figure 31:
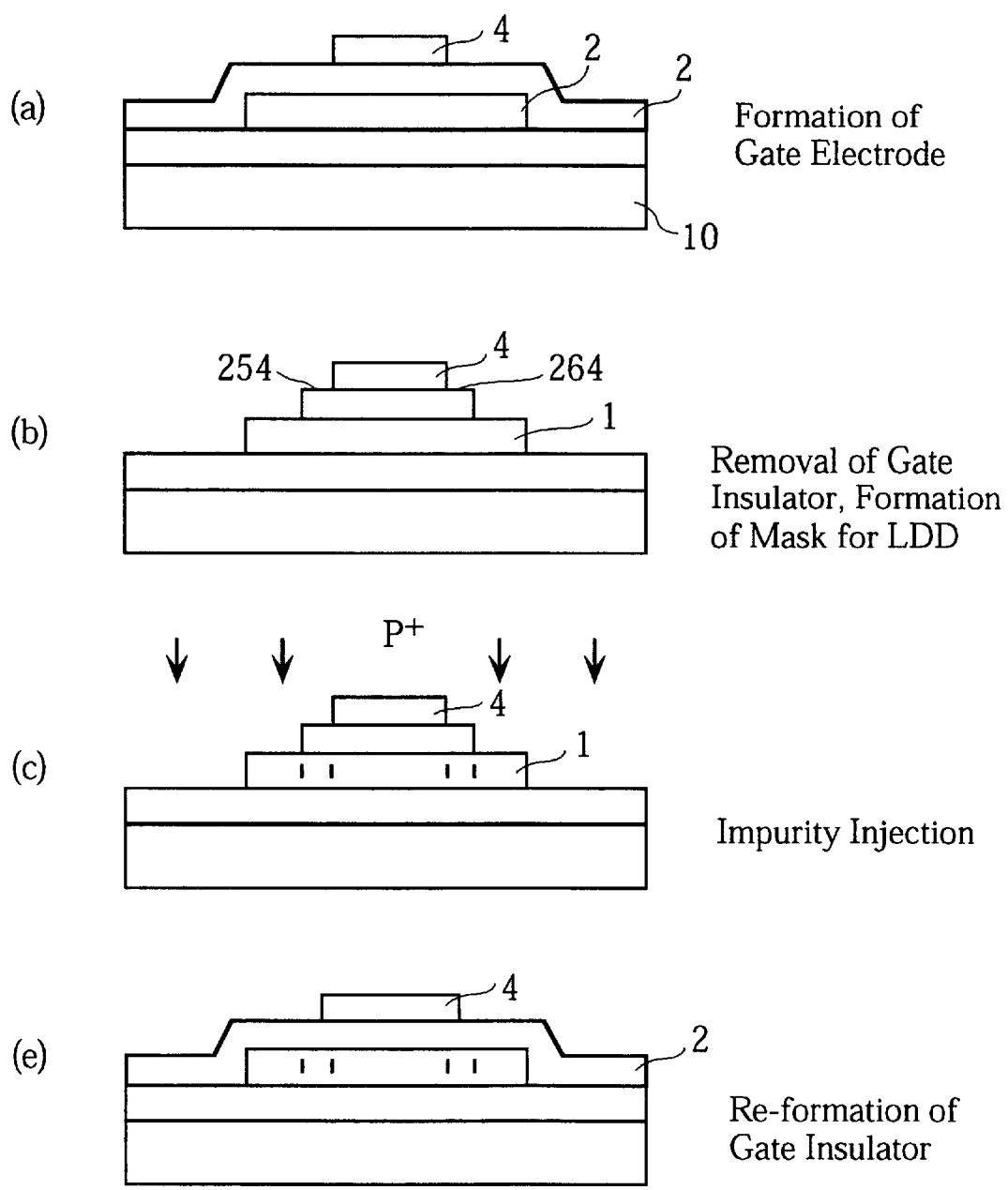
FIG. 31 indicates the drawings that show schematically the manufacturing method of the TFT array according to the embodiment 3-2 by this invention.

Referring now to FIG. 31 we will explain this embodiment.

(a) The gate electrode 4 is made on the gate insulator 2.

(b) The gate insulators 254 and 264 except by 0.3 to 1 μm (depending on the element size) protruding portion are removed on the source and drain electrode sides of the gate electrode. Further, as occasion arises, the exposed p-Si film is thermally treated.

As for the removal of the gate insulator except the protruding portion by 0.3 to 1 μm, it can be actualized by oxidation of the gate electrode 4 or metal plating into, for example, the status as shown in FIG. 29(d) and in FIG. 23(f), and by removing the insulator by etching with the gate electrode in this status as etching mask, and further by removing the oxide and plating film adhered to the gate electrode.

(c) Inject the impurity from above.

(d) Re-form the gate insulator 2.

Thereafter, the LDD type TFT will be manufactured according to the procedures similar to the other embodiments.

These procedures allowed us to get a very excellent LDD type TFT although these have been a time- and labor-consuming methods.

(Fourth Group of Inventions)
(Embodiment 4-1)

In this embodiment, Ti film is made beforehand on a bare p-si film for preventing the infiltration of hydrogen, prior to the injection of impurities in the previous embodiment 3-1.

Namely, the injection of impurities uses $H_2$ to dilute them. From this, it results therefore that the hydrogen ions highly accelerated due to its small mass is injected deeply into the semiconductor layer partly because its diameter is so small, which will exert an adverse effect on the performance of the semiconductor. As the measures against it, formed on the upper face of the semiconductor with the gate insulator removed is the Ti layer that is excellent in the occlusion of hydrogen on the upper face of the semiconductor and does not hinder the impurity injection because of its small density in order to prevent as far as possible the infiltration of hydrogen into the semiconductor layer. At the same time, the Ti layer is made to serve as an etching stopper when the gate insulator and interlayer dielectric are drilled, which are difficult to etch in exact depth because they are made from the same silicon-based material with the semiconductor layer when the source and drain electrodes are formed. It will furthermore contribute to the assurance of good electric contact between the source and drain electrodes and the semiconductor layer.

Figure 32:
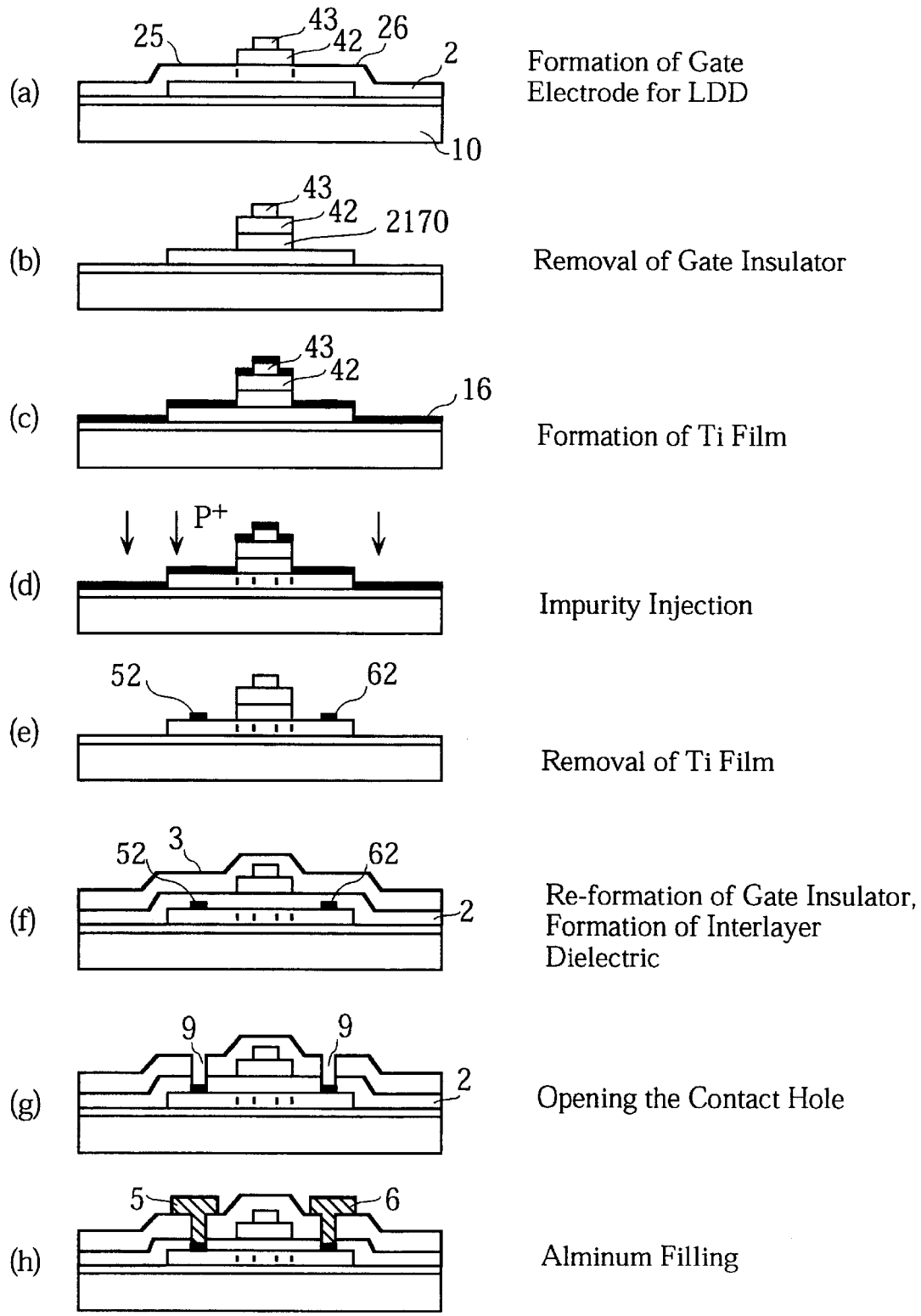
FIG. 32 indicates the drawings that show schematically the manufacturing method of the TFT array according to the embodiment 4-1 by this invention.

This embodiment will be described referring to FIG. 32.

(a) To be formed are the gate electrodes 42 and 43 where the ends on the source and drain electrode sides of one of the upper or lower gate electrode juts out from the ends of the other gate electrode.

(b) The gate insulators 25 and 26 except the lower gate electrode are removed once.

(c) The Ti film 18 is formed over all the surface.

(d) The impurity ions are injected from above.

(e) The Ti film is removed except for the portions 52 and 62 that become the lower portion of the source and drain electrodes (including some peripheral portion).

(f) The gate insulator 2 is formed once again and the interlayer dielectric 3 is made.

(g) The contact hole 9 is opened at the position where the source and drain electrodes are formed, when the titanium silicide film on the surface of p-Si formed through the reaction of the Ti film as left in (e) or made to react with silicon in the heat treatment after impurity injection, and the nonreactive Ti on the upper portion thereof do become the etching stopper.

(h) Aluminum is filled into the contact hole to form the source electrode 5 and drain electrode 6.

In this embodiment, the Ti silicide is formed by the reaction with p-Si at the lowest portions of the source and drain electrodes, improving thus the electric contact on the interface between the silicon layer and Ti silicide layer. Further, the electric contact is also good between Ti silicide and Ti on their interface as well as on the interface between the upper part of the Ti layer and aluminum since they are both metals. No gate insulator reduces as much the acceleration voltage, while the damage of p-Si layer by high-speed hydrogen ions and infiltration of hydrogen into the p-Si layer is both little because the Ti layer absorbs the hydrogen.

Since, moreover, the Ti and its silicide are different in their chemical property from the silicon-based substance, an exact depth of contact hole can be obtained, because opening the contact hole into insulator by etching automatically stops at that depth without paying any particular attention. Thus, the thickness of the p-Si layer does not need any more allowance for the etching depth, excluding any remarkable dispersion in the contact of the p-Si layer with source electrode and the like. Consequently, this embodiment could give a superb LDD type TFT.

(Fifth Group of Inventions)

(Embodiment 5-1)

This embodiment relates to the semiconductor element of the bottom-gate type LDD configuration.

Although the semiconductor element of the bottom-gate type LDD configuration is restricted by the difference from the top gate type construction, the ideas of the aforesaid respective groups of inventions may be applicable thereto.

Figure 33:
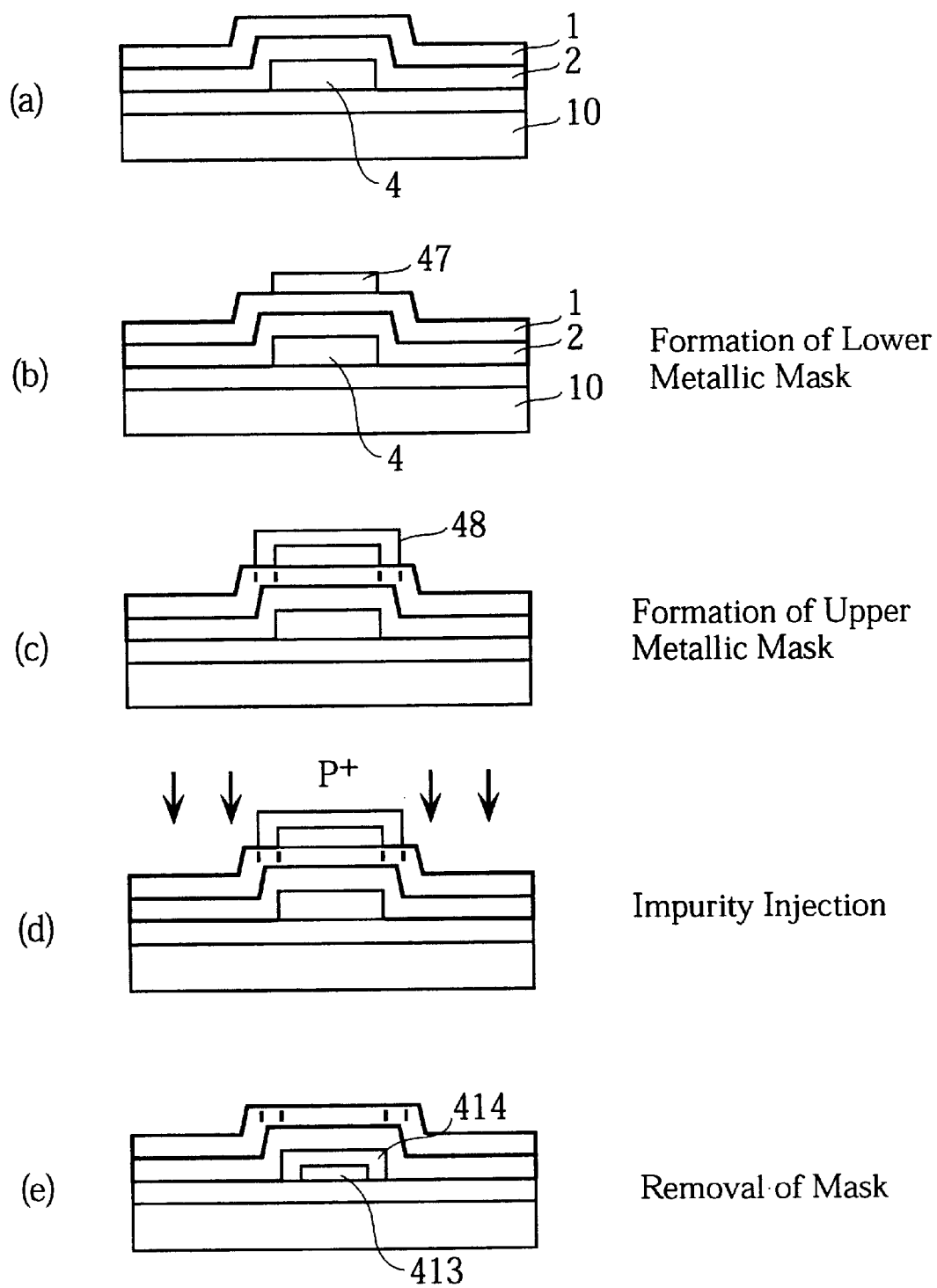
FIG. 33 indicates the drawings that show schematically the manufacturing method of the TFT array according to the embodiment 5-1 by this invention.

Referring now to FIG. 33, we will explain this embodiment.

(a) Formed on the substrate 10 are the gate electrode 4, gate insulator 2, and p-Si layer 1.

(b) After making insulator directly on the p-Si layer or interlayer dielectric, patterned lower metallic mask 47 made from great density metal is formed on its upper portion and just above the gate electrode.

(c) Plating or oxidation makes, on the lower metallic mask 47, the upper metallic mask 48 whose ends somewhat jut out on the source and drain electrode sides.

(d) The impurity is injected from above the upper face of the substrate.

(e) The upper and lower metallic masks are removed.

After making the interlayer dielectric at need, the contact hole will be formed as well as the source and drain electrodes.

Also in this embodiment, the Ti film may be formed with the upper and lower masks made without forming the interlayer dielectric, and after injecting the impurity, the lowest portions of the source and drain electrodes may be used as the etching stopper when opening the contact hole without removing the Ti film. As was the case with Embodiment 4-1, good electric contact may be ensured at both electrodes.

(Embodiment 5-2)

This embodiment makes use of the gate electrode already formed on the glass substrate to make the mask with high precision in the embodiment 5-1.

Figure 34:
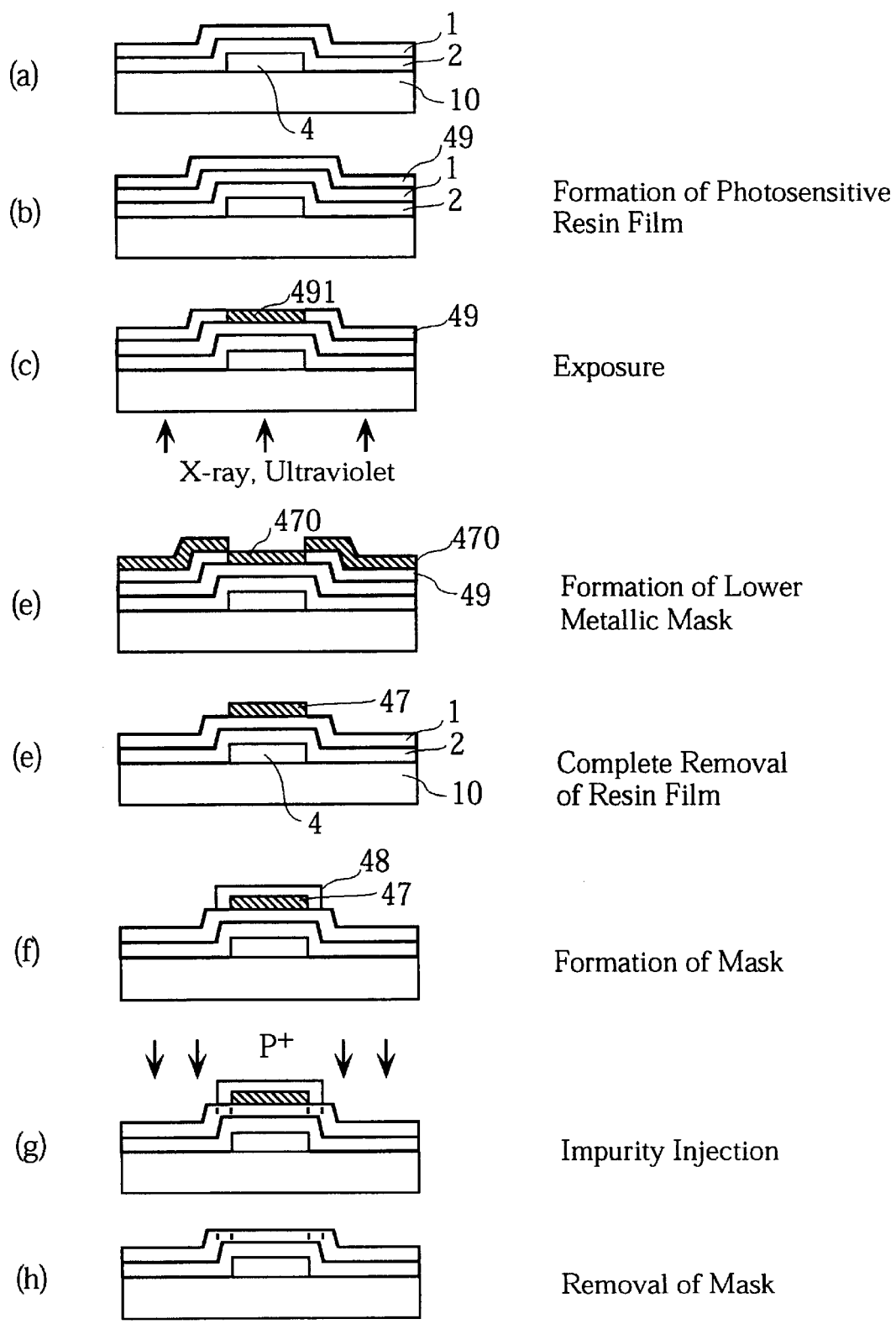
FIG. 34 indicates the drawings that show schematically the manufacturing method of the TFT array according to the embodiment 5-2 by this invention.

Referring to FIG. 34, we are going to explain this embodiment.

(a) Formed on the substrate will be the gate electrode 4, the gate insulator 2 and p-Si layer made from high density metal, in this sequential order.

(b) Formed also on the substrate will be the photosensitive resin layer 49.

(c) From the back face of the substrate, the visible light, ultraviolet or X-ray will be irradiated with the gate electrode used as the mask to expose the photosensitive resin.

Note in this case that the p-Si allows for the light and ultraviolet ray to transmit with ease as such without any scattering. In case of x-ray irradiation, due to the difficult manufacture of the corresponding lenses at the present time, the irradiation shall preferably be made at some position more distant from the substrate than the ultraviolet ray (X-ray source to be provided). Needless to say, the intensity and wavelength of the respective electromagnetic wave should taken into due consideration the photosensitivity of the resin and the quality and thickness of the substrate that will have a great influence on the attenuation due to the absorption.

The dimensions of the substrate under this condition is 48×48 cm, and 1 mm in thickness at most. Therefore, only the resin just above the gate electrode on the substrate will be exposed irrespective of the positions of the gate electrode on the substrate.

(d) After the development by heating and the like, the resin 491 as exposed will be removed to form the lower mask metallic film 470 on the upper face of the substrate.

(e) The resin film 49 of the nonexposed portion will be removed together with the lower mask metallic film 470 above the film 49. It results from this that the lower mask metallic film 47 will remain only on the portion where there was the resin of exposed portion.

(f) Electroplating will make the upper mask metallic film 48 of specified material and thickness on the lateral and upper faces of the lower mask metallic film 47 after the resin of the exposed portion.

(g) The impurity will be injected from above the upper face of the substrate.

(h) The upper and lower metallic masks will be removed. From thereon continue the formation of the interlayer dielectric, contact holes and source and drain electrodes.

As a variation example of this embodiment, only the resin of nonexposed portion in the upper part of the gate electrode may be made to remain as the injection mask using the conductive photosensitive resin (mixture of both resins at present) and metal may be plated on the lateral sides thereof to form the mask for LDD formation though it might require more or less time.

(Embodiment 5-3)

In this embodiment, the gate electrode is formed from silicide layers or multilayer having at least one layer of silicide.

Since the manufacturing method itself is not different from what has been already described, we omit it here. Further, since the structure is not particularly complicated, its drawings are omitted with those of other embodiments used in their stead. FIG. 33(*a*) represents the case of the gate electrode of silicide and (e) the case where there exist in the upper portion the metallic electrode 414 and the lower silicide electrode 413.

As a variation example of this embodiment, the lower aluminum electrode might be enclosed by the upper silicide electrode that is concave downward and the glass substrate in order to prevent the occurrence of hillock.

(Sixth Group of Inventions)

This group of inventions is the same with those from the first to fourth except that one of the upper and lower gate electrode does not have any protrusion on the other. Any explanation referring to exclusive drawings will therefore be omitted here.

(Embodiment 6-1)

Just as is the case with what is symbolized by 13 and 41 in FIG. 23, the upper gate metal 43 and lower gate metal 42 in FIGS. 30(a) to (e) are formed simultaneously by dry etching so that they should be equal in the length in the channel direction and that there should be no protrusion different from this figure, when one of the upper gate metal 43 and lower gate metal 42 is made from aluminum alloy with little electric resistance and other from the tungsten with larger masking effect to hydrogen.

This embodiment has given an excellent TFT partly because no gate insulator leads to as much lower injection voltage.

(Seventh Group of Inventions)
(Embodiment 7-1)

This embodiment constitutes plural sorts of the LDD-type TFT of different characteristics on the substrate.

The characteristics required for the LDD type TFT being different in the drive circuit from pixel, etc. in the liquid crystal display unit, it may become necessary to form the LDD type TFT of particular nature on particular position on the substrate depending on the usage. For the dimensions of the semiconductor element and length of channel area, for example, in this case, the dimension of the mask hole in the photolithography has only to be corresponding to the positions.

Next, in regard to the LDD portion, in this embodiment, the plating time and voltage as well as the type of the metal to be plated are made to vary in terms of the positions on the substrate when the upper gate electrode is formed, by plating, on the lower gate electrode.

This embodiment has given the TFT of a desired LDD area length by lengthening the plating time when the thickness formed of the upper gate electrode is large enough, on the basis of the facility of control.

Figure 35:
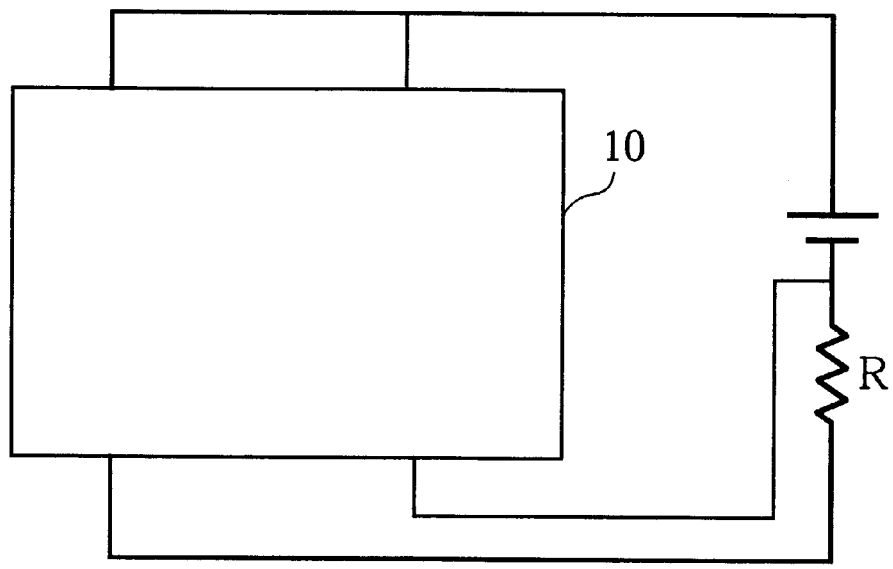
FIG. 35 indicates the drawings that show schematically the manufacturing method of the TFT array according to the embodiment 7-1 by this invention.
Figure 35:
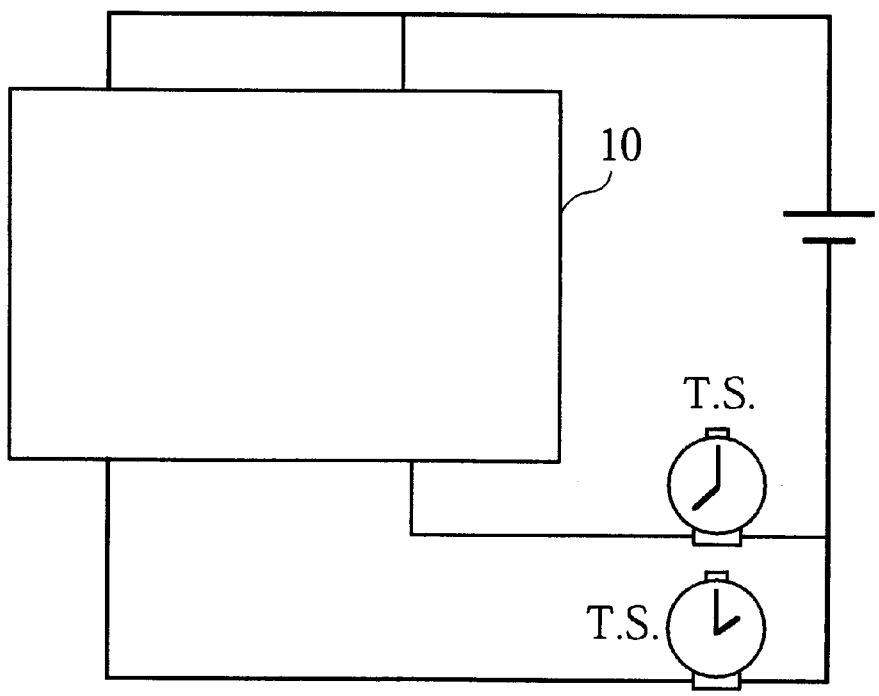

FIG. 35 illustrates schematically and partially these situations. This figure shows the case where the voltage is function of the position, and FIG. 35(b) shows the case where the time is function of the position with timer switch used.

As an exemplary variation of this embodiment, the concentration of the plating bath and type of metal may vary for each position, although it is somewhat time- and labor-consuming method. Although, in this case, the length of the LDD portion is different, it is possible to have almost same capacity as the mask when the impurity is injected.

(Embodiment 7-2)

This embodiment is the same as the previous ones in that the LDD type TFT is to be formed with the characteristics corresponding to the formation position on the substrate. It is however different from the latter in that as its means one removes the gate electrode just above the LDD portion after the impurity injection.

Figure 36:
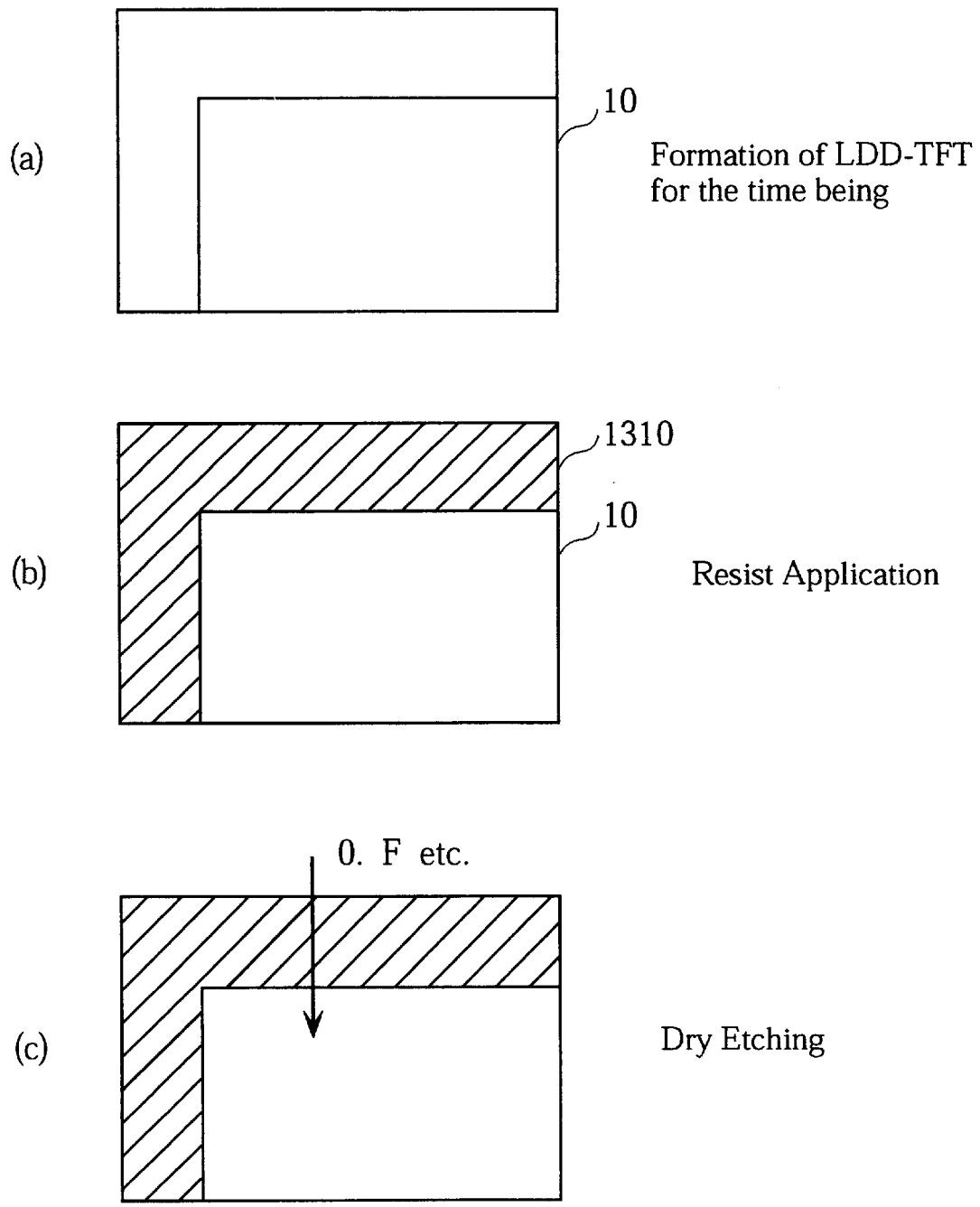
FIG. 36 indicates the drawings that show schematically the manufacturing method of the TFT array according to the embodiment 7-2 by this invention.

This embodiment will now be explained referring to FIG. 36.

(a) The LDD type semiconductor TFT is formed on the substrate 10 for the time being.

(b) After injection of the impurity, the resist layer 1310 is formed only on the portion where the protrusion portion has not been removed.

(c) The metal forming any protrusion will be removed by dry etching using oxygen, fluorine, etc. In this portion, therefore, the upper gate electrode comes to protect the lower gate electrode from the etching gas if the latter juts out.

If the upper gate electrode juts out from the lower gate electrode, the former will all come to be removed. In this figure, a part of the gate electrode will come to be removed only in the pixel portion of the liquid crystal display unit.

Formed then will be the interlayer dielectric, contact holes and the source and drain electrodes.

(Embodiment 7-3)

In this embodiment, the size of mask pore for the lithography used to protrude the upper or lower electrode from the other electrode is made to vary in terms of the position in order for the specified amount of the protrusion of the upper or lower gate electrode to vary depending on the position.

Because of this, the pore of the mask for photolithography has been matched with the formation of the LDD type TFT in terms of the position on the substrate from the very start. Since however the manufacturing method itself of such mask or the element manufacturing method using such mask is basically not different from what has thus far been described, the corresponding explanation will be omitted here. Since further its structure is not so complicated, the illustrative drawings will be omitted as well.

So far, this invention has been described according to its embodiments, but this invention should not be limited to them. For example, the invention may be as follows.

1) The use of this invention is other than such liquid crystal display unit as liquid crystal type television set, wordprocessor, for example, the EL display.

2) In addition to Si, we use Si—Ge, Si—Ge—C and so forth as the materials for semiconductor.

3) In Embodiment 1-3, the impurity ions are injected at the stage when the metallic film is formed so that it be longer in the direction of the length of the channel area in the upper portion of the patterned amorphous silicon layer, and then heating is made on each substrate at 550 to 650° C. for about 20 minutes also for the purpose of heat treatment of polysilicon and formation of silicide layer by chemical reaction of amorphous silicon with the metallic film.

4) In the embodiment 1-3, a silicide film is formed in stead of the amorphous silicon in (a), the same film is patterned as in (b), and a metallic film is formed more or less protruded over the same silicide film so that it completely cover the silicide. Then, the impurity will be injected without entering into the process of (c).

5) The cross section in the channel direction of the gate electrode as shown in FIG. 3 and FIG. 4 is not trapezoidal but rectangle.

6) In the formation of the panel, the formation of the film for any gate electrode serves as that of the reflection board and pixel electrode, etc.

7) In case of the bottom gate, the semiconductor layer is thinned as far as possible when the resin is exposed from the substrate side. Further, the insulator is made of the translucent resin in order that the electromagnetic wave of too short a wavelength should not be used.

8) Since the LDD type TFT changes its characteristics, the upper and lower electrodes have been designed to be of the same length in the channel direction, and not of the GOLD configuration accordingly.

INDUSTRIAL APPLICABILITY

As has become clear from the foregoing explanations, a thin film transistor can be realized that has the LDD configuration and can form self-consistently the source, low concentration impurity, channel and drain areas. This invention also allows for reducing the off current and suppressing the reduction in the on current. Further, since the thin film transistor is of self-matching construction, it can decrease the parasitic capacitance, and may therefore be refined.

It is also applicable to the bottom gate type semiconductor element.

Moreover, it allows us to obtain an excellent semiconductor element without any LDD configuration.

Furthermore, it enables us to form the LDD-type TFT having on each part of a sheet of the substrate, the characteristics corresponding to the positions.

What is claimed is:

1. A semiconductor element having a semiconductor layer comprising a source area, a drain area, and a gate area, a gate insulating film, a source electrode, a drain electrode, and a gate electrode formed on said gate insulating film, formed on a substrate, wherein:

said gate electrode comprises:
two layers including a lower layer comprising a silicide thin film and an upper layer comprising a metal thin film, wherein the metal thin film is a gate electrode and an LDD forming mask that protrudes outward of the silicide thin film on at least one of the source electrode side and the drain electrode side; and said semiconductor layer comprises:
an LDD area formed in an area corresponding to a gate electrode position determinable from positions of said silicide thin film, said metal thin film and an injecting direction of impurity ions.

2. The semiconductor element according to claim 1, wherein:
said semiconductor element comprises silicide thin films of a same material as that of the silicide thin film of said gate electrode at a contact portion of said source electrode and said source area, and at a contact portion of said drain electrode and said drain area.

3. The semiconductor element according to claim 1, wherein:
said silicide thin film is a silicide thin film comprising a specific material selected from the group consisting of titanium silicide, cobalt silicide, nickel silicide, zirconium silicide, molybdenum silicide, palladium silicide, and platinum silicide.

4. The semiconductor element according to claim 3, wherein:
said semiconductor element has silicide thin films of a same material as that of the silicide thin film of said gate electrode at a contact portion of said source electrode and said source area, and at a contact portion of said drain electrode and said drain area.

5. The semiconductor element according to claim 3, wherein said silicide comprises a metal element identical to a metal element comprising a high-melting-point metal thin film.

6. The semiconductor element according to claim 3, wherein:
wherein said silicide comprises a metal element identical to a metal element comprising said at least one metal thin film.

7. The semiconductor element according to claim 6, wherein:
said semiconductor element has silicide thin films of a same material as that of the silicide thin film of said gate electrode at a contact portion of said source electrode and said source area, and at a contact portion of said drain electrode and said drain area.

8. A manufacturing method of a semiconductor element, comprising:
forming a semiconductor layer at a prescribed position on a substrate, and forming a gate insulating film on the semiconductor layer;

forming a silicon thin film as a lower layer of a multilayer gate electrode on the gate insulating film;

preliminarily forming a gate electrode having upper and lower layers of different materials by forming a metal thin film as an upper layer that completely covers the lower thin film and includes a portion protruding in a direction of a channel area;

exposing the substrate having said gate electrode formed thereon to a prescribed temperature, and causing a reaction between said silicon thin film and said metal thin film, thereby forming a silicide layer in the interface therebetween; and forming a semiconductor layer having a structure which comprises, when carrying out injection of impurity ions by using said preliminarily formed gate electrode as a mask, a source area and a drain area having a large amount of injected impurity ions because of a complete absence of the mask, an LDD area having a small amount of injected impurity ions because only the protruding portion serves as the mask, and a channel area for which no impurity ion injection is performed because of overlapping of said upper and lower layers.

9. A manufacturing method for a semiconductor element, comprising:
forming a semiconductor layer at a prescribed position on a substrate, and then forming a gate insulating film on the semiconductor layer;

forming a silicon thin film as a lower layer of a multilayer gate electrode on the gate insulating film;

preliminarily forming a gate electrode having upper and lower layers of different materials by forming a metal thin film as an upper layer that completely covers the lower thin film and includes a portion protruding in a direction of a channel area;

heating the substrate having said gate electrode formed thereon to a prescribed temperature, and causing a reaction between said silicon thin film and said metal thin film, thereby forming a silicide layer in an interface therebetween; and forming a semiconductor layer having a structure which comprises, when carrying out injection of impurity ions by using said gate electrode including said formed silicide layer, a source area and a drain area having a large amount of injected impurity ions because of a complete absence of the mask, an LDD area having a small amount of injected impurity ions because only the protruding portion serves as the mask, and a channel area for which no impurity ion injection is performed because of overlapping of said upper and lower layers.

* * * * *